(12) United States Patent
Ryu et al.

(10) Patent No.: US 8,773,012 B2
(45) Date of Patent: Jul. 8, 2014

(54) PHOSPHOR, METHOD FOR PREPARING AND USING THE SAME, LIGHT EMITTING DEVICE PACKAGE, SURFACE LIGHT SOURCE APPARATUS AND LIGHTING APPARATUS USING RED PHOSPHOR

(71) Applicant: Samsung Electronics Co., Ltd., Suwon-si (KR)

(72) Inventors: Jeong Ho Ryu, Gyunggi-do (KR); Chul Soo Yoon, Gyunggi-do (KR); Hyong Sik Won, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 14/158,693

(22) Filed: Jan. 17, 2014

(65) Prior Publication Data
US 2014/0133146 A1 May 15, 2014

Related U.S. Application Data

(62) Division of application No. 12/910,514, filed on Oct. 22, 2010, now Pat. No. 8,652,357.

(30) Foreign Application Priority Data

Oct. 23, 2009 (KR) .................... 10-2009-0101439

(51) Int. Cl.
*H01J 1/63* (2006.01)
*C09K 11/08* (2006.01)
*C09K 11/77* (2006.01)

(52) U.S. Cl.
CPC ......... *C09K 11/0883* (2013.01); *C09K 11/7734* (2013.01)
USPC ............................ 313/503; 313/483; 313/498

(58) Field of Classification Search
None
See application file for complete search history.

(56) References Cited

U.S. PATENT DOCUMENTS

| 2005/0093816 A1 | 5/2005 | Kang et al. |
| 2006/0033081 A1 | 2/2006 | Hintzen et al. |
| 2006/0232193 A1 | 10/2006 | Fiedler et al. |
| 2007/0075629 A1 | 4/2007 | Le Toquin et al. |
| 2008/0054793 A1 | 3/2008 | Yang et al. |
| 2008/0081011 A1 | 4/2008 | Oshio |
| 2010/0141172 A1 | 6/2010 | Uchida et al. |
| 2011/0234118 A1 | 9/2011 | Kim et al. |

FOREIGN PATENT DOCUMENTS

| CN | 1654593 A | 8/2005 |
| CN | 101481615 A | 7/2009 |
| DE | 10 2007 025 679 A1 | 12/2008 |
| JP | 2005-255895 A | 9/2005 |

(Continued)

OTHER PUBLICATIONS

Chinese Office Action, w/ English translation thereof, issued in Chinese Patent Application No. CN 201010534002.0 dated Sep. 17, 2013.

(Continued)

*Primary Examiner* — Britt D Hanley
(74) *Attorney, Agent, or Firm* — McDermott Will & Emery LLP

(57) ABSTRACT

Disclosed are a phosphor, a method for preparing and using the same, a light emitting device package, a surface light source apparatus, a lighting apparatus using the phosphor, and a display apparatus. The phosphor includes an inorganic compound represented by an empirical formula $(Sr, M)_2SiO_{4-x}N_y:Eu$, where M is a metallic element, $0<x<4$, and $y=2x/3$.

18 Claims, 61 Drawing Sheets

(56) References Cited

FOREIGN PATENT DOCUMENTS

| JP | 2006-206729 A | 8/2006 |
|---|---|---|
| WO | 02054202 A2 | 7/2002 |
| WO | 02054203 A2 | 7/2002 |
| WO | 2006/085693 A1 | 8/2006 |

OTHER PUBLICATIONS

Sohn et al., "Luminescence of Sr2SiO4-xN2x/3:Eu2+ Phosphors Prepared by Spark Plasma Sintering," Journal of the Electrochemical Society, 155 (2), J58-J61 (2008.

Song et al., "Luminescence and energy transfer of Mn2+ co-doped SrSi2O2N2: Eu2+ green-emitting phosphors," Materials Science and Engineering B 164 (2009) 12-15.

Yun et al., "Luminescence Properties of (Sr1-uBau)Si2O2N2:Eu2+, Yellow or Orange Phosphors for White LEDs, Synthesized with (Sr1-uBau)2SiO4:Eu2+ as a Precursor," Hournal of the Electrochemical Society, 154 (10) J320-J325 (2007).

Extended European Search Report for EP 11159690.4, dated Jul. 16, 2012.

Office Action for Chinese Application No. 201010534002.0, dated Dec. 21, 2012 (corresponds to U.S. Appl. No. 12/910,514).

Entire Prosection History of U.S. Appl. No. 12/910,514, filed Oct. 22, 2013 entitled Phosphor, Method for Preparing and Using the Same, Light Emitting Device Package, Surface Light Source Apparatus and Lighting Apparatus Using Red Phosphor.

A Tunable Green Alkaline-Earth Silicon-Oxynitride Solid Solution (Ca1-xSrx)Si2O2N2:Eu2+ and its application in LED; M. Zhang et al.; Applied Physics B; pp. 829-835 (2008).

PHOSPHOR, METHOD FOR PREPARING AND USING THE SAME, LIGHT EMITTING DEVICE PACKAGE, SURFACE LIGHT SOURCE APPARATUS AND LIGHTING APPARATUS USING RED PHOSPHOR

RELATED APPLICATIONS

This application is a Divisional of U.S. application Ser. No. 12/910,514, filed on Oct. 22, 2010, which claims the priority of Korean Patent Application No. 10-2009-0101439 filed on Oct. 23, 2009, in the Korean Intellectual Property Office, the disclosures of which are incorporated herein by reference.

In general, a phosphor material (phosphor or fluorescent material) is used to convert a particular wavelength of light from various types of light sources into a desired wavelength of light. In particular, among various light sources, a light emitting diode (LED), which is driven with a low power consumption and has good light efficiency, tends to be employed as a backlight of a liquid crystal display (LCD) or as a lighting apparatus for streetlights, vehicles or automobiles, and houses. Due to this trend, a phosphor receives a great deal of attention as a core technology for manufacturing white LEDs. Also, the efficiency of phosphor is desirable for driving a display, acting as a key factor directly associated with the efficiency of light source products including displays. Recently, a technique for implementing white light, similar to natural light as defined in CIE color coordinates, is being developed and research into the production of a white LED is actively ongoing.

Methods for fabricating a white LED include coating a blue LED with a yellow phosphor and a green phosphor, coating an ultraviolet LED with a red phosphor, a green phosphor, and a blue phosphor, and the like. Currently, the former method is most vigorously studied because its structure is simple, fabrication is easy, and white light of high luminance can be obtained. In this method, a YAG($Y_3Al_5O_{12}$)-based or TAG-based yellow phosphor is often used, but the emitting light is bluish white light due to the shortage of a red component, lowering color rendering, and when an operational temperature increases as a result of use over a long period of time, yellowing occurs. The latter method creates three-wavelength white light by transmitting ultraviolet light through three primary colored fluorescent materials. This method is advantageous in that yellowing is reduced, a color rendering index (CRI) is good, and a wide color distribution can be implemented.

However, the red phosphor has a low efficiency compared with the green or blue phosphor, so that it must be mixed at a relatively larger rate (60 wt % or more). Such a low efficiency in a red phosphor results from a relatively low excitation spectrum of the red phosphor in a desired ultraviolet band or blue band, compared with that of other phosphors. Thus, the development of a composition of a red phosphor that may have a high efficiency and stability and may improve color rendering in a white light emitting LED that uses a blue LED or an ultraviolet LED as an excitation source is needed.

An aspect of the present invention provides a red phosphor that emits red light by using blue and ultraviolet wavelength regions as excitation sources and has a high luminance as well as thermal and chemical stability, and a preparation method thereof.

Another aspect of the present invention provides a light emitting device package, a surface light source apparatus or a lighting apparatus, capable of emitting white light which is close to natural light and has good color rendering by utilizing a red phosphor that emits red light by using blue and ultraviolet wavelength regions as excitation sources.

According to an aspect of the present invention, there is provided a red phosphor comprising an inorganic compound represented by an empirical formula $(Sr, M)_2SiO_{4-x}N_y:Eu$, where M is a metallic element, $0<x<4$, and $y=2x/3$.

The red phosphor may have an emission peak of a wavelength band ranging from about 600 nm to about 700 nm by using blue or ultraviolet wavelength regions as excitation sources, and preferably, the red phosphor may have an emission peak of a wavelength band ranging from about 600 nm to about 650 nm, more preferably from about 600 nm to about 620 nm. In the above-mentioned formula, x may satisfy the condition of $0.15 \leq x \leq 3$ and may be 0.43 or 1.56.

In the above-mentioned formula, M may include at least one selected from the elements of the second group consisting of Mg, Ca, and Ba, or may include at least one selected from the elements of the first group consisting of Li, Na, K, Rb, and Cs, a portion of Si in the empirical formula may be substituted with at least one selected from the group consisting of B, Al, Ga, and In or may be substituted with at least one selected from the group consisting of Ti, Zr, Hf, Sn, and Pb, and the ratio at which Si is substituted with the element may be 1/10.

The red phosphor may further include Mn and may further include one or more crystalline mixtures different from the inorganic compound, and the content of the inorganic compound may be 50 wt % or more, and a crystal structure of the red phosphor may be an orthorhombic system.

In another aspect of the present invention, a phosphor containing an inorganic compound represented by an empirical formula $Eu_zSr_{2-z}SiO_{4-x}N_y$, where $0.01 \leq z \leq 0.2$, $0<x<4$, and $y=2x/3$. Preferably, x satisfies the condition of $0.15 \leq x \leq 3$, more preferably $0.15 \leq x \leq 1.86$, and even more preferably $0.43 \leq x \leq 1.86$. A portion of Si in the empirical formula is substituted with at least one selected from the group consisting of B, Al, Ga, In, Ti, Zr, Hf, Sn, and Pb preferably in an amount of 1/10 of Si amount or less. The phospher may contain Mn. The phosphor may contain the inorganic compound in a mixture with one or more other compounds. Preferably, the content of the inorganic compound is 10 wt % or more, more preferably, 90 wt % or more, even more preferably 95 wt % or more.

In another aspect of the present invention, a phosphor having an empirical formula $(Sr, M)_2SiO_{4-x}N_y:Ln$ is provided. M is a metallic element, preferably at least one of Be, Mg, Ca, Ba, Li, Na, K, Rb, and Cs, and Ln is one or more lanthanum metals, preferably, Ce, Pr, Eu, Tb, Yb, and Lu, more preferably, Eu or Ce, even more preferably Eu. x is larger than zero and smaller than 4, preferably 0.15 or larger and 3 or smaller, more preferably 0.43 or larger and 1.86 or smaller. The amount of Sr may be zero.

According to another aspect of the present invention, there is also provided a method for preparing a red phosphor, including: mixing raw materials including at least one of an Sr-containing compound and an M-containing compound, an Eu-containing compound, an Si-containing oxide, and an Si-containing nitride; and heating the mixture to obtain an inorganic compound represented by an empirical formula $(Sr, M)_2SiO_{4-x}N_y:Eu$, where M is at least one of a monovalent and divalent element, $0<x<4$, and $y=2x/3$.

The Eu-containing compound may be europium oxide ($Eu_2O_3$), and in mixing the raw materials, manganese carbonate, a compound of at least one selected from the group consisting of B, Al, Ga, and In, or a compound of at least one selected from the group consisting of Ti, Zr, Hf, Sn, and Pb may be additionally mixed therewith.

The Sr-containing compound may be a metal, a water soluble metal salt, an oxide, a nitrate, an oxide salt, a sulfate, or carbonate of strontium (Sr), or mixtures thereof, and the M-containing compound may be a metal, a water soluble metal salt, an oxide, a nitrate, an oxide salt, a sulfate, or carbonate of M, or mixtures thereof, the Si-contained oxide may be silicon oxide ($SiO_2$), and the Si-contained nitride may be silicon nitride ($Si_3N_4$).

In mixing the raw materials, the raw materials may be wet-mixed by using a solvent. The method for preparing a red phosphor may further include: drying the mixture obtained through the wet mixture. Heating the mixture may be performed for 1 to 24 hours within a temperature range of 1000° C. to 1800° C. The heating may be performed under a nitrogen gas atmosphere.

According to another aspect of the present invention, there is also provided a light emitting device package including: a light emitting device emitting excitation light; and a wavelength conversion unit absorbing the excitation light to emit visible light, where the wavelength conversion unit includes at least a red phosphor having an inorganic compound represented by an empirical formula $(Sr, M)_2SiO_{4-x}N_y$:Eu, where M is at least one of a monovalent and divalent element, $0<x<4$, and $y=2x/3$.

The red phosphor may emit light having an emission peak between about 600 nm and about 700 nm upon being excited by the excitation light, preferably between about 600 nm and about 650 nm, and more preferably between about 600 nm and about 620 nm. The light emitting device may be an ultraviolet LED, and the light emitting device package may further include a blue phosphor and a green phosphor, and the final output light of the light emitting device package may be white light. The wavelength conversion unit may include: a first phosphor layer, which is formed on or above the light emitting device and contains the red phosphor to emit red light; a second phosphor layer, which is stacked on or above the first phosphor layer, emitting green light; and a third phosphor layer, which is stacked on or above the second phosphor layer, emitting blue light. Also, the wavelength conversion unit may include: a first phosphor layer formed, on or above the light emitting device, containing the red phosphor to emit red light; and a second phosphor layer, stacked on or above the first phosphor layer, emitting both green light and blue light. The order of the layers may be altered. Also, the light emitting device may be a non-LED device, which is capable of generating ultraviolet light.

The light emitting device may be a blue LED, and the light emitting device package may further include a green phosphor and a yellow phosphor, and the final output light of the light emitting device package may be white light. The wavelength conversion unit may include: a first phosphor layer formed on or above the light emitting device and containing the red phosphor to emit red light; and a second phosphor layer, stacked on or above the first phosphor layer, emitting green light. Also, the wavelength conversion unit may include: a first phosphor layer, formed on or above the light emitting device, containing the red phosphor to emit red light; and a second phosphor layer, stacked on or above the first phosphor layer, emitting yellow light. The order of the layers may be altered. Also, the light emitting device may be a non-LED device, which is capable of generating blue light.

The wavelength conversion unit may be formed to uniformly cover an outer surface of the light emitting device with a resin material containing the red phosphor. The wavelength conversion unit may be formed only on an upper surface of the light emitting device, or may be formed on an upper surface and on a side surface of the light emitting device. The wavelength conversion unit may also be formed at a place remote from the light emitting device.

The wavelength conversion unit may further include a resin packing unit encapsulating the light emitting device. The resin packing unit may have the red phosphor distributed therein. The wavelength conversion unit may further include two or more types of phosphors among blue, green, and yellow phosphors. The final output light of the light emitting device package is white light or any color that can be generated in combination of red color.

According to another aspect of the present invention, there is also provided a surface light source apparatus having a light emitting device package including: a light guide plate; and a light source disposed on a side surface of the light guide plate and irradiating light to the light guide plate, where the light source includes a light emitting device emitting excitation light and a wavelength conversion unit absorbing the excitation light to emit visible light, where the wavelength conversion includes at least a red phosphor having an inorganic compound represented by an empirical formula $(Sr, M)_2SiO_{4-x}N_y$:Eu, where M is at least one of a monovalent and divalent element, $0<x<4$, and $y=2x/3$.

The wavelength conversion unit may further include two or more types of phosphors among blue, green, and yellow phosphors to provide white light or other colors that can be formed in combination of red color. The surface light source apparatus may further include: a reflection plate disposed below the light guide plate. The surface light source apparatus may further include: an optical sheet disposed above the light guide plate.

According to another aspect of the present invention, there is also provided a lighting apparatus including: a substrate; a plurality of light sources mounted on the substrate; and a diffusion sheet disposed above the plurality of light sources and diffusing light made incident from the light sources, where each of the light sources includes: a light emitting device emitting excitation light; and a wavelength conversion unit absorbing the excitation light to emit visible light, where the wavelength conversion unit includes at least a red phosphor having an inorganic compound represented by an empirical formula $(Sr, M)_2SiO_{4-x}N_y$:Eu, where M is at least one of a monovalent and divalent element, $0<x<4$, and $y=2x/3$. The lighting apparatus may be a display apparatus for displaying information or images.

The lighting apparatus may further include: a reflection layer disposed on an upper surface of the substrate and reflecting light emitted from the light emitting device upwardly, where the wavelength conversion unit may further include two or more types of phosphors among blue, green, and yellow phosphors. The final output light of the light emitting device package is white light.

According to another aspect of the present invention, there is also provided a headlight for a vehicle, including: a light emitting device package including at least one light emitting device and a wavelength conversion unit absorbing light emitted from the light emitting device to emit visible light and including at least a red phosphor having an inorganic compound represented by an empirical formula $(Sr, M)_2SiO_{4-x}N_y$:Eu (where M is at least one of a monovalent and divalent element, $0<x<4$, and $y=2x/3$); a reflection unit provided above the light emitting device package to reflect light output from the light emitting device package; and a lens unit radiating light on a path of light reflected from the reflection unit to the exterior.

The headlight for a vehicle may further include: a heat dissipation unit having the light emitting device package provided thereon and dissipating heat generated from the light emitting device package.

The wavelength conversion unit may further include two or more types of phosphors among blue, green, and yellow phosphors to provide white light or other colors that can be formed in combination of red color.

According to an embodiment of the present invention, a method of converting shorter wavelength light to longer wavelength light using a phosphor having an inorganic compound represented by an empirical formula $(Sr, M)_2SiO_{4-x}N_y$:Eu (where M is at least one of a monovalent and divalent element, $0<x<4$, and $y=2x/3$) or other inorganic phosphors of the present invention is provided.

According to another aspect of the present invention, there is also provided a method for converting shorter wavelength light to longer wavelength light, the method comprising providing a light emitting device capable of emitting ultraviolet or blue light and providing a phosphor containing an inorganic compound represented by an empirical formula $(Sr, M)_2SiO_{4-x}N_y$:Eu, where M is at least one of a monovalent and divalent element, $0<x<4$, and $y=2x/3$ in the path of the light emitted, and M is at least one element selected from Be, Mg, Ca, Ba, Li, Na, K, Rb, and Cs.

According to another aspect of the present invention, there is also provided a method for generating white light, the method comprising: providing a light emitting device capable of emitting ultraviolet or blue light; providing a phosphor containing an inorganic compound represented by an empirical formula $(Sr, M)_2SiO_{4-x}N_y$:Eu, where M is at least one of a monovalent and divalent element, $0<x<4$, and $y=2x/3$ on the path of the light emitted; and mixing the light emitted from the phosphor with one or more different colors of light to make white light, and M is at least one element selected from Be, Mg, Ca, Ba, Li, Na, K, Rb, and Cs.

BRIEF DESCRIPTION OF THE DRAWINGS

The above and other aspects, features and other advantages of the present invention will be more clearly understood from the following detailed description taken in conjunction with the accompanying drawings, in which:

FIG. 87(a) is a plan view of a light emitting device package according to another exemplary embodiment of the present invention, FIG. 87(b) is a sectional view of the light emitting device package of FIG. 87(a), and FIGS. 87(c) and 87(d) are plan views showing modifications in a state in which a light emitting device chip is mounted in the light emitting device package of FIG. 87(a). FIG. 88(a) is a plan view of another example of the light emitting device package illustrated in FIG. 86(a), FIG. 88(b) is a sectional view of the light emitting device package of FIG. 88(a), and FIG. 88(c) is a sectional view showing a modification of FIG.88(b).

FIGS. 87(a) to 87(d) are views for explaining a second example of a light emitting device package having a structure in which a resin layer employed for the headlight for a vehicle illustrated in FIG. 84 contains a phosphor; FIGS. 88(a) to 88(d) are views for explaining a third example of a light emitting device package having a structure in which a resin layer employed for the headlight for a vehicle illustrated in FIG. 84 contains a phosphor;

DETAILED DESCRIPTION OF THE PREFERRED EMBODIMENT

Figure 1:
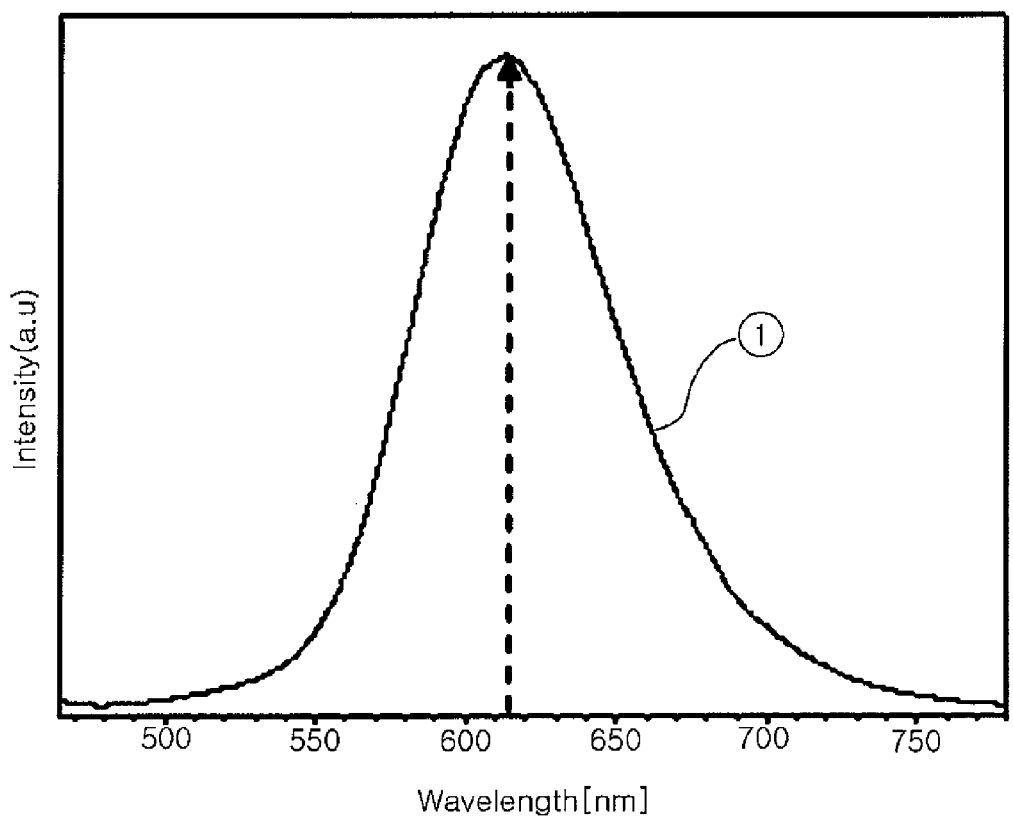
FIGS. 1 to 3 are graphs showing an emission spectrum, an XRD spectrum, and an EDX ingredient analysis result of $(Sr, M)_2SiO_{4-x}N_y$ phosphor according to a first exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

A red phosphor, comprising an inorganic crystal having an empirical formula $(Sr, M)_2SiO_{4-x}N_y$ as the mother body, according to an exemplary embodiment of the present invention, can emit red light of a long wavelength having an emission peak ranging from about 600 nm to about 700 nm by using Eu as an activator creating a red energy level. Here, the primary metallic element constituting the mother body is strontium (Sr), and a metallic element M that may substitute the strontium (Sr) is one or more of monovalent and divalent elements. Because an emission color and luminance change according to the state of electrodes around Eu, the central emission element, light emission characteristics and physical properties of the red phosphor can be varied by changing the composition of the inorganic crystal mother body.

The red phosphor includes an organic compound represented by an empirical formula $(Sr, M)_2SiO_{4-x}N_y$:Eu. In this case, M is at least one metallic element and x is selected within the range satisfying a condition of $0<x<4$, and because the total charge of $(Sr, M)_2SiO_{4-x}N_y$ must be 0, it is noted that y should satisfy the condition of $y=2x/3$. Preferably, in order to obtain red light of high luminance, x should satisfy the condition of $0.15 \leq x \leq 3$. If x is less than 0.15 or greater than 3, it would be difficult to obtain red light having a desired luminance and emission peak.

Here, M may include at least one selected from the elements of the first group consisting of Li, Na, K, Rb, and Cs, or at least one selected from the elements of the second group consisting of Mg, Ca, and Ba, in order to adjust an emission peak of the red phosphor. Also, a portion of Si in the empirical formula may be substituted with at least one selected from the group consisting of B, Al, Ga, and In or may be substituted with at least one selected from the group consisting of Ti, Zr, Hf, Sn, and Pb, in order to adjust the emission peak of the red phosphor, and the ratio at which Si is substituted with the element may be 1/10.

Namely, in an exemplary embodiment of the present invention, the red phosphor uses silicon nitride, a crystal, which is different from the conventional silicon oxide, and oxynitride, as the mother body, and by using such crystals to form the mother body, a red phosphor of the red wavelength, namely, the long wavelength having an emission peak ranging from about 600 nm to about 700 nm, can be obtained. Preferably, a high luminance red phosphor having an emission peak with a wavelength ranging from about 600 nm to about 650 nm, more preferably from about 600 nm to about 620 nm can be obtained.

Also, red phosphor according to an embodiment of the present invention has high light emission characteristics and good thermal and chemical stability when compared with the related art oxide phosphor (fluorescent material), which results from the nature of nitrogen to form a covalent bond in contrast to oxygen. That is, the red phosphor of the present invention can have excellent thermal stability through a rigid crystal structure. Through such a rigid nitrogen crystal structure, splitting of the energy level of lanthanum elements within the crystal can be increased in order to emit light of a long wavelength compared to that of the oxide phosphor. Namely, because the red phosphor according to an exemplary embodiment of the present invention can have high light emission characteristics and good thermal and chemical stability, a white LED package with a high output and high reliability can be manufacture.

In manufacturing the foregoing red phosphor, at least one of an Sr-containing compound and an M-containing compound, an Eu-containing compound, an Si-containing oxide, and an Si-containing nitride are prepared as raw materials. The respective raw materials are weighed according to a desired stoichiometry. The raw materials are mixed maybe by a wet method or a dry method.

First, according to the wet method, the weighed mixture, as well as a ball, which assist the mixing procedure of the raw materials and crushing the raw materials, and a solvent, are inserted into a container and mixed. The ball can be made of a material such as silicon oxide ($Si_3N_4$) or zinconia ($ZrO_2$), or any ball generally used in mixing raw materials may be used. As for the solvent, D.I.water, alcohols including ethanol, or the like, or an organic solvent including n-Hexane, or the like, may be used. After the raw materials, the solvent, and the ball are inserted into a container, the container is hermetically sealed, and the raw materials are then uniformly mixed for between one to 24 hours by using a device such as a miller or the like. After the mixing process is completed, the mixed raw materials and the ball are separated, and the solvent is mostly dried in an oven through a drying process for between one to 48 hours. The powder obtained after the drying process is completed is uniformly distributed as particles having the size of 100 micrometers or less by using a sieve made of a metal or polymer.

Meanwhile, according to the dry method, the raw materials are inserted into a container, without using a solvent, and are then uniformly mixed by using a milling machine. In this case, the mixing process is performed for between one to 24 hours, and in this case, a ball may be added together with the raw materials so as to facilitate the mixing process and thus shorten the time for mixing operation. Compared with the wet method, the dry mixing method does not require the solvent drying process, so that the overall processing time can be advantageously reduced. When the mixing of the raw materials is completed, the powder obtained as the mixing process is completed is uniformly distributed as particles having the size of 100 micrometers or less by using a sieve made of a metal or polymer, like the wet mixing method.

Finally, the distributed mixture powder is packed into a boron nitride (BN) crucible, and a firing or heating process is performed. In this case, the firing or heating process is performed for one to 24 hours at 1000 degrees Celsius to 1800 degrees Celsius by using a heating furnace. The firing or heating process is performed in an atmosphere containing a mixture of nitrogen gas containing 100% nitrogen ($N_2$) or 100% hydrogen. The synthesized phosphor powder is uniformly crushed by using a grinding mixer or crusher, on which a post-thermal process may be repeatedly performed one to three times in a similar manner as the above-described synthesizing process in order to improve the luminance of the phosphor.

Through such a process, the red phosphor containing the inorganic compound represented by the empirical formula $(Sr, M)_2SiO_{4-x}N_y$ is finally prepared. Here, M is at least one of a monovalent and divalent element, $0<x<4$, and $y=2x/3$.

The finally fired phosphor powder is crushed by using the grinding mixer or the crusher and, in order to obtain an optimum grain size (granularity), the grain size is controlled through a classification process. In this case, a red phosphor having a uniform size of 16 micrometers or less is typically obtained by using a sieve having a size of 16 micrometers. Here, the obtained phosphor powder may be post-processed by using D.I. water, inorganic acid, organic acid, and/or a base to remove impurities such as an extra vitreous, non-reactive metal material, and the like, contained in the phosphor. For example, nitric acid having a density of 0.1 percent to 60 percent may be applied to the phosphor powder, which is then stirred for one to 10 hours to elute and remove extra impurities. Besides the nitric acid, sulfuric acid, hydrochloric acid, hydrofluoric acid, or a mixed solution of these inorganic acids may be used as the inorganic acid. Meanwhile, impurities which have not been removed through the acid treatment may be removed by using a base. As the base, an inorganic base such as sodium hydroxide, potassium hydroxide, and the like, or a mixed solution of these inorganic bases may be used. A remnant acid or base in the phosphor slurry may be washed out by using D.I. water after the acid treatment or the base treatment, and wet classification, filtering, and drying are then performed to finally obtain the desired phosphor powder. In this case, drying is performed sufficiently at a temperature ranging from 50 degrees Celsius to 150 degrees Celsius.

In an exemplary embodiment of the present invention, the Sr-containing compound may be $SrCO_3$, the Eu-containing compound may be europium oxide ($Eu_2O_3$), the Si-containing oxide may be silicon oxide ($SiO_2$), and the Si-containing nitride may be silicon nitride ($Si_3N_4$). In this case, the red phosphor, according to an exemplary embodiment of the present invention, has an inorganic compound represented by the empirical formula $Eu_zSr_{2-z}SiO_{4-x}N_y$, by adding $Eu_2O_3$ to a composition of $SrCO_3$—$SiO_2$—$Si_3N_4$. In this case, z is selected from a value satisfying the condition of $0.01 \leq z \leq 0.2$. If the z value is greater than 0.2 in density, the illumination strength is reduced due to a density quenching phenomenon, and if the z value is less than 0.01 in density, the illumination strength is reduced due to the lack of density of the activator acting as a central emission element.

The present invention will now be described in more detail through various exemplary embodiments of the present invention, but the technical idea of the present invention is not meant to be limited by such exemplary embodiments.

Embodiment 1

Figure 2:
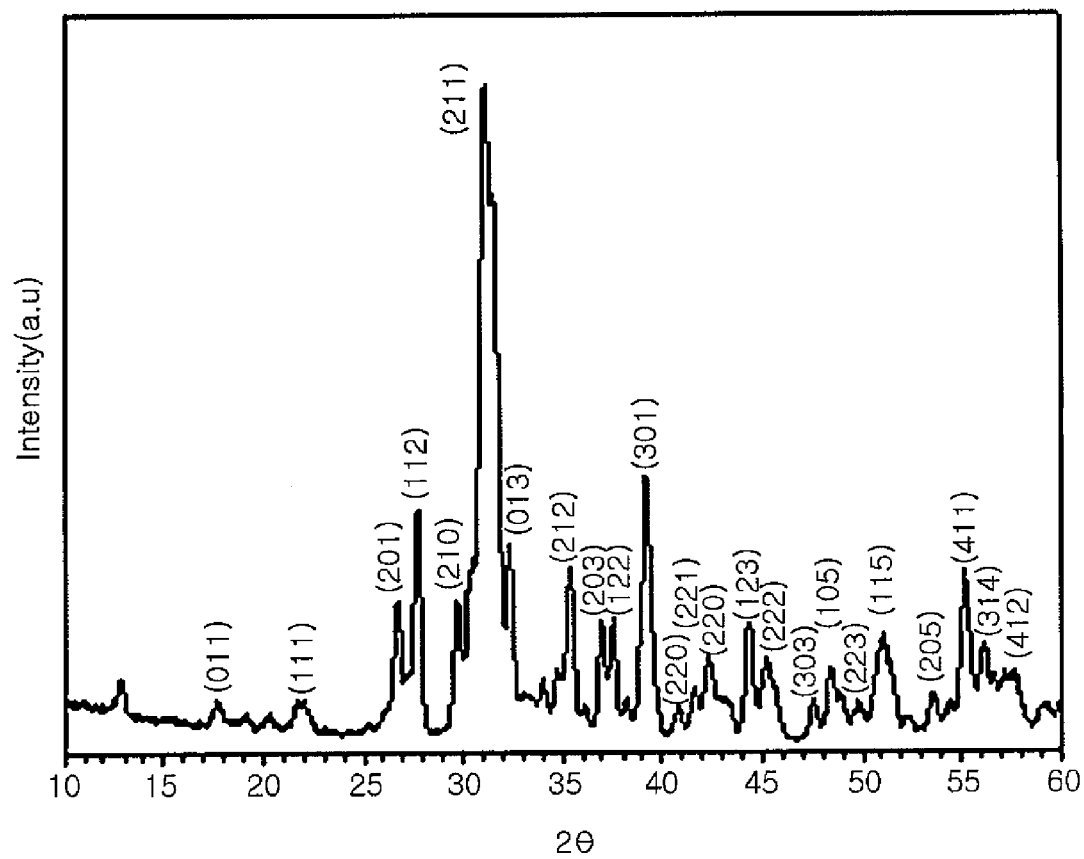
Figure 3:
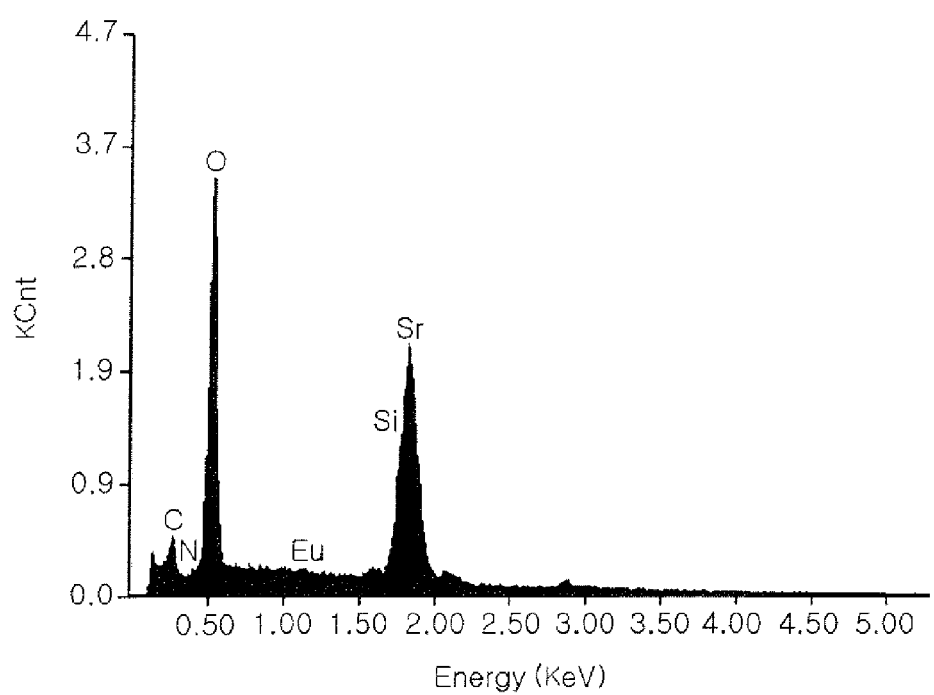

According to a desired stoichiometry, $SrCO_3$, $SiO_2$, $Eu_2O_3$, $Si_3N_4$ as raw materials were mixed with an ethanol-based solvent by using a ball mill. The ethanol solvent of the raw mixture was volatilized by using a dryer, and the dried raw mixture was packed into a boron nitride crucible. The raw mixture-filled boron nitride crucible was inserted into a heating furnace and fired for ten hours at 1600 degrees Celsius in a gas state under a $N_2$ atmosphere to prepare a phosphor of (Sr, M)$_2$SiO$_{4-x}$N$_y$:Eu. In this case, the base crystal structure of the phosphor of (Sr, M)$_2$SiO$_{4-x}$N$_y$:Eu was a strontium silicate ($Sr_2SiO_4$), and in this case, the composition of the mother body may change by substituting strontium with a metallic element M. FIGS. 1 TO 3 show an emission spectrum, an XRD spectrum, and an EDX ingredient analysis result of the phosphor of (Sr, M)$_2$SiO$_{4-x}$N$_y$:Eu. The red phosphor according to the present invention exhibits red light emission characteristics (①) having an emission peak of 613 nm by using a light having a wavelength in the region ranging from 200 nm to 500 nm as an excitation source, and has the same orthorhombic crystal structure as that of the conventional strontium silicate ($Sr_2SiO_4$) phosphor. According to the EDX ingredient analysis result, it is noted that oxygen and nitrogen elements are contained in the ratio of 44.91At %:4.58At % and some of the oxygen elements were substituted with nitrogen elements.

Embodiments 2 and 3

Figure 4:
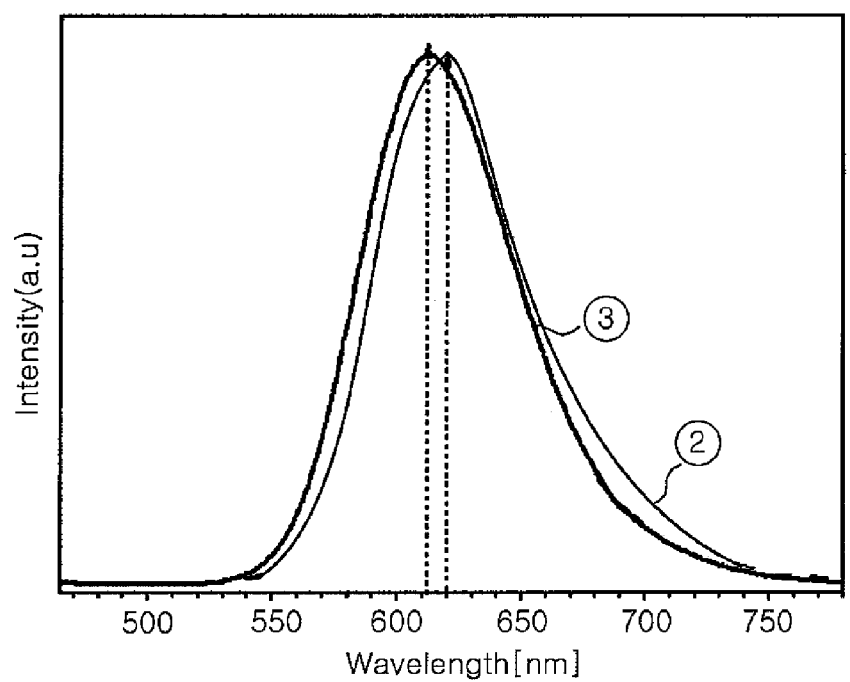
FIG. 4 is a graph showing emission spectra of $(Sr, M)_2SiO_{4-x}N_y$ phosphor according to second and third exemplary embodiment of the present invention.
Figure 5:
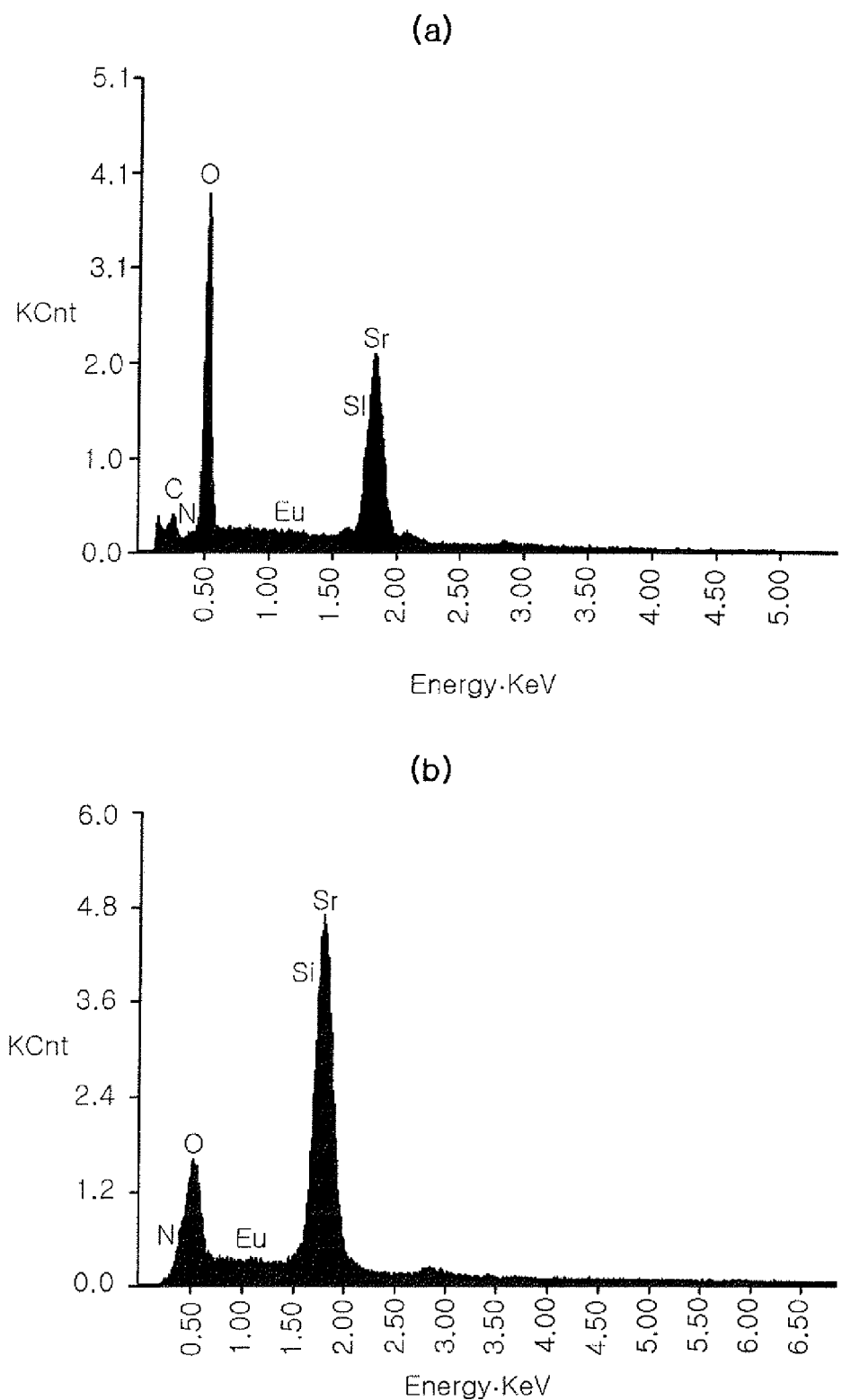
FIGS. 5(a) and 5(b) are graphs showing EDX ingredient analysis results of $(Sr, M)_2SiO_{4-x}N_y$ phosphor according to second and third exemplary embodiment of the present invention, respectively.

A phosphor of (Sr, M)$_2$SiO$_{4-x}$N$_y$:Eu was prepared in the same manner as the first embodiment, except that the content of nitrogen was changed. FIG. 4 shows an emission spectrum obtained by measuring the thusly prepared (Sr, M)$_2$SiO$_{4-x}$N$_y$:Eu phosphor by using an excitation light source in the wavelength region ranging from 200 nm to 599 nm. As noted in FIGS. 4 and 5, ② shows an emission spectrum when the At % of oxygen and nitrogen is 56.82:4.58 (x=0.43) (Embodiment 2) and ③ shows an emission spectrum when the At % of oxygen and nitrogen is 42.91:25 (x=1.86) (Embodiment 3). FIGS. 5(a) and 5(b) show EDX ingredient analysis results obtained by measuring the thusly prepared (Sr, M)$_2$SiO$_{4-x}$N$_y$:Eu phosphor. When the value x for substituting oxygen with nitrogen is 0.43, the emission peak in Embodiment 2 was 610 nm (FIG. 5(a)), and when the value x for substituting oxygen with nitrogen is 1.86, the emission peak in Embodiment 3 was 620 nm (FIG. 6(a)). It is noted that the emission peak of the Sr, M)$_2$SiO$_{4-x}$N$_y$:Eu phosphor prepared according to one embodiment of the present invention has a longer wavelength as the content of nitrogen increases.

Embodiments 4 to 6

Figure 6:
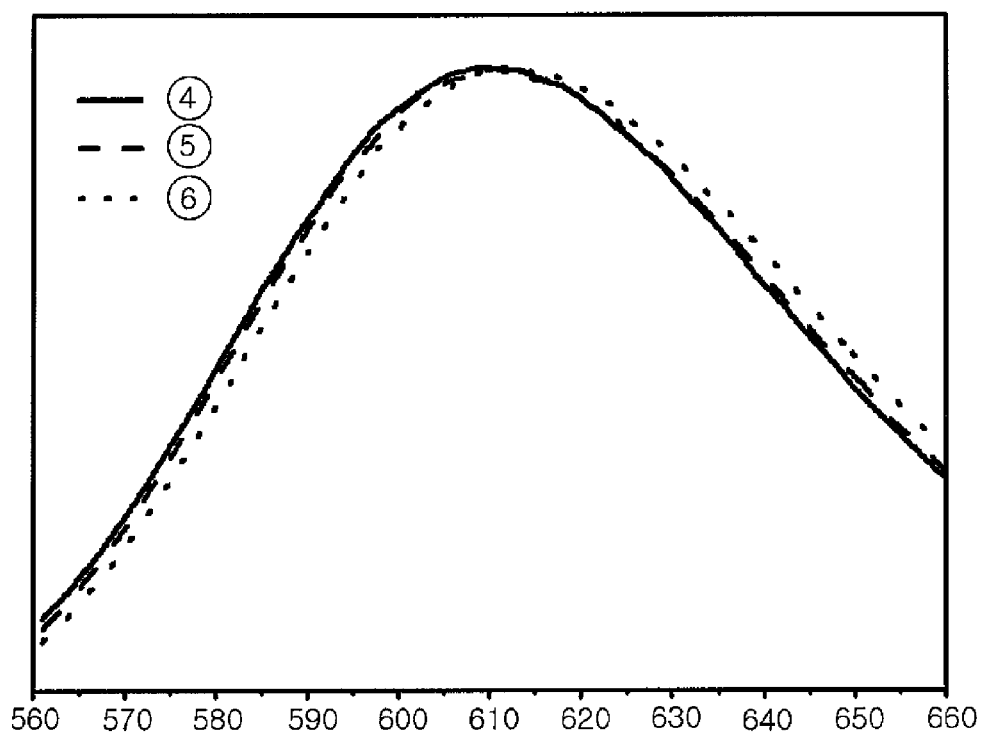
FIG. 6 is a graph showing emission spectra of $(Sr, M)_2SiO_{4-x}N_y$ phosphor according to fourth to sixth exemplary embodiments of the present invention.

An (Sr, M)$_2$SiO$_{4-x}$N$_y$:Eu phosphor was prepared in the same manner as that of the Embodiment 1, except that the content (z) of europium was changed by increasing it in units of 0.1 from 0.04 to 0.06. In this case, the red phosphor is represented by the empirical formula $Eu_zSr_{2-z}SiO_{4-x}N_y$, in which europium substitutes strontium to act as a central emission element. FIG. 6 shows an emission spectrum obtained by measuring the (Sr, M)$_2$SiO$_{4-x}$N$_y$:Eu phosphor while using a wavelength region ranging from 200 nm to 500 nm as an excitation light source. As noted in FIG. 6, ④ shows an emission spectrum when z=0.04 (Embodiment 4), ⑤ shows an emission spectrum when z=0.05 (Embodiment 5), and ⑥ shows an emission spectrum when z=0.06 (Embodiment 6). The emission peak in Embodiment 4 is 610 nm, the emission peak in Embodiment 5 is 612 nm, and the emission peak in Embodiment 6 is 614 nm. The red phosphor, according to one embodiment of the present invention, has a longer wavelength as the content of europium increases.

Embodiments 7 and 8

(Sr, M)$_2$SiO$_{4-x}$N$_y$:Eu phosphor was prepared in the same manner as that of the Embodiment 1, except that at least one of compounds containing a divalent metallic element such as Ba, Ca, and the like, was selectively added. Accordingly, strontium (Sr) can be partially substituted with a divalent metallic element such as Ba and Ca, and in this case, the substitution degree is such that an addition ratio of Sr:(Ba, Ca) is 9:1.

Figure 7:
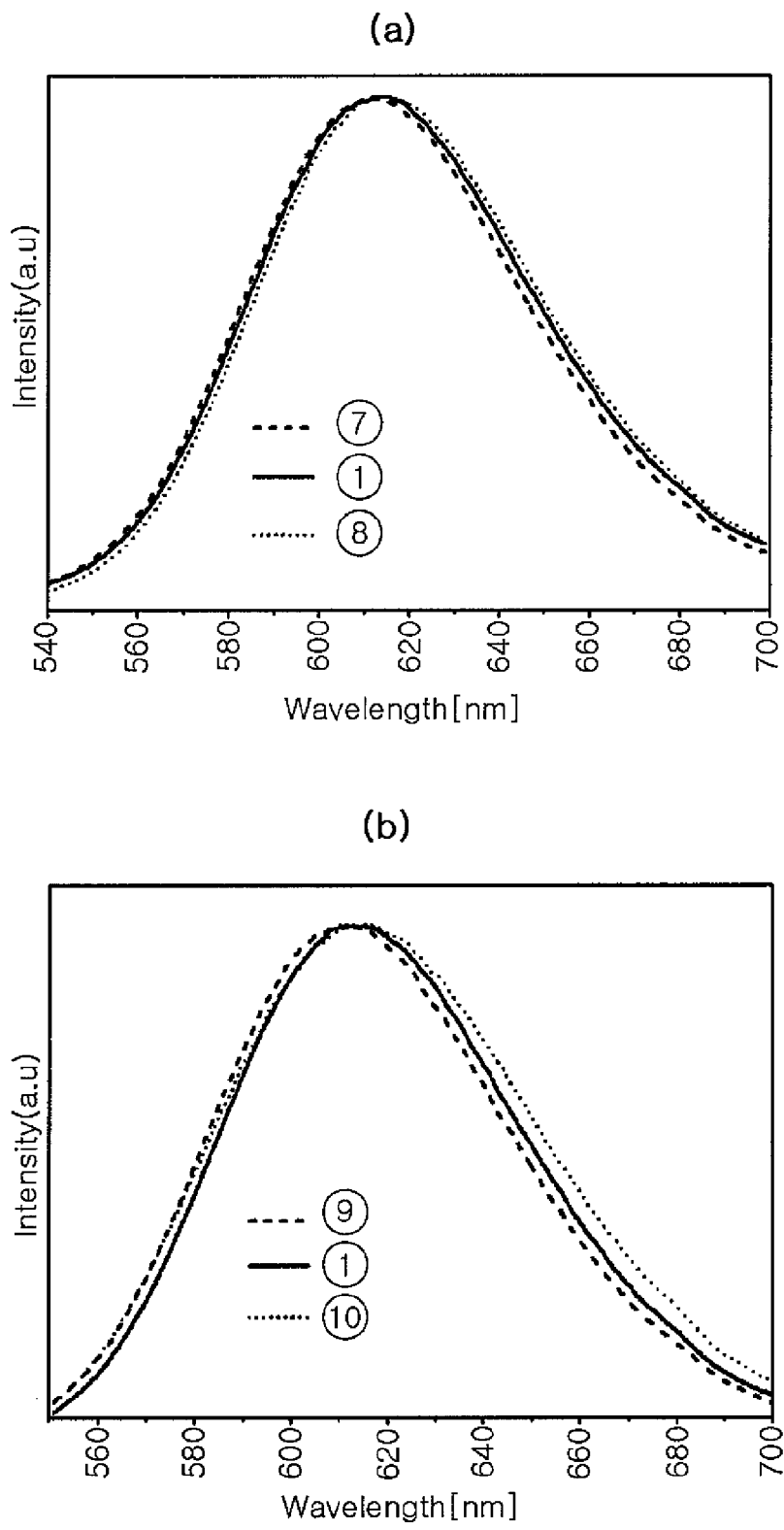
FIGS. 7(a) is a graph showing emission spectra of $(Sr, M)_2SiO_{4-x}N_y$ phosphor according to first, seventh, and eighth exemplary embodiments of the present invention.
FIG. 7(b) is a graph showing emission spectra of $(Sr, M)_2SiO_{4-x}Ny$ phosphor according to ninth, and tenth exemplary embodiments of the present invention.

FIG. 7(a) shows an emission spectrum of the thusly prepared (Sr, M)$_2$SiO$_{4-x}$N$_y$:Eu phosphor measured by using an excitation light source of a wavelength region ranging from 200 nm to 500 nm. As noted in FIG. 7(a), when strontium (Sr) is 100% (①), it has an emission peak of 613 nm, when Sr:Ba is added in the ratio of 90%:10% (⑦), it has an emission peak of 610 nm, and when Si:Ca is added in the radio of 90%:10% (⑧), it has an emission peak of 615 nm.

Embodiments 9 and 10

An (Sr, M)$_2$SiO$_{4-x}$N$_y$:Eu phosphor was prepared in the same manner as that of the Embodiment 1, except that at least one of compounds containing a trivalent metallic element such as Al, Ga, and the like, was selectively added. Accordingly, silicon (Si) can be partially substituted with a trivalent metallic element such as Al and Ga, and in this case, the substitution degree is such that an addition ratio of Si:(Al, Ga) is 9:1.

FIG. 7(b) shows an emission spectrum of the thusly prepared $(Sr, M)_2SiO_{4-x}N_y$:Eu phosphor measured by using the excitation light source of the wavelength region ranging from 200 nm to 500 nm. As noted in FIG. 7(b), when Si:Ga is added in the ratio of 90%:10% (⑨), it has an emission peak of 610 nm, and when Si:Al is added in the ratio of 90%:10% (⑩), it has an emission peak of 615 nm.

In addition to ratios described in the foregoing exemplary embodiments, other percentages of Sr substituted with M may be used in accordance with embodiments of the disclosed subject matter, such as 90% or less, 50% or less, and less than 10%.

Thus, as noted in Embodiments 7 to 10, when Ca and Al, elements having a small atomic radius, are substituted around the europium element, it has a longer wavelength, and when Ba and Ga, elements having a large atomic radius, are substituted, it has a shorter wavelength.

Embodiment 11

Figure 8:
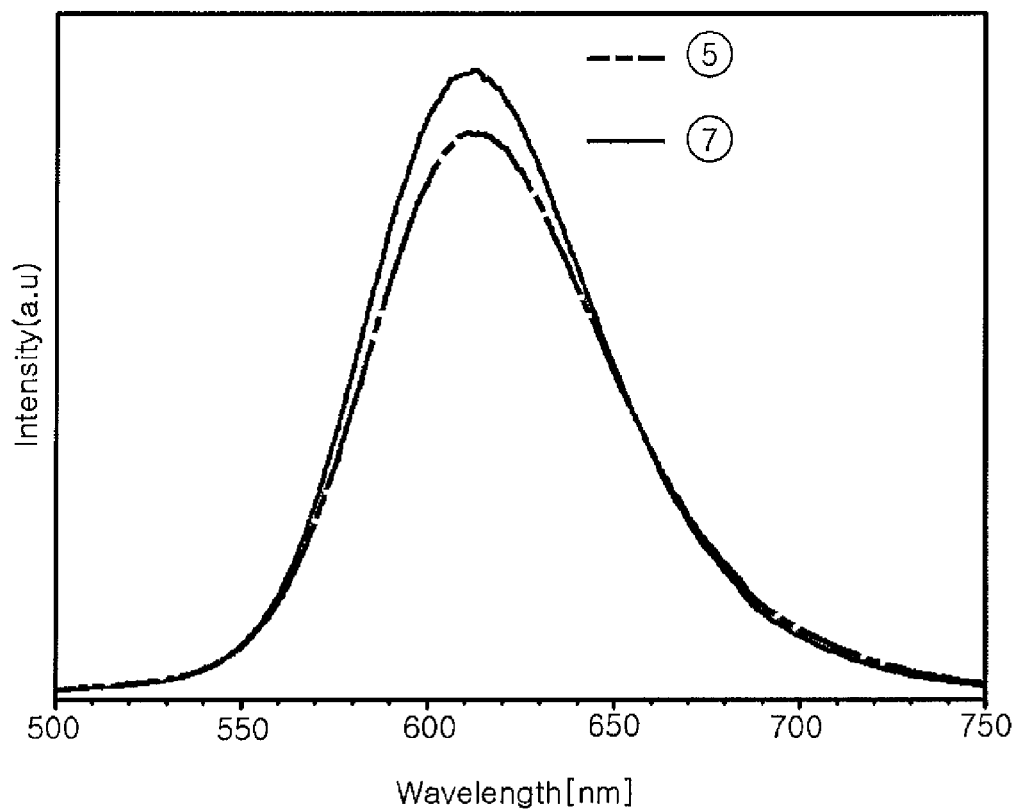
FIG. 8 is a graph showing emission spectra of $(Sr, M)_2SiO_{4-x}N_y$ phosphor according to the fifth and seventh embodiments of the present invention.

An $(Sr, M)_2SiO_{4-x}N_y$:Eu phosphor was prepared in the same manner as that of the Embodiment 1, except that manganese (Mn) was further added together with europium. In this case, the content (z) of europium was fixed at 0.05 and the content of Mn was 0.1. FIG. 8 shows an emission spectrum of the thusly prepared $(Sr, M)_2SiO_{4-x}N_y$:Eu phosphor measured by using an excitation light source of the wavelength region ranging from 200 nm to 500 nm. As noted in FIG. 8, when the content (z) of europium was 0.05 and Mn was not added (⑤) and when the content (z) of europium was 0.05 and the content of Mn was 0.1 (⑪), an emission peak of the both cases was all 613 nm. However, it is noted that emission intensity was more improved in the case of (⑪), where Mn was added, than in the case (⑤) where only europium was added.

In addition to ratios described in the foregoing exemplary embodiments, other Mn:Eu ratios may be used in accordance with embodiments of the disclosed subject matter, such as 0.1:0.05 or larger.

A light emitting device package, a surface light source apparatus, and a lighting apparatus using the red phosphor according to embodiments 1 to 11 will now be described with reference to the accompanying drawings.

Figure 9:
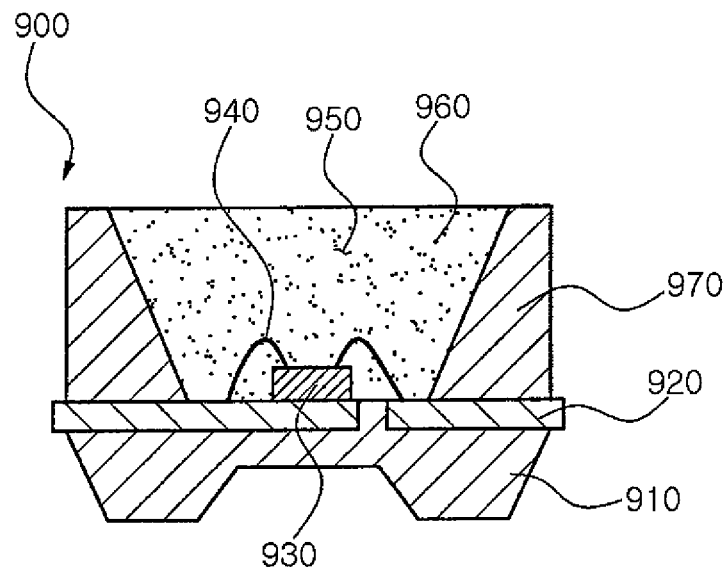
FIG. 9 is a side sectional view of a light emitting device package according to a first exemplary form of the present invention.

FIG. 9 is a side sectional view of a light emitting device package according to a first exemplary form of the present invention. As shown in FIG. 9, a light emitting device package 900 includes a package body 910, lead frames 920 molded to the package body 910 and formed to be separated from each other, a light emitting device 930 mounted on at least one lead frame, a bonding wire 940 electrically connecting the light emitting device 930 and the lead frame 920, and a resin packing unit 950 encapsulating the light emitting device 930. The light emitting device package 900 may include a reflection cup 970 formed on an upper portion of the package body 910 based on the position of the lead frame and having a recess surrounding the light emitting device 930. The reflection cup 970 is formed in an annular shape on the package body 910, a mounting region of the light emitting device 930 is defined by the recess of the reflection cup 970, and at least one lead frame is exposed from the bottom of the recess to provide the mounting region. Also, the side wall of the reflection cup 970 may be formed as a sloped reflection surface in order to reflect light emitted from the light emitting device 930 in a desired direction. Here, the package body 910 may be integrally formed with the reflection cup 970.

The light emitting device 930 may be bonded on the lead frame 920 by an adhesive or the like, and generates light of a predetermined wavelength upon receiving current from an external power source via the bonding wire 940. The light emitting device 930 may emit light of a wavelength ranging from 200 nm to 500 nm. For example, the light emitting device 930 may be a blue LED or an ultraviolet LED having a semiconductor stacked structure emitting blue light or ultraviolet rays. Various exemplary forms of the semiconductor stacked structure of the light emitting device will now be described with reference to FIGS. 10 to 19.

The resin packing unit 950 is filled to cover the light emitting device 930, the bonding wire 940, and the lead frame 920 at an inner side of the reflection cup. Also, the resin packing unit 950 may include a phosphor 960 converting an emission wavelength of the light emitting device into light of a different wavelength. The phosphor 960 may be used by mixing a red phosphor with one or more of yellow, blue, and green phosphors in order to emit white light. The resin packing unit 950 is used by properly mixing a phosphor mixture and a hardening transparent resin such as an epoxy resin, a silicon resin, or a silicon/epoxy mixture resin.

Here, as the red phosphor for outputting white light, a nitride-based phosphor including an inorganic compound represented by the empirical formula $(Sr, M)_2SiO_{4-x}N_y$:Eu synthesized according to Embodiments 1 to 11 of the present invention, where M is at least one of a monovalent and divalent element, $0<x<4$, and $y=2x/3$, may be used. Such a nitride-based red phosphor has good reliability with respect to an external environment such as heat, moisture, and the like, compared with a sulfide-based phosphor and has less possibility of discoloration than that of the sulfide-based phosphor. In particular, the nitride-based red phosphor has a high phosphor excitation efficiency at a dominant wavelength of a blue LED chip designed to obtain a high color reproductivity with a particular wavelength range (e.g., 430 nm to 465 nm).

As a blue phosphor, $(Ba, Sr, Ca)_5(PO_4)_3Cl:(Eu^{2+}, Mn^{2+})$ or $Y_2O_3:(Bi^{3+}, Eu^{2+})$ may be selectively used. A green phosphor may include one of a silicate based phosphor, a sulfide-based phosphor, and a nitride-based phosphor. The silicate-based green phosphor may include one of an $A_2SiO_4$ silicate-based green phosphor having a 2,1,4 composition, an $A_3SiO_5$ silicate-based green phosphor having a 3,1,5 composition, a sulfide-based green phosphor having a composition of $SrGa_2S_4$:Eu or a nitride-based green phosphor having a composition of Beta-SiAlON. Here, A may be Sr, Ba, Ca, or Mg, Sr is an essential component, and Ba, Ca, and Mg may be selectively included as necessary ($0 \leq Ba,Ca,Mg \leq 1$). A nitride-based green phosphor may include a nitride or oxynitride crystal employing Eu among crystals having a beta-type $Si_3N_4$ crystal structure, and may include a phosphor represented by $Si_{6-z}Al_zO_zN_{8-z}$:Eu$_y$, Sr$_x$ ($0.009<x<0.011$, $0.018<y<0.025$, $0.23<z<0.35$) or $Si_{6-z}Al_zO_zN_{8-z}$ ($0.24 \leq y \leq 0.42$, and the content of Eu is 0.05 at %-0.25 at %). A yellow phosphor may include any one of a garnet-based YAG or TAG phosphor, an $A_2SiO_4$ silicate based phosphor having a 2,1,4 composition, an $A_3SiO_5$ silicate based phosphor having a 3,1,5 composition, or a nitride-based phosphor having an alpha-SiAlON composition (here, A may be Sr, Ba, Ca, and/or Mg, Sr is an essential component, and Ba, Ca, and Mg may be selectively included as necessary ($0 \leq Ba,Ca, Mg \leq 1$)). As the nitride-based phosphor, a Ca-α-sialon phosphor represented as $CaXSi_{12-(m+2)}Al_{(m+n)}O_nN_{16-n}$:Eu$_y$ ($0.01<y<0.7$, $0.6<m<3.0$ and $0 \leq n<1.5$) may be used.

Various exemplary forms of the light emitting device according to the present invention will now be described with reference to FIGS. 10 to 19.

Figure 10:
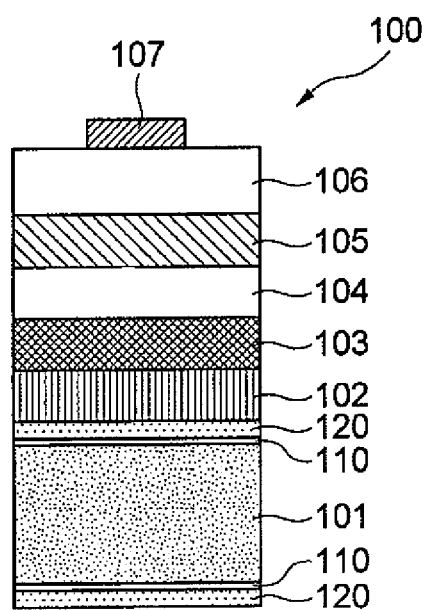
FIGS. 10 to 28 are side sectional views of a light emitting device according to first and second exemplary embodiments of the present invention.

First, as shown in FIG. 10, a light emitting device 100 according to a first exemplary embodiment of the present invention may have a semiconductor-stacked structure as follows: A substrate made of an Si—Al alloy (referred to as an 'Si—Al alloy substrate', hereinafter) 101, protection layers 120 formed on upper and lower surfaces of the Si—Al alloy substrate 101, a bonding metal layer 102 on the protection layer 102, a reflective metal layer 103, a p-type semiconductor layer 104, an active layer 105, and an n-type semiconductor layer 106 are sequentially stacked. The p-type and n-type semiconductor layers 104 and 106 and the active layer 105 may be made of a GaN-based semiconductor material, namely, $Al_xGa_yIn_{(1-x-y)}N(0 \le x \le 1, 0 \le y \le 1, 0 \le x+y \le 1)$ semiconductor material, and the like, and form a light emitting structure.

An n-side electrode 107 is formed on the n-type semiconductor layer 106. The reflective metal layer 103 interposed between the bonding metal layer 102 and the p-type semiconductor layer 104 reflects light made incident from the semiconductor layer upwardly to thereby increase the luminance of the light emitting device. The reflective metal layer 103 may be made of metal with a high reflectivity, for example, made of metal selected from the group consisting of Au, Ag, al, Rh, and an alloy of two or more of them. However, the reflective metal layer 103 may not be formed as necessary. The bonding metal layer 102 serves to bond the Si—Al alloy substrate 101 to the light emitting structure and may be made of Au or the like. Here, the light emitting device 100 according to an exemplary embodiment of the present invention includes the bonding metal layer 102. In this case, however, the Si—Al alloy substrate 101 may be directly bonded to the p-type semiconductor layer 104. Accordingly, the light emitting device 100 according to the exemplary embodiment of the present invention uses the Si—Al alloy substrate 101 as a conductive substrate.

The Si—Al alloy is advantageous in terms of thermal expansion coefficient, heat conductivity, mechanical processability, and cost. The thermal expansion coefficient of the Si—Al alloy substrate 101 is similar to that of a sapphire substrate. Thus, in the case of manufacturing the light emitting device 100 by using the Si—Al alloy substrate 101, a substrate sagging phenomenon and a cracking phenomenon in the light emitting structure occurring when the process of bonding the conductive substrate made of Si and the process of separating the sapphire substrate by laser irradiation in the related art are performed can be significantly reduced in order to obtain the light emitting device 100 with less flaws and high quality.

Also, the heat conductivity of the Si—Al alloy substrate 101 is about 120 W/m·K to 180 W/m·K, having good heat release characteristics. In addition, because the Si—Al alloy substrate 101 can be easily manufactured by melting Si and Al at a high pressure, the Si—Al alloy substrate 101 can be easily acquired at a low cost.

In particular, the light emitting device 100 according to an exemplary embodiment of the present invention additionally includes the protection layers 120 formed on the upper and lower surfaces of the Si—Al alloy substrate 101 in order to prevent chemical infiltration into the Si—Al alloy substrate 101 during a cleaning process. Here, the protection layers 120 may be made of metal, a conductive dielectric, or the like. When the protection layers 120 are made of metal, it may be made of one of Ni, Au, Cu, W, Cr, Mo, Pt, Ru, Rh, Ti, and Ta, or an alloy of two or more of the elements in the metal group. In this case, the protection layers 120 may be formed through an electrolysis plating method, a metal deposition, a chemical vapor deposition (CVD), and the like. In this case, a seed metal layer 110 serving as a seed may be additionally formed between the Si—Al alloy substrate 101 and the protection layer 120 made of metal. The seed metal layer 110 may be made of Ti/Au or the like. Also, when the protection layer 120 is made of a conductive dielectric, the conductive dielectric may be made of indium tin oxide (ITO), indium zinc oxide (IZO), copper indium oxide (CIO), and the like. In this case, the protection layer 120 may be formed through deposition, a sputtering method, and the like. Preferably, the protection layer 120 is formed to have a thickness ranging from 0.01 µm to 20 µm, and more preferably, the protection layer 120 is formed to have a thickness ranging from 1 µm to 10 µm.

A method for manufacturing the light emitting device according to the first exemplary embodiment of the present invention will now be described with reference to FIGS. 11 to 18. FIGS. 11 to 18 are sectional views sequentially showing the process of a method for manufacturing the light emitting device according to the first exemplary embodiment of the present invention.

Figure 11:
Figure 12:
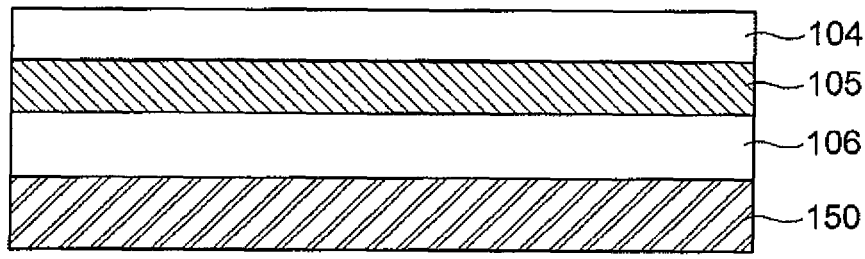
Figure 13:
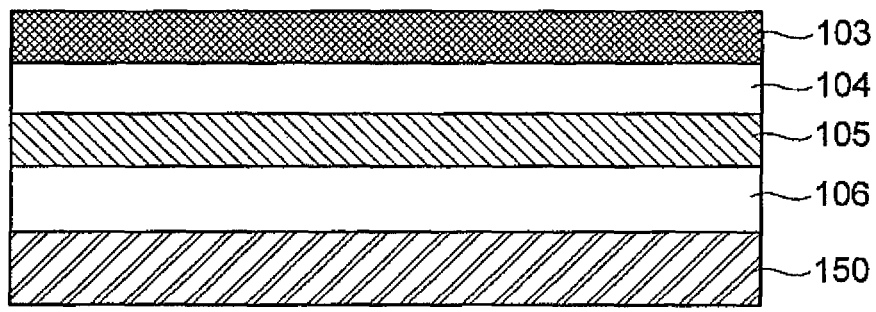
Figure 14:
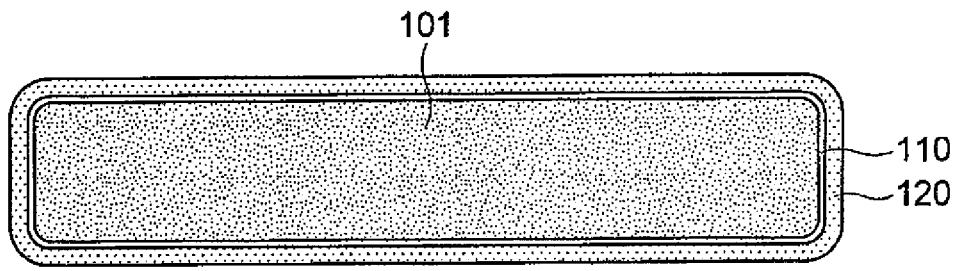

First, as shown in FIG. 11, a sapphire substrate 150 is prepared as a growth substrate. Next, as shown in FIG. 12, the n-type semiconductor layer 106, the active layer 105, and the p-type semiconductor layer 104 are sequentially formed on the sapphire substrate 150. And then, as shown in FIG. 13, the reflective metal layer 103 is formed on the p-type semiconductor layer 104 by using a metal material with a high reflectivity, for example, by using Au, Al, Ag, Rh, etc. Here, the reflective metal layer 103 may not be formed as necessary. Thereafter, as shown in FIG. 14, the protection layer 120 is formed on the surface of the Si—Al alloy substrate 101. The protection layer 120 may be formed by using metal or a conductive dielectric.

Here, in the case in which the protection layer 120 is made of metal, it may be made of one of Ni, Au, Cu, W, Cr, Mo, Pt, Ru, Rh, Ti, and Ta, or an alloy of two or more of the elements in the metal group. The protection layer 120 may be formed according to electrolysis plating, a sputtering method, a CVD, and the like. In this case, when the protection layer 120, made of the metal material, is formed according to the electrolysis plating method, the seed metal layer 110 serving as a seed during a process of plating the protection layer 120 may be additionally formed before the protection layer 120 is formed on the surface of the Si—Al alloy substrate 101.

Also, in the case where the protection layer 120 is made of a conductive dielectric, the protection layer 120 may be made of ITO, IZO, CIO, and the like, and may be formed according to deposition or the sputtering method. Preferably, the protection layer 120 is formed to have a thickness ranging from 0.01 µm to 20 µm over the entire surface of the Si—Al alloy substrate 101, and more preferably, the protection layer 120 is formed to have a thickness ranging from 1 µm to 10 µm. If the protection layer 120 was formed to have a thickness less than 0.01 µm, the protection layer 120 could not properly serve to prevent the chemical infiltration of HCL, HF, KOH, and the like (to be described), and if the protection layer 120 is formed to have a thickness larger than 20 µm, the thermal expansion coefficient of the Si—Al alloy substrate 101 would possibly change. Thus, preferably, the protection layer 120 is formed to have the thickness of the mentioned range.

Although not shown, after the protection layer 120 is formed, the surface of the protection layer 120 may be subject to a chemical mechanical polishing (CMP) process to improve surface roughness.

Figure 15:
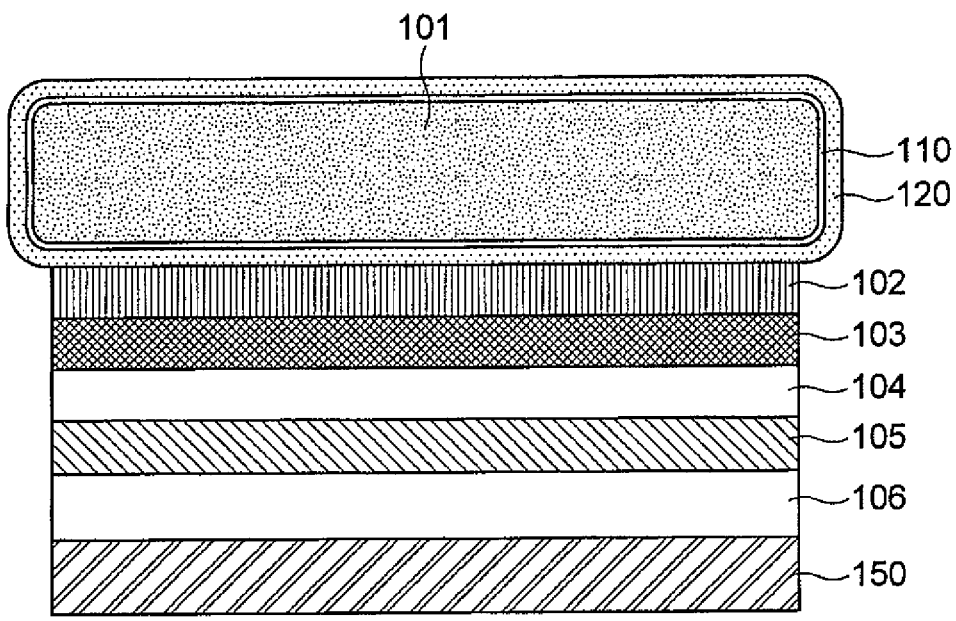

As mentioned above, after the Si—Al alloy substrate 101 with the protection layer 120 formed thereon is prepared, the Si—Al alloy substrate 101 with the protection layer 120 formed thereon is bonded onto the reflective metal layer 103 by using the bonding metal layer 102 as shown in FIG. 15. Here, as described above, the Si—Al alloy substrate 101 may be bonded by using the bonding metal layer 102, or alternatively, the Si—Al alloy substrate 101 with the protection layer 120 formed thereon may be directly bonded onto the reflective metal layer 103 without using the bonding metal layer 102.

Figure 16:
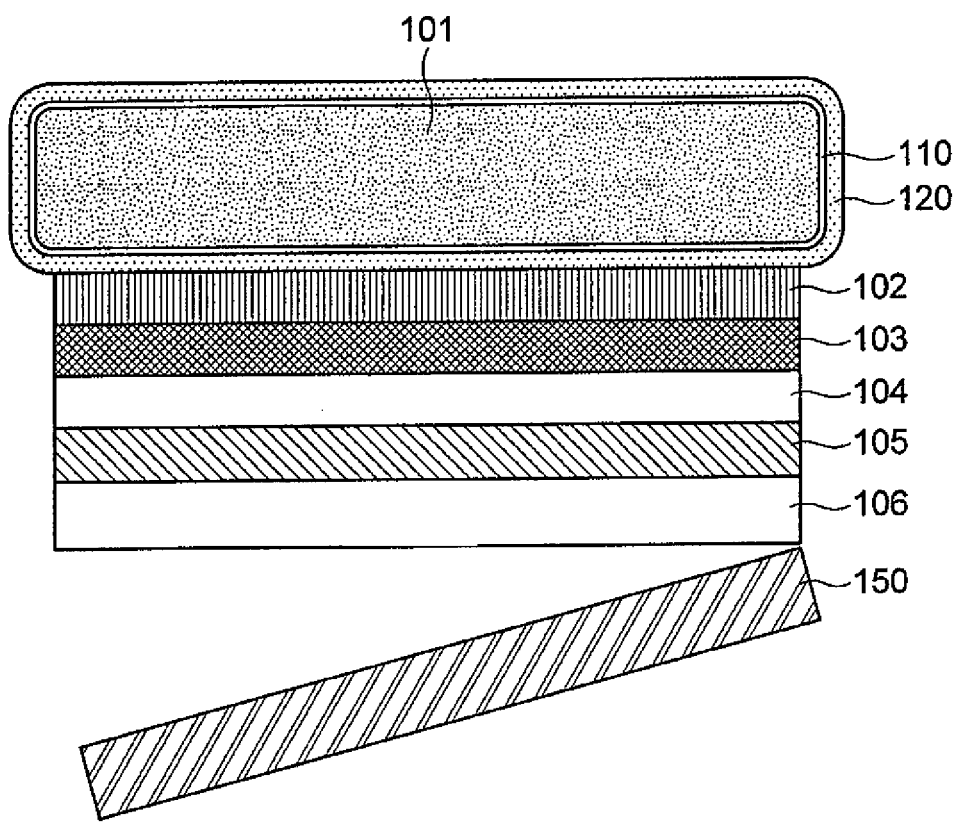

Subsequently, as shown in FIG. 16, the sapphire substrate 150 is detached from the n-type semiconductor layer 106 according to a laser lift off (LLO) process. After the sapphire substrate 150 is detached, a cleaning processing using a chemical such as HCL, HF, KOH, and the like, may be performed.

Figure 17:
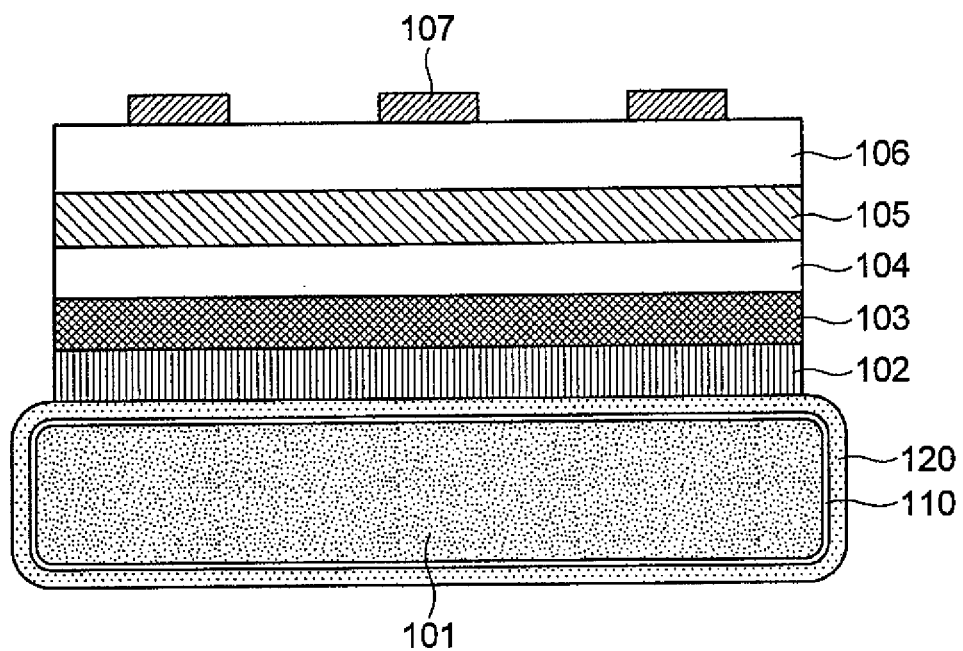

Thereafter, as shown in FIG. 17, a plurality of n-side electrodes 107 are formed on the n-type semiconductor layer 106 exposed as the sapphire electrode 150 is detached. Here, before the formation of the n-side electrodes 107, a texturing process using KOH or the like may be performed on the surface of the n-type semiconductor layer 106 in order to improve the light extraction efficiency of the element.

Figure 18:
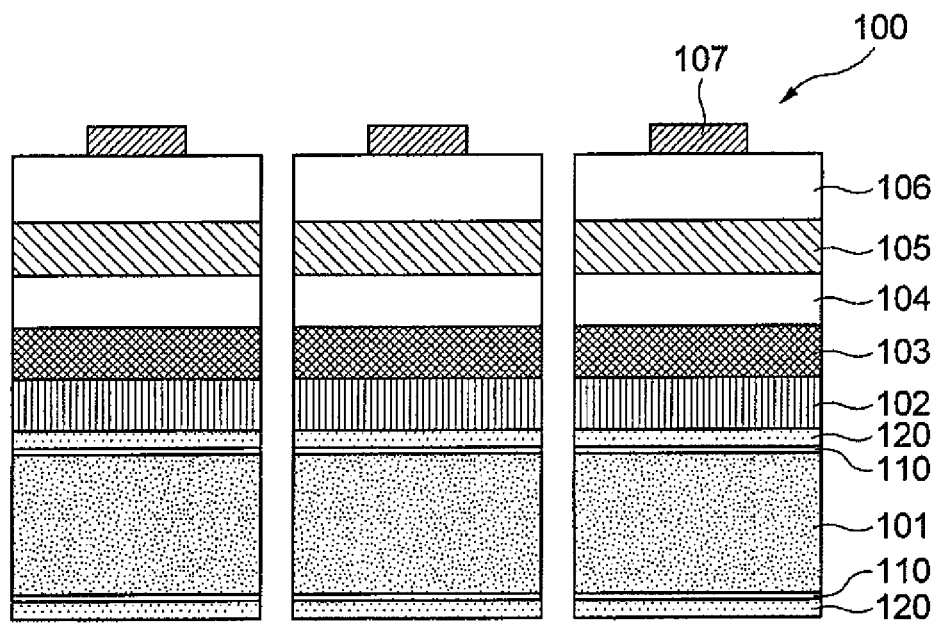

Subsequently, as shown in FIG. 18, the n-type semiconductor layer 106, the active layer 105, the p-type semiconductor layer 104, the reflective metal layer 103, the bonding metal layer 102, the protection layer 120, the seed metal layer 110 and the Si—Al alloy substrate 101 between the n-type electrodes 107 are diced so as to be separated by the chips. Accordingly, the light emitting device 100 according to the first exemplary embodiment of the present invention can be obtained.

In the light emitting device according to the first exemplary embodiment of the present invention, because the protection layer 120 such as Ni is additionally formed on the surface of the alloy substrate 101, the Al metal of the Si—Al alloy substrate 101 can be prevented from being etched by the chemical such as HCL, HF, KOH, or the like, which are used in the cleaning process performed after the sapphire substrate 150 is detached, or by KOH, which is used in the surface texturing process performed on the n-type semiconductor layer 106. Thus, in the light emitting device according to the first exemplary embodiment of the present invention, the Si—Al alloy substrate 101 can be prevented from having irregular portions (i.e., protrusions and depressions or uneven portions), thus preventing the light emitting structure bonded onto the Si—Al alloy substrate 101 from coming off or from being stripped off.

Also, the use of the metal such as Ni or the like as a material of the protection layer 120 advantageously improves the surface roughness of the Si—Al alloy substrate 101, making the bonding between the Si—Al alloy substrate 101 and the light emitting structure firm. In the prior art, the Si—Al alloy substrate 101 undergoes a cleaning process, before the bonding metal layer 102 is formed, using a chemical material such as an acid or the like in order to remove a native oxide layer, causing the Al metal on the surface of the Si—Al alloy substrate 101 to be etched, which thereby results in the formation of an irregular surface ranging from 200 nm to 500 nm in height on average. However, in the first exemplary embodiment of the present invention, the metal such as Ni is formed as the protection layer 120 on the surface of the Si—Al alloy substrate 101, which is then subjected to the Ni CMP process, whereby the irregular surface is reduced to 5 nm or less to thus obtain an improved surface roughness like a mirror face.

Because the surface roughness of the Si—Al alloy substrate 101 is improved, the Si—Al alloy substrate 101 and the light emitting structure can be firmly bonded, and thus, the bonding yield can be enhanced.

Figure 19:
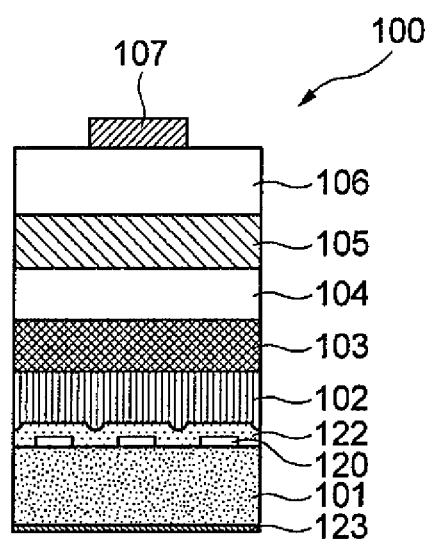

A light emitting device according to a second exemplary embodiment of the present invention will now be described. As shown in FIG. 19, the light emitting device 100 according to the second exemplary embodiment of the present invention has virtually the same configuration as that of the light emitting device according to the first exemplary embodiment of the present invention, except that the protection layer 120 is formed on the upper surface of the Si—Al alloy substrate 101 such that it exposes portions of the Si—Al alloy substrate 101, rather than being formed on the entirety of the upper and lower surfaces of the Si—Al alloy substrate 101, a conductive layer 122 is formed on the protection layer 120 and on the upper surface of the Si—Al alloy substrate 101 exposed by the protection layer 120, and a contact metal layer 123 is formed on the lower surface of the Si—Al alloy substrate 101. In particular, preferably, the protection layer 120 is made of an insulating material, rather than a metal or a conductive dielectric. Namely, in the light emitting device according to the second exemplary embodiment of the present invention, while the protection layer 120 is made of an insulating material, rather than a metal or a conductive dielectric, the protection layer 120 is formed on the upper surface of the Si—Al alloy substrate 101, exposing portions thereof, in order to allow the Si—Al alloy substrate 101, on which the protection layer 120 is formed, and the light emitting structure above the protection layer 120 to be electrically connected, and the conductive layer 122 is additionally formed on the upper surface of the Si—Al alloy substrate 101 including the protection layer 120. Here, the conductive layer 122 may be made of metal or the like.

A method for manufacturing a compound semiconductor light emitting device, according to the second exemplary embodiment of the present invention, will now be described in detail. A description of elements in the second exemplary embodiment of the present invention the same as those of the first exemplary embodiment of the present invention will be omitted, and only different elements in the second exemplary embodiment will be described.

First, with reference back to FIGS. 11 to 13, the n-type semiconductor layer 106, the active layer 105, the p-type semiconductor layer 104, and the reflective metal layer 103 are sequentially formed on the sapphire substrate 150. Here, the reflective metal layer 103 may not be formed as necessary.

Figure 20:
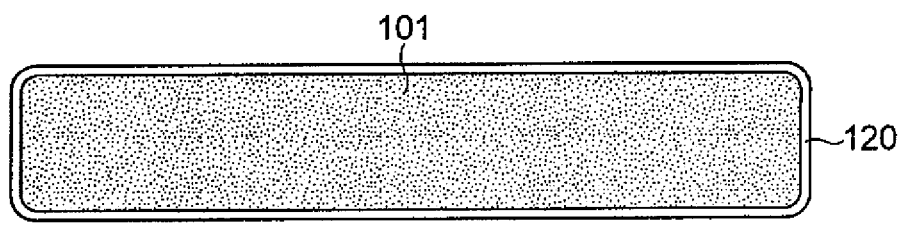

Next, as shown in FIG. 20, the protection layer 120 is formed on the entire surface of the Si—Al alloy substrate 101. Here, the protection layer 120 may be made of an insulating material. The protection layer 120 made of an insulating material may be formed to have a thickness ranging from 0.01 μm to 1 μm according to CVD or a coating method. Although not shown, after the protection layer 120 is formed, the surface of the protection layer 120 may be subjected to CMP.

Figure 21:
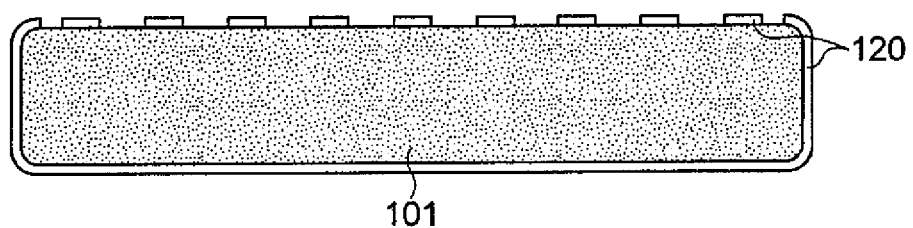
Figure 22:
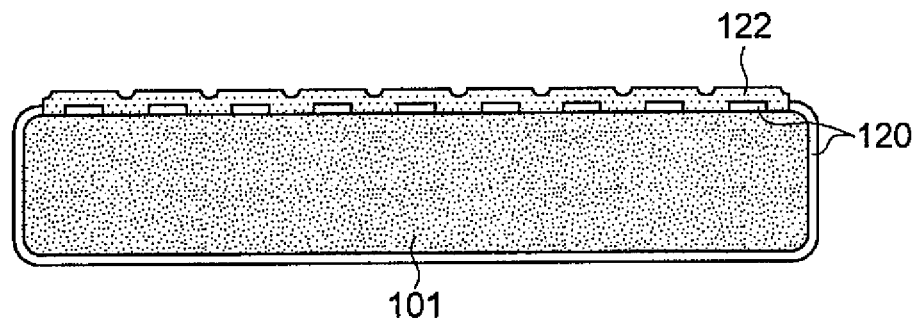
Figure 23:
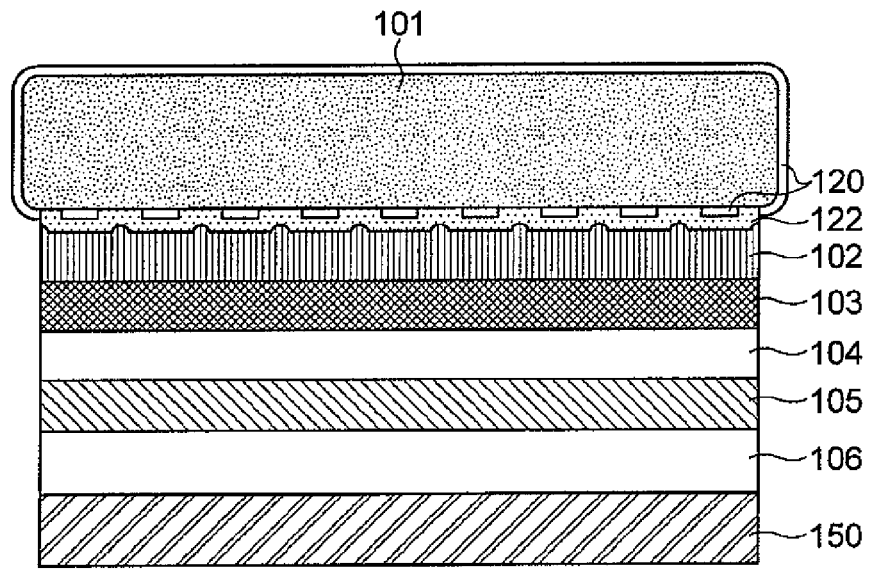

And then, as shown in FIG. 21, portions of the protection layer 120 are removed through an etching method or the like so as to expose portions of the upper surface of the Si—Al alloy substrate 101. Thereafter, as shown in FIG. 22, the conductive layer 122 is formed on the upper surface of the Si—Al alloy substrate 101 including the protection layer 120. Subsequently, as shown in FIG. 23, the conductive layer 122 formed on the Si—Al alloy substrate 101 is bonded onto the reflective metal layer 103 by using the bonding metal layer 102.

Figure 24:
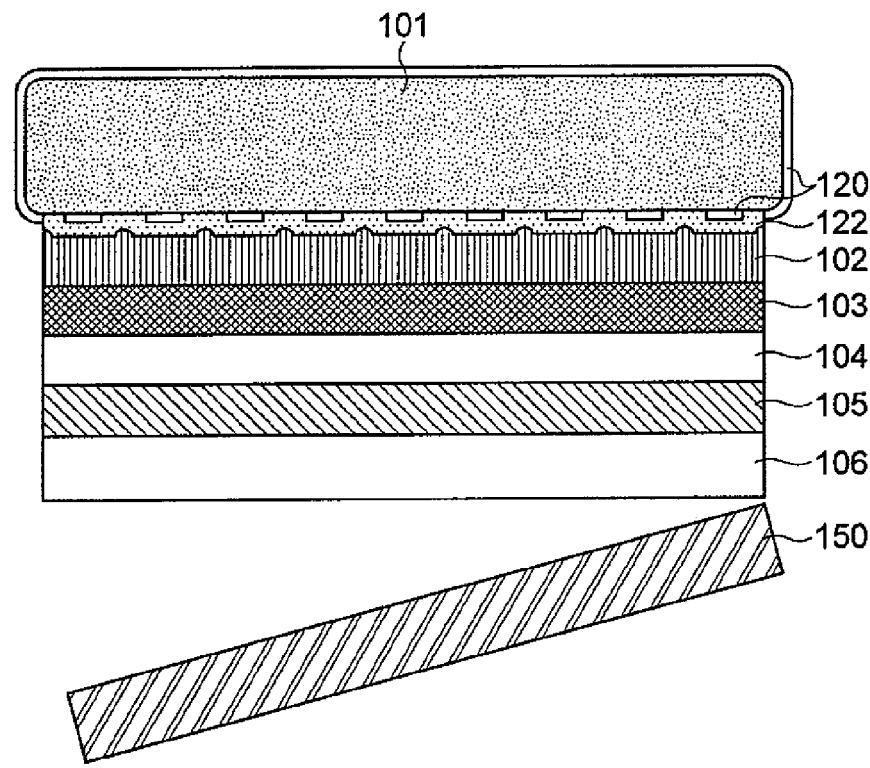

Thereafter, as shown in FIG. 24, the sapphire substrate 150 is detached from the n-type semiconductor layer 106 through a laser lift-off process. Here, after the sapphire substrate 150 is detached, a cleaning process using a chemical such as HCL, HF, KOH, or the like, may be performed. In this case, in the light emitting device according to the second exemplary embodiment of the present invention, because the protection layer 120 and the conductive layer 122 are formed on the surface of the Si—Al alloy substrate 101, Al metal of the Si—Al alloy substrate 101 can be prevented from being etched by the chemical used in the cleaning process.

Figure 25:
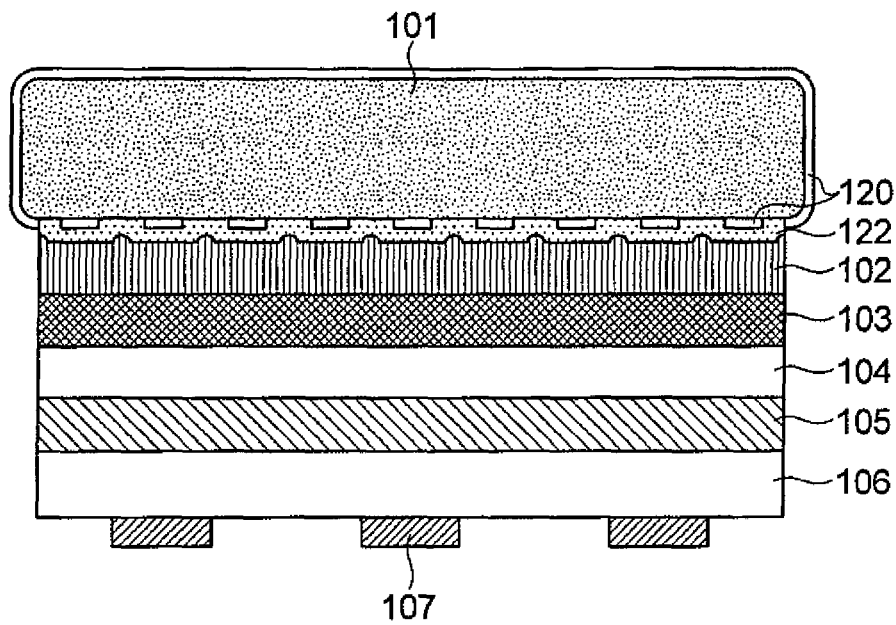

And then, as shown in FIG. 25, the plurality of n-side electrodes 107 are formed on the n-type semiconductor layer 106 exposed as the sapphire substrate 150 was detached. Here, before the formation of the n-side electrodes 107, a texturing process using KOH or the like may be performed on the surface of the n-type semiconductor layer 106 in order to improve a light extraction efficiency of the element. In this case, according to the present exemplary embodiment, because the protection layer 120 and the conductive layer 122 are formed on the surface of the Si—Al alloy substrate 101, Al metal of the Si—Al alloy substrate 101 can be prevented from being etched by the chemical used in the texturing process.

Figure 26:
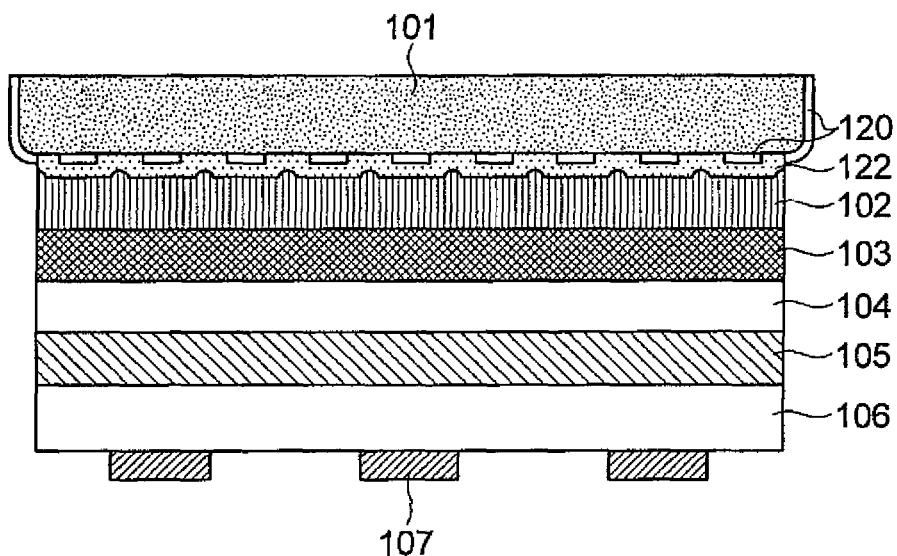
Figure 27:
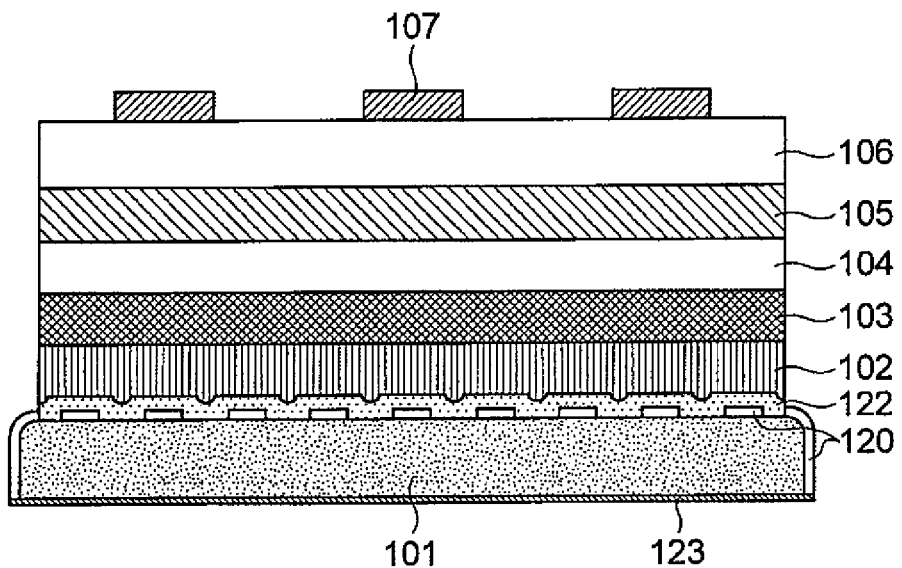

Thereafter, as shown in FIG. 26, a lapping process is performed to remove the lower surface of the Si—Al alloy substrate 101 including the protection layer 120 by a certain thickness. And then, as shown in FIG. 27, the contact metal layer 123 is formed on the lower surface of the Si—Al alloy substrate 101 exposed through the lapping process.

Figure 28:
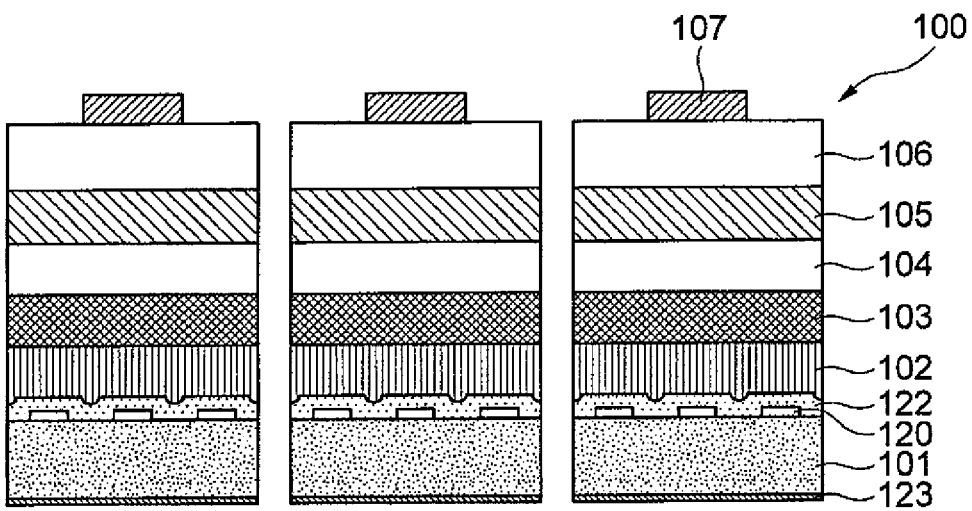

And then, as shown in FIG. 28, the n-type semiconductor layer 106, the active layer 105, the p-type semiconductor layer 104, the reflective metal layer 103, the bonding metal layer 102, the conductive layer 122, the protection layer 120, the Si—Al alloy substrate 101, and the contact metal layer 123 between the n-type electrodes 107 are diced so as to be separated by the chips. Accordingly, the light emitting device 100, according to the second exemplary embodiment of the present invention, can be obtained.

Figure 29:
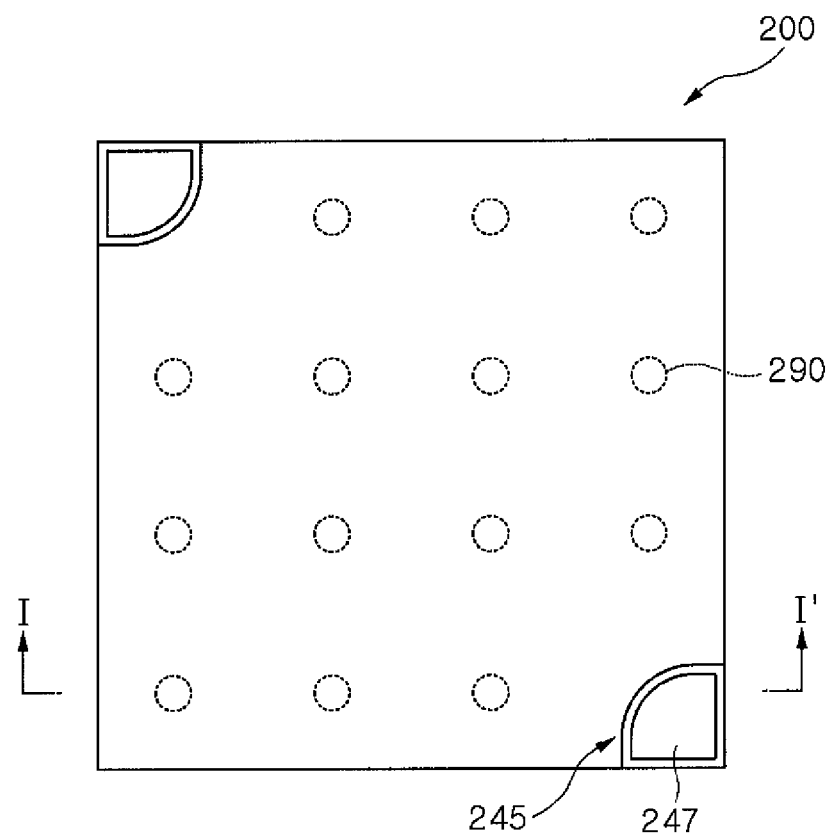
FIGS. 29 and 30 are a plan view and a sectional view of a light emitting device with a vertical and horizontal structure according to a third exemplary embodiment of the present invention.
Figure 30:
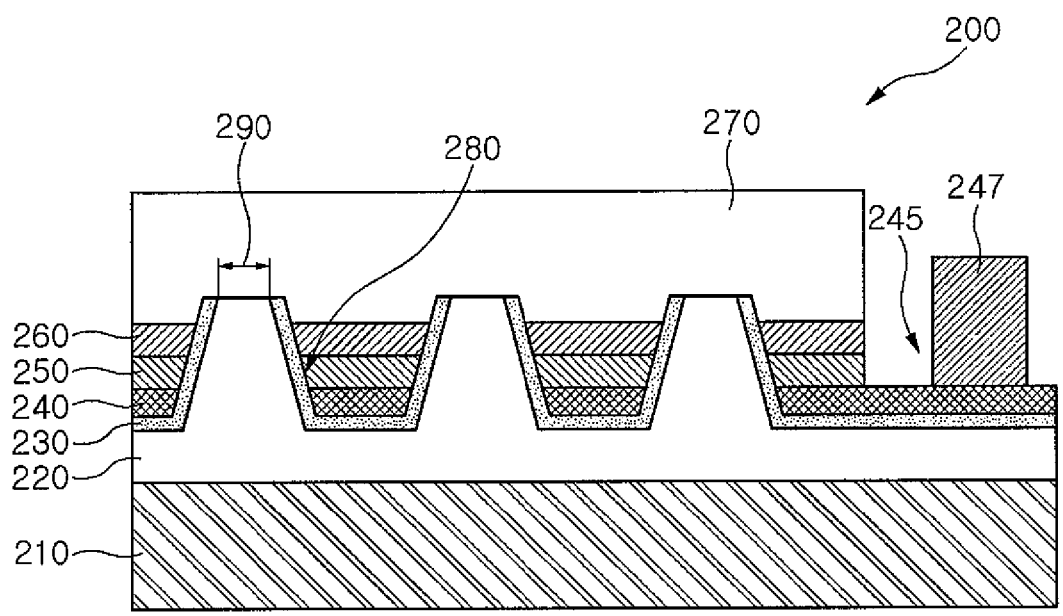

Meanwhile, unlike the light emitting device having the vertical structure according to the first and second exemplary embodiments of the present invention, the electrode disposition structure may be altered to accomplish a light emitting device with a vertical and horizontal structure available for a high current operation. FIGS. 29 and 30 are a plan view and a cross-sectional view of a light emitting device with a vertical and horizontal structure according to a third exemplary embodiment of the present invention. FIG. 30 is a cross-sectional view taken along line I-I' of FIG. 29.

With reference to FIGS. 29 and 30, a light emitting device 200, according to the third exemplary embodiment of the present invention, includes a conductive substrate 210, a first electrode layer 220, an insulating layer 230, a second electrode layer 240, a second semiconductor layer 250, an active layer 260, and a first semiconductor layer 270. The respective layers are sequentially stacked.

The conductive substrate 210 may be made of a material allowing electricity to flow thereacross. For example, the conductive substrate 210 may be a metal substrate including any one of Au, Ni, Cu, and W, or may be a semiconductor substrate including any one of Si, Ge, and GaAs. The first electrode layer 220 is stacked on the conductive substrate 210. Because the first electrode layer 220 is electrically connected with the conductive substrate 210 and the active layer 260, it may be made of a material that can minimize contact resistance with the conductive substrate 210 and the active layer 260.

The first electrode layer 220 is stacked on the conductive substrate 210. As illustrated in FIG. 30, portions of the first electrode layer 220 penetrate the insulating layer 230, the second electrode layer 240, the second semiconductor layer 250, and the active layer 260, and further extend through a contact hole 280 penetrating into a certain region of the first semiconductor layer 270 so as to electronically connect the first semiconductor layer 270 and the conductive substrate 210. The first electrode layer 220 electrically connects the conductive substrate 210 and the first semiconductor layer 270 via the contact hole 280. In this case, namely, the conductive substrate 210 and the first semiconductor layer 270 are electrically connected through the size of the contact hole 280, specifically, through a contact area 290, the area where the first electrode layer 220 and the first semiconductor layer 270 are in contact with each other through the contact hole 280.

Meanwhile, the insulating layer 230 is provided on the first electrode layer 220 in order to allow the first electrode layer 220 to be electrically insulated from layers other than the conductive substrate 210 and the first semiconductor layer 270. Namely, the insulating layer 230 is provided between the sides of the second electrode layer 240, the second semiconductor layer 250, and the active layer 260 exposed by the contact hole 280 and the first electrode layer 220 as well as between the first electrode layer 220 and the second electrode layer 240. In addition, preferably, the insulating layer 230 is also provided at the sides of certain regions of the first semiconductor layer 270 which the contact hole 280 penetrates.

The second electrode layer 240 is provided on the insulating layer 230. Of course, as mentioned above, the second electrode layer 240 is not present on certain regions where the contact hole 280 penetrates. In this case, as shown in FIG. 30, the second electrode layer 240 includes at least one exposed region 245, namely, an exposed region of the interface area between the second semiconductor layer 250 and the second electrode layer 240. An electrode pad part 247 may be formed on the exposed region 245 in order to connect an external power source to the second electrode layer 240. Meanwhile, the second semiconductor layer 250, the active layer 260, and the first semiconductor layer 270 (to be described) are not provided on the exposed region 245. Also, as shown in FIG. 29, preferably, the exposed region 245 is formed at the corner of the semiconductor light emitting device 200 in order to maximize a light emission area of the semiconductor light emitting device 200. Preferably, the second electrode layer 240 includes one of Ag, Al, and Pt. This is because it would be preferable for the second electrode layer 240 to have the characteristics of minimizing the contact resistance of the second semiconductor layer 250 and enhancing luminous efficiency by reflecting light generated from the active layer 260 to the outside since the second electrode layer 240 is electrically in contact with the second semiconductor layer 250.

The second semiconductor layer 250 is provided on the second electrode layer 240, the active layer 260 is provided on the second semiconductor layer 250, and the first semiconductor layer 270 is provided on the active layer 260. In this case, preferably, the first semiconductor layer 270 is an n-type nitride semiconductor layer, and the second semiconductor layer 250 is a p-type nitride semiconductor layer. The active layer 260 may be made of a different material according to the materials used to form the first and second semiconductor layers 270 and 250. Namely, because the active layer 260 converts energy resulting from electron-hole recombination into light to emit it, so preferably, the active layer 260 is made of a material having a smaller energy band gap than that of the first and second semiconductor layers 270 and 250.

A light emitting device according to a fourth exemplary embodiment of the present invention is a modification of the structure of the light emitting device according to the third exemplary embodiment of the present invention. That is, in the light emitting device according to the fourth exemplary embodiment of the present invention, the first electrode layer connected with the contact hole is exposed.

Figure 31:
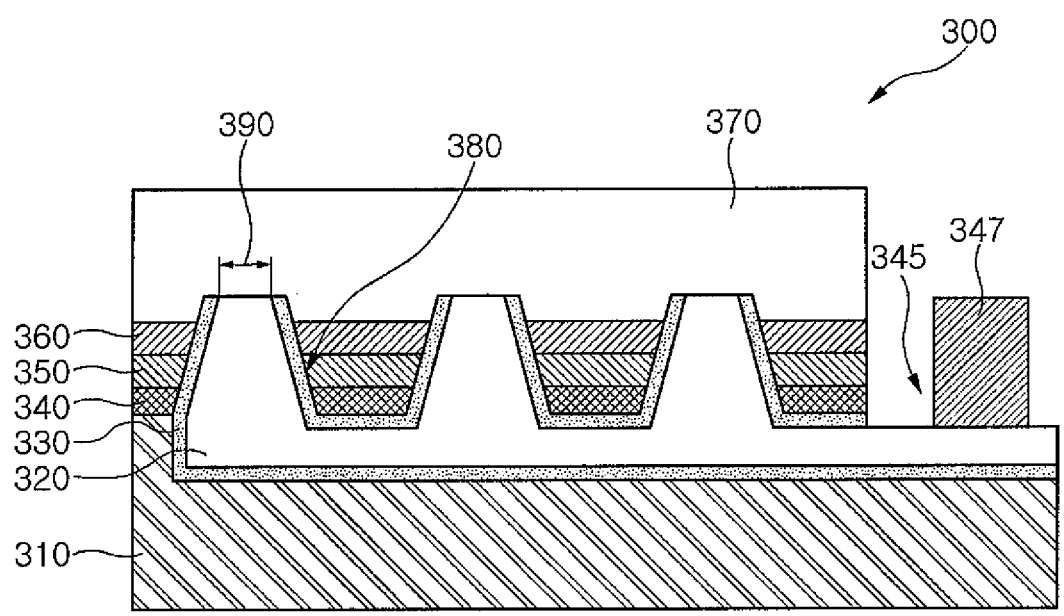
FIG. 31 is a sectional view of a light emitting device with a vertical and horizontal structure according to a fourth exemplary embodiment of the present invention.

FIG. 31 is a sectional view of a light emitting device with a vertical and horizontal structure according to a fourth exemplary embodiment of the present invention. A light emitting device 300 according to the fourth exemplary embodiment of the present invention includes a second semiconductor layer 350, an active layer 360, and a first semiconductor layer 370 formed on a conductive substrate 310. In this case, a second electrode layer 340 may be disposed between the second semiconductor layer 350 and the conductive substrate 310. However, unlike the former exemplary embodiment, the second electrode layer 340 is not essential. In the present exemplary embodiment, a contact hole 380 having a contact area 390 in contact with the first semiconductor layer 370 is connected with a first electrode layer 320, and the first electrode layer 320 is exposed to have an electrical connection part 345. An electrode pad part 347 may be formed on the electrical connection part 345. The first electrode layer may be electrically separated from the active layer 360, the second semiconductor layer 350, the second electrode layer 340, and the conductive substrate 310 by an insulating layer 330. Unlike the light emitting device 200 according to the third exemplary embodiment of the present invention in which the contact hole is connected with the conductive substrate, in the light emitting device 300 according to the fourth exemplary embodiment of the present invention, the contact hole 380 is electrically separated from the conducive substrate 310, and the first electrode layer 320 connected with the contact hole 380 is exposed. Accordingly, the conductive substrate 310 is electrically connected with the second semiconductor layer 340 to have a different polarity from that in the light emitting device according to the third exemplary embodiment of the present invention.

Accordingly, in the vertical and horizontal light emitting device, a portion of the first electrode may be disposed on a light emission surface and the other remaining portion may be disposed below the active layer 360 in order to secure an emission area at its maximum level. In addition, the electrode is uniformly disposed on the light emission surface, so that even when a high operational current is applied to the electrode, the current can be uniformly distributed, thus reducing a current concentration phenomenon in the high current operation.

The light emitting devices according to the first to fourth exemplary embodiments of the present invention may include a wavelength conversion unit covering the outer surfaces of the light emitting devices, providing chip-coated light emitting devices.

Figure 32:
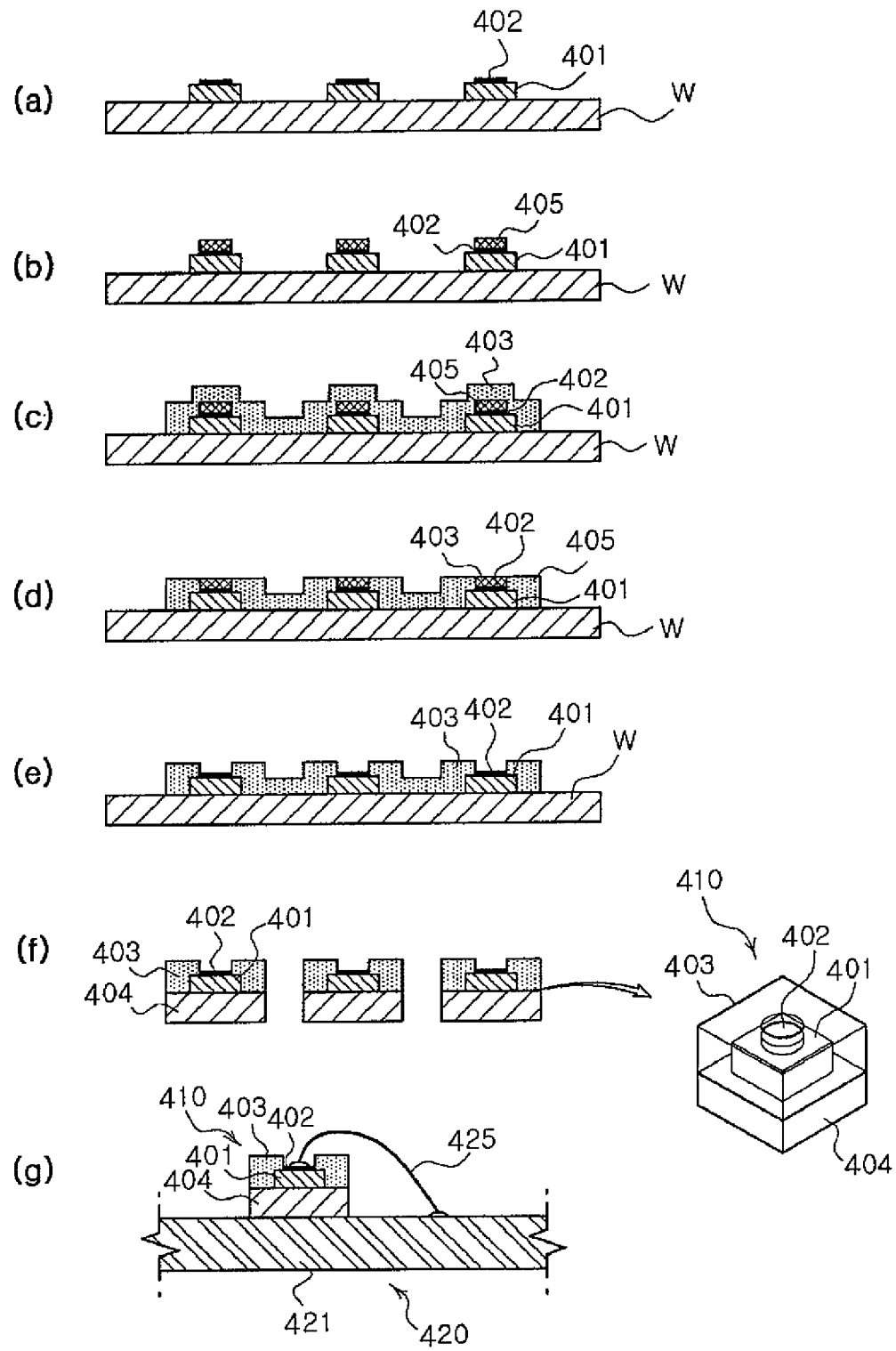
FIGS. 32(a) to (g) are sequential sectional views showing the process of a method for manufacturing light emitting devices according to fifth exemplary embodiments of the present invention.
Figure 33:
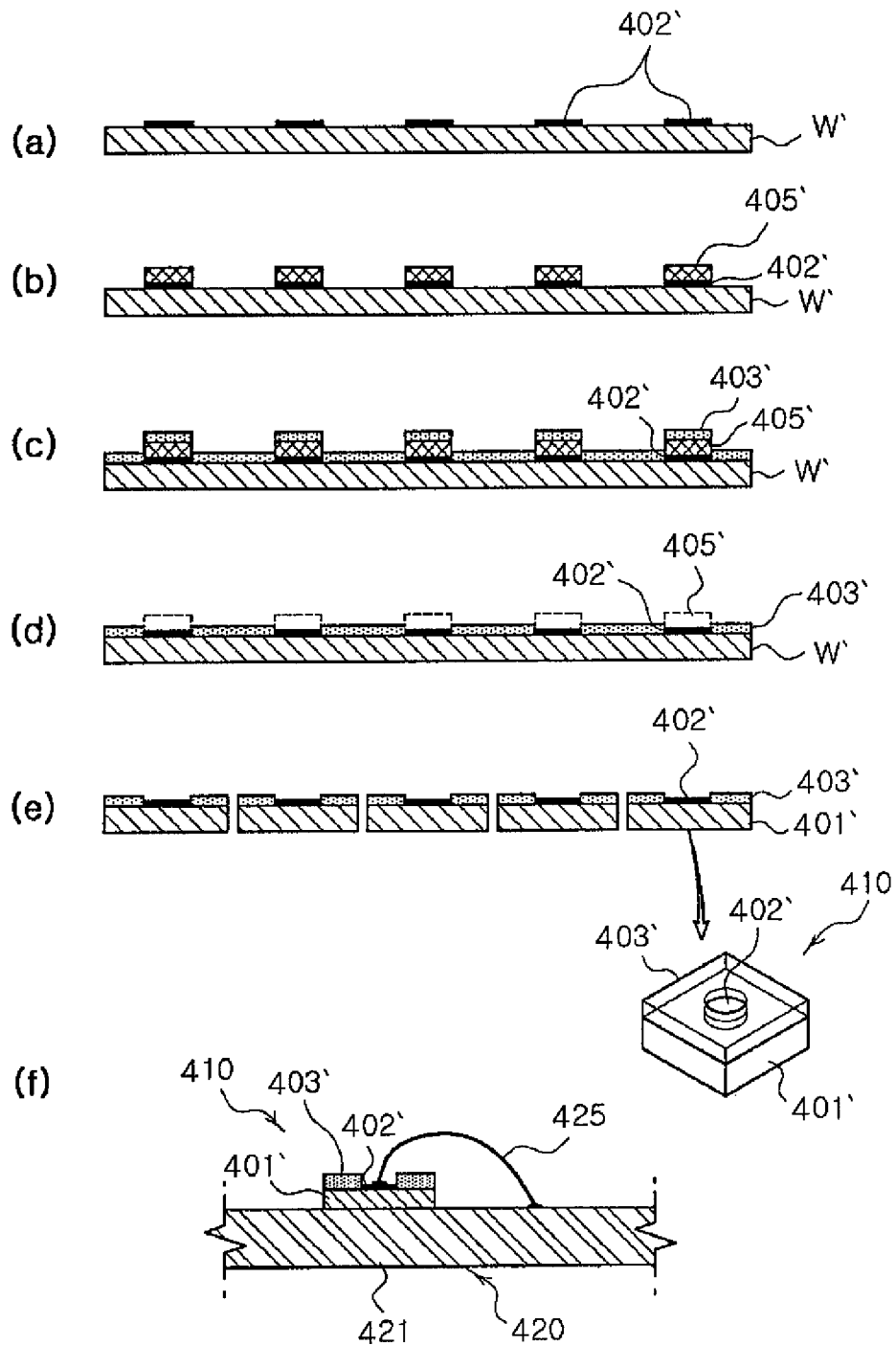
FIGS. 33(a) to (f) are sequential sectional views showing the process of a method for manufacturing light emitting devices according to sixth exemplary embodiments of the present invention.

FIGS. 32 and 33 are sequential sectional views showing the process of a method for manufacturing light emitting devices according to the fifth and sixth exemplary embodiments of the present invention.

First, with reference to FIG. 32, a bonding pad 402 electrically connected with a bonding wire 425 is formed on an upper surface of a light emitting device 410. One or two bonding pads 402 may be provided according to the structure of a horizontal or vertical chip die 401. Namely, the number of bonding pads 402 to be formed varies depending on the structure of the chip die 401. When the chip die 401 has a vertical structure or a vertical and horizontal structure in which P and N poles are respectively formed on upper and lower surfaces of the chip die 401, the bonding pad 402 is solely provided so as to be electrically connected with the P pole formed on the upper surface of the chip die 401.

Also, when the chip die 401 has a horizontal structure or a vertical and horizontal structure in which both P and N poles are formed on the upper surface of the chip die 401, two bonding pads are provided to be respectively electrically connected with the P and N poles formed on the upper surface of the chip die 401. A wavelength conversion part 403 is formed by mixing phosphors in a transparent resin material such as epoxy, silicon, or the like, to cover an external surface of the chip die 401 attached to a sub-mount 404. In this case, the wavelength conversion part 403 is formed by printing the phosphor-mixed transparent resin such as silicon, epoxy, or the like, with a certain thickness. The wavelength conversion part 403 may be formed to cover the entire chip die 401 and hardened by artificially provided heat or UV light.

Here, the wavelength conversion part 403 contains a fluorescent material (phosphor), one of YAG, TAG, and silicate-based wavelength conversion means for converting light generated from the chip die 401 into white light. In particular, a red phosphor includes the inorganic compound represented by the empirical formula $(Sr, M)_2SiO_{4-x}N_y$:Eu synthesized in the exemplary embodiments 1 to 11 of the present invention, where M is at least one of a monovalent and divalent element, $0<x<4$, and $y=2x/3$. A lead frame 420 is electrically connected with at least one bonding pad 402 exposed from the upper surface of the wavelength conversion part 403 by the medium of the bonding wire 425.

Next, with reference to FIG. 33, a light emitting device according to the sixth exemplary embodiment of the present invention includes a wavelength conversion part 403' formed only on an upper surface of a chip die 401'.

Accordingly, as shown in FIG. 32(g), a light emitting device package according to a second exemplary form of the present invention may include a lead frame 421 integrally formed at an inner side of a package body (not shown), a resin structure injection-molded with a resin material, and the metal wire 425 having one end wire-bonded with the bonding pad 402 of the light emitting device 410 according to the fifth exemplary embodiment of the present invention and the other end wire-bonded with the lead frame 421. Also, as shown in FIG. 33(f), a light emitting device package according to a third exemplary form of the present invention is formed such that a light emitting device 410', according to the sixth exemplary embodiment of the present invention, is mounted on the upper surface of the lead frame 421 having a cathode lead and an anode lead, the lead frame 421 is integrally provided in the package body (not shown) injection-molded with a resin material to form a cavity which is open to an upper side, and the light emitting chip 410' is electrically connected with the lead frame 421 by the medium of the metal wire 425 having one end bonded to the bonding pad 402'.

When a light emitting device with the vertical light structure or the vertical and horizontal structure is employed for a high output light emitting device package, the phosphor layer is directly in contact with a light emission surface in the vertical light emitting device or in the vertical and horizontal light emitting device, resulting in the degradation of the phosphor due to heat generated from the light emitting device. However, the nitride-based red phosphor according to an exemplary embodiment of the present invention is chemically stable, compared with the related art sulfide-based phosphor, so that it is highly reliable when exposed to external environmental conditions such as heat or moisture and has little possibility of discoloration. Thus, the red phosphor according to an exemplary embodiment of the present invention allows the wavelength conversion part to be directly formed on the light emission surface of the light emitting device, and accordingly, a high output/high reliability white light emitting device package can be manufactured.

Figure 34:
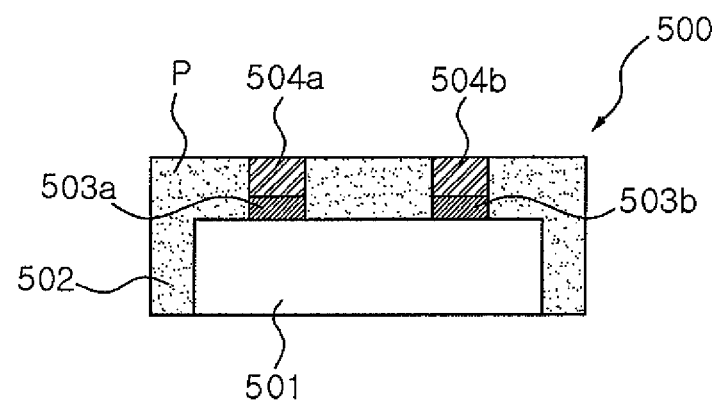
FIG. 34 is a sectional view schematically showing a light emitting device according to a seventh exemplary embodiment of the present invention.

FIG. 34 is a sectional view schematically showing a light emitting device according to a seventh exemplary embodiment of the present invention. With reference to FIG. 34, a light emitting device 500 according to the seventh exemplary embodiment of the present invention includes an LED chip 501 and a wavelength conversion part 502 formed to cover the surface of the LED chip 501 and converting the wavelength of light emitted from the LED chip 501. To this end, the wavelength conversion part 502 may employ a structure in which the phosphor (P) is distributed within a transparent resin part. The light emitting element 500 can emit white light as light converted by the wavelength conversion part 502 and light emitted from the LED chip 501 are mixed. The LED chip 501 may have the structure in which an n-type semiconductor layer, a light emission layer, and a p-type semiconductor layer are stacked, and first and second electrodes 503a and 503b are formed on one surface of the LED chip 501.

As shown in FIG. 34, when the surface of the LED chip 501 on which the first and second electrodes 503a and 503b are formed is a first surface, the opposing surface of the first surface is a second surface, and a surface positioned between the first and second surfaces is defined as a side surface, the wavelength conversion part 502 may be formed to cover the first surface (the electrodes-formed surface) and the side surface of the LED chip 501. This is intended to allow light from the LED chip 501 to be emitted in an upward direction and in a lateral direction based on FIG. 34. In the seventh exemplary embodiment of the present invention, the wavelength conversion part 502 is configured to be thinly coated along the surface of the LED chip 501, and overall uniform light can be obtained, compared with a method in which phosphor is injected into a cup of a package body. Also, the device size can be reduced such that the wavelength conversion part 502 is directly applied to the surface of the LED chip 501 without separately or additionally forming a package body.

For a structure of an electrical connection of the LED chip, in the present exemplary embodiment, first and second electricity connection parts 504a and 504b having a plated layer are used instead of a lead frame. In detail, the first and second electricity connection parts 504a and 504b are formed to be connected with the first and second electrodes 503a and 503b, and include a plated layer, respectively. The first and second electricity connection parts 504a and 504b are exposed through the wavelength conversion part 502 and provided as an area for a wire bonding or the like. In this manner, the light emitting element 500 has a simplified structure compared with the conventional package and can be variably employed for a light emitting apparatus such as a COB (Chip On Board), a package form, or the like.

Figure 35:
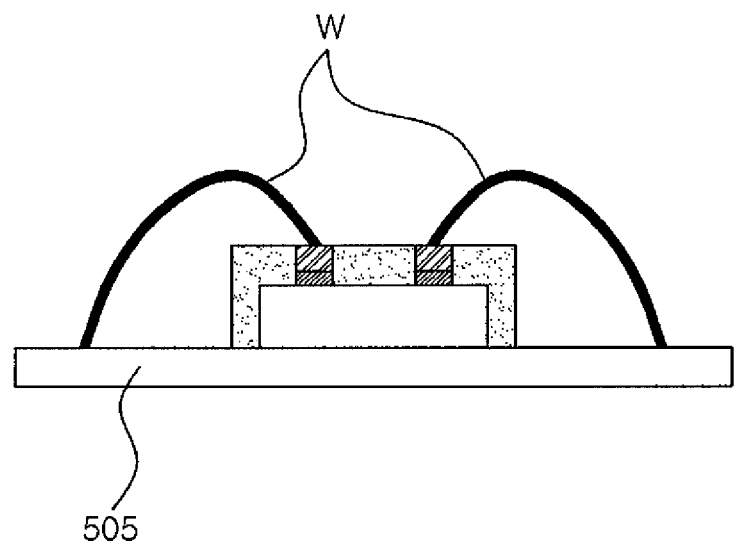
FIG. 35 is a sectional view schematically showing a light emitting device package in a fourth exemplary form using the light emitting device of the seventh exemplary embodiment of the present invention.

FIG. 35 is a sectional view schematically showing a light emitting device package in an exemplary form using the light emitting device of the seventh exemplary embodiment of the present invention in FIG. 34. The light emitting device package in the fourth exemplary form illustrated in FIG. 35 can be implemented by mounting the light emitting device according to the seventh exemplary embodiment of the present invention as described above on a substrate 505. In this case, reference numeral denoting the light emitting device is omitted in FIG. 35. As the substrate 505, a circuit board with a circuit pattern formed on an insulating base material may be used, and wires (W) are formed to connect the light emitting device and the circuit pattern. As described above, since light is emitted through the first surface and the side surface of the light emitting device, he light emitting device is mounted in a way that the second surface of the LED chip faces the substrate 505. Although other mounting methods are not particularly described here, the light emitting device may be mounted on a lead frame so as to be used in a conventional package. Such packaging of the light emitting device removes the necessity of injecting a phosphor into the cup of the package body and obtains uniform color temperature with respect to the overall light emission direction.

Figure 36:
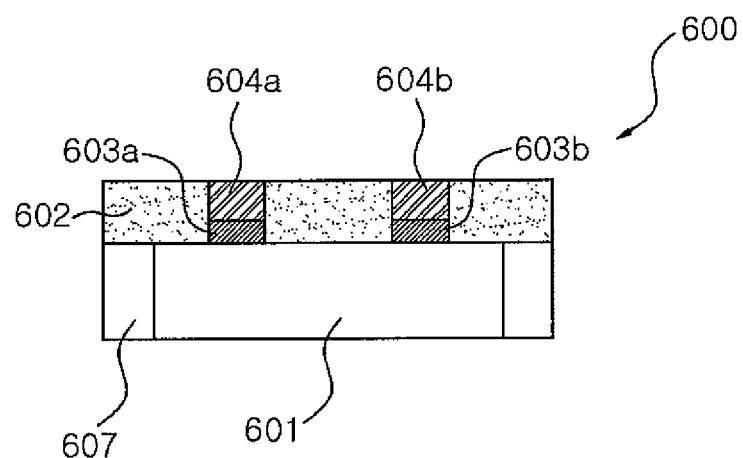
FIGS. 36 and 37 are sectional views schematically showing a light emitting device according to eighth and ninth exemplary embodiment of the present invention.
Figure 37:
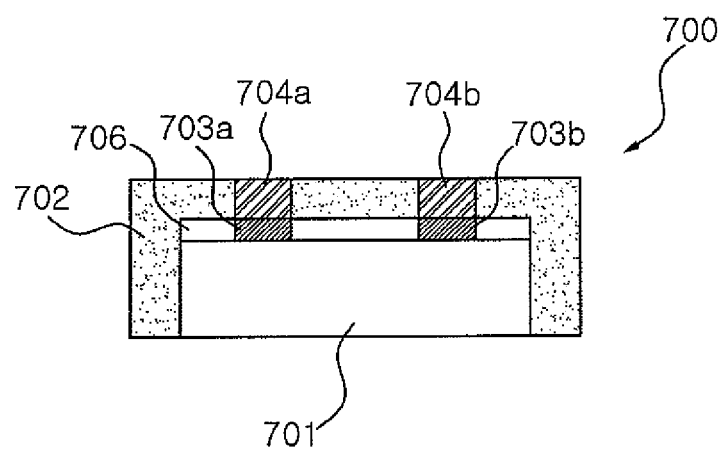

FIGS. 36 and 37 are sectional views schematically showing a light emitting device according to eighth and ninth exemplary embodiment of the present invention. First, with reference to FIG. 36, as in the seventh exemplary embodiment of the present invention, a light emitting device 600 according to an eighth exemplary embodiment of the present invention includes an LED chip 601 having first and second electrodes 603a and 603b, a wavelength conversion part 602, and first and second electrical connection parts 604a and 604b. The difference of the light emitting device 600 from the structure of the light emitting device 500 illustrated in FIG. 34 is that a resin part 607 provided at the side of the LED chip 601 is formed of a transparent resin without a phosphor. This is because light emitted to the side of the LED chip 601 has a lower intensity compared to the light emitted to the first surface.

As like in the seventh exemplary embodiment of the present invention, a light emitting device 700 illustrated in FIG. 37 includes an LED chip 701 having first and second electrodes 703a and 703b, a wavelength conversion part 702, and first and second electricity connection parts 704a and 704b. The difference of the light emitting device 700 from the structure of the light emitting device 500 illustrated in FIG. 34 is that an underfill resin part 706, positioned on the first surface of the LED chip 701 and provided at an area covering the sides of the first and second electrodes 703a and 703b, is formed of a transparent resin without a phosphor.

The structure of the wavelength conversion part, in which a phosphor layer is stacked in a multi-layered form on a UV LED chip or on a blue LED chip according to various exemplary embodiments of the present invention, will now be described with reference to FIGS. 38 to 41.

Figure 38:
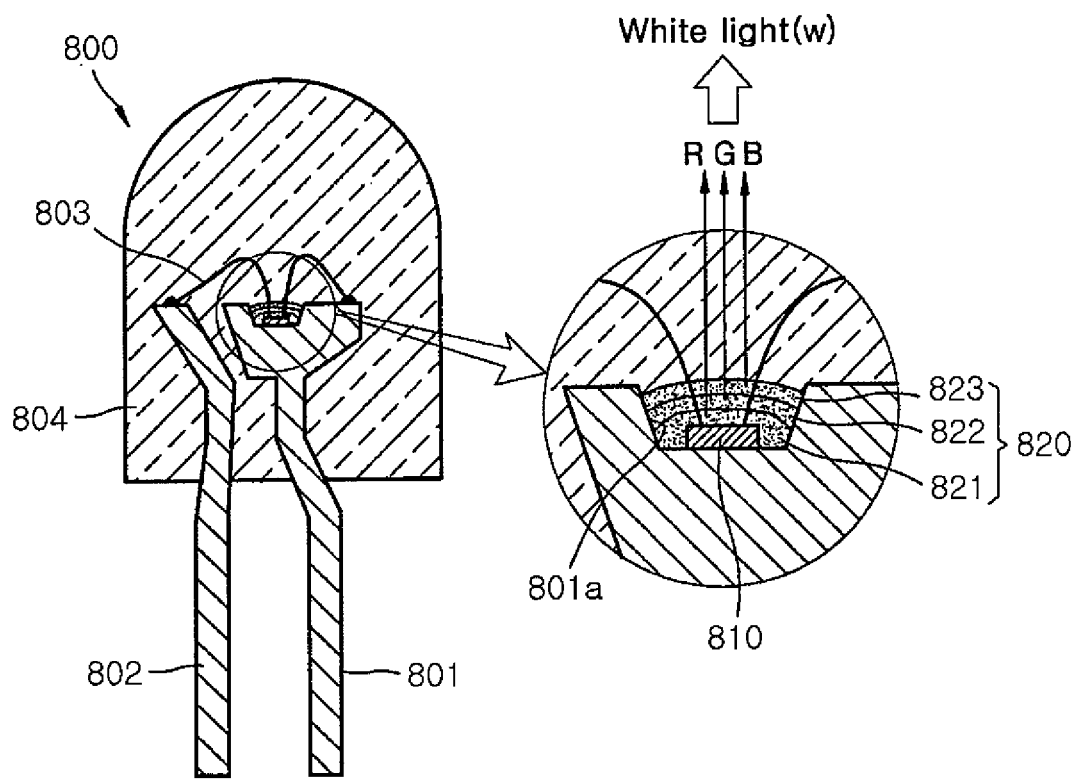
FIGS. 38 and 39 are sectional views showing the structure of a light emitting device package implemented in the form of a lamp and chip according to fifth and sixth exemplary forms of the present invention.
Figure 39:
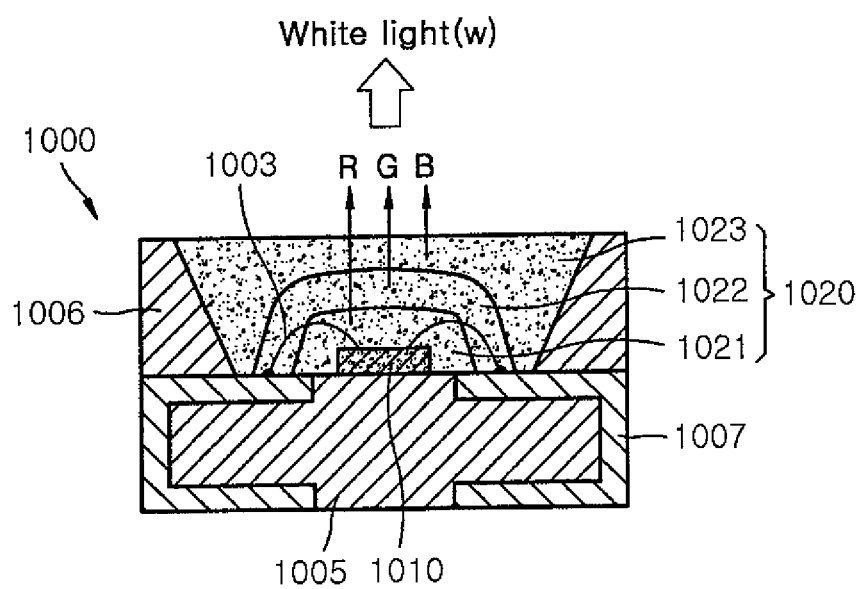

First, FIGS. 38 and 39 are sectional views showing the structure of a light emitting device package implemented in the form of a lamp and chip according to second and third exemplary embodiments of the present invention.

As shown in FIG. 38, in the light emitting device package implemented in the form of a lamp according to a fifth exemplary embodiment of the present invention, a UV LED chip 810 having a wavelength of approximately 410 nm or less may be covered by a multi-layered phosphor layer 820 including first to third phosphor layers 821, 822, and 823 containing three types of phosphors, each being excited by ultraviolet rays to emit light in a different color.

As shown in FIG. 39, in a light emitting device package implemented in the form of a chip according to the sixth exemplary form of the present invention, a UV LED chip 1010 is installed within a recess of a casing 1006 on a substrate 1005. First to third phosphor layers 1021, 1022, and 1023 containing three types of phosphors are formed within the recess of the casing 1006, which constitute a multi-layered phosphor layer 1020 covering the UV LED chip 1010. An n electrode and a p electrode of the UV LED chip 1010 are electrically connected with a metal wire 1007 formed on the substrate 1005 by a wire 1003.

In detail, the first phosphor layer 1021 is formed on the UV LED chip 1010 and may be formed by mixing a phosphor emitting red light (R) and a resin. As the phosphor emitting red light (R), a phosphor (or a fluorescent material) which is excited by ultraviolet rays to emit light having an emission peak ranging from about 600 nm to about 700 nm, namely, the phosphor including an inorganic compound represented by the empirical formula $(Sr, M)_2SiO_{4-x}N_y:Eu$ synthesized according to the present invention, where M is at least one of a monovalent and divalent element, $0<x<4$, and $y=2x/3$, may be used.

The second phosphor 1022 is stacked on the first phosphor layer 1021 and may be formed by mixing a phosphor emitting green light (G) and a resin. As the phosphor emitting green light, a phosphor excited by ultraviolet rays to emit light having a wavelength ranging from about 500 nm to about 550 nm may be used. The third phosphor layer 1023 is stacked on the second phosphor layer 1022 and may be formed by mixing a phosphor emitting blue light (B) and a resin. As the phosphor emitting blue light, a phosphor excited by ultraviolet rays to emit light having a wavelength ranging from about 420 nm to about 480 nm.

The ultraviolet light emitted from the UV LED chip excites the phosphors contained in the first to third phosphor layers 1021 to 1023. Accordingly, red light (R), green light (G), and blue light (B) are emitted from the first to third phosphor layers 1021 to 1023, respectively, and light beams of the three respective colors are combined to form white light (W).

In particular, the phosphor layer for converting ultraviolet light may be formed of multiple layers, where the phosphor layer emitting light of the longest wavelength is first stacked on the UV LED chip, and additional phosphor layers are sequentially stacked from longer wave length to shorter wave length based on their emitting light wave length. Depending on needs, the multiple layers can be made of two, three, four or more layers. For example, in this embodiment, three phosphor layers of red, green, and blue are used and the three layers are stacked in the order of red, green and blue. In this manner, because the first phosphor layer containing a phosphor emitting red light (R) having the lowest light conversion efficiency is positioned to be closest to the UV LED chip, the light conversion efficiency at the first phosphor layer can be relatively increased to lead to an enhancement of the overall light conversion efficiency of the LED chip.

Figure 40:
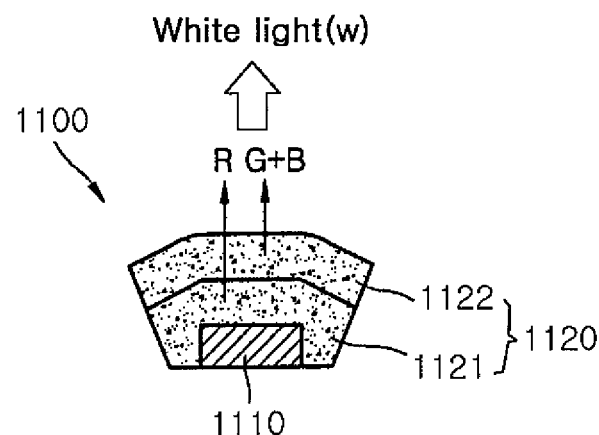
FIGS. 40 and 41 illustrate partial structures of a light emitting device package according to seventh and eighth exemplary forms of the present invention.
Figure 41:
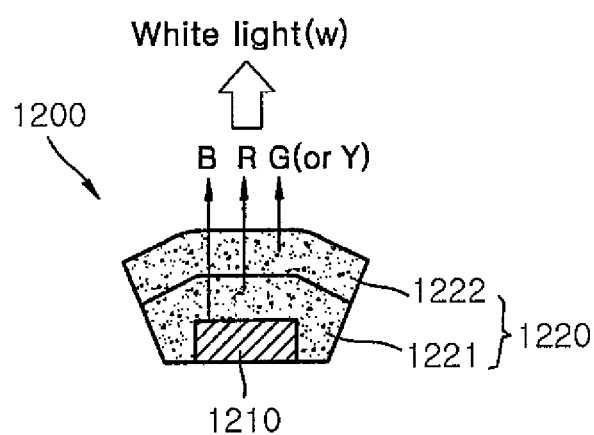

FIGS. 40 and 41 illustrate partial structures of a light emitting device package according to seventh and eighth exemplary forms of the present invention. These drawings illustrate only the structures of an LED chip and a multi-layered phosphor layer, and the other configurations are the same as those of FIGS. 38 and 39. Namely, the light emitting device package according to the seventh and eighth exemplary forms of the present invention may be implemented in the form of a lamp or chip.

The light emitting device package 1100, according to the seventh exemplary form illustrated in FIG. 40, includes a multi-layered phosphor 1120 formed to cover a UV LED chip 1110 having a wavelength of 410 nm or lower, and in this case, the multi-layered phosphor layer 1120 is formed as a two-layered phosphor layer. In detail, a phosphor layer 1121 formed on the UV LED chip 1110 is formed by mixing a phosphor emitting red light (R) and a resin. In this case, as the phosphor emitting red light (R), a phosphor (or a fluorescent material), which is excited by ultraviolet rays to emit light having an emission peak ranging from about 600 nm to about 700 nm, namely, the phosphor including an inorganic compound represented by the empirical formula $(Sr, M)_2SiO_{4-x}N_y$:Eu synthesized according to the present invention, where M is at least one of a monovalent and divalent element, $0<x<4$, and $y=2x/3$, is used. A second phosphor layer 1122 stacked on the first phosphor layer 1121 is formed by mixing a phosphor emitting green light (G) and a phosphor emitting blue light (B) together in a resin.

Through such a configuration, ultraviolet light emitted from the UV LED chip excites the phosphor contained in the first phosphor layer 1121 to emit red light (R) and excites the two types of phosphors mixed in the second phosphor layer 1122 to emit green light (G) and blue light (B). As the light of the three respective colors are combined, white light (W) is seen by human eyes. In this embodiment, the phosphor layer for converting ultraviolet light is made of two layers, where a phosphor emitting the longest wave length light is stacked first and a mixture of the other phosphors emitting shorter wave length light is then stacked either directly on or above the first layer. With this stacking structure of the multi-layered phosphor layer, an improved light conversion efficiency can be obtained.

A light emitting device package 1200, according to the eighth exemplary form of the present invention as illustrated in FIG. 41, has a multi-layered phosphor layer 1220, which is made of two layers and cover an LD chip 1210 emitting blue light (B) having a peak emission wavelength ranging from about 420 nm to about 480 nm. In this case, a first phosphor layer 1221 is formed by mixing a phosphor emitting red light (R) and a resin on the LED chip 1210. The phosphor emitting red light (R) is a phosphor (or a fluorescent material) which is excited by blue light to emit light having an emission peak ranging from 600 nm to 700 nm, namely, the phosphor including an inorganic compound represented by the empirical formula $(Sr, M)_2SiO_{4-x}N_y$:Eu synthesized according to the present invention, where M is at least one of a monovalent and divalent element, $0<x<4$, and $y=2x/3$. A second phosphor layer 1222 is formed by mixing a phosphor emitting green light (G) or yellow light (Y) in a resin and is stacked on the first phosphor layer 1221.

Through such a configuration, blue light (B) emitted from the LED chip excites the phosphor contained in the first phosphor layer 1221 to emit red light (R) and excites the phosphor contained in the second phosphor layer 1222 to emit green light (G) or yellow light (Y). In this manner, the red light (R) and green light (G) (or yellow light (Y)) emitted from the multi-layered phosphor layer and blue light (B) generated from the LED chip are combined to form white light (W).

Here, the white light emitting light emitting device package according to the eighth exemplary form of the present invention illustrated in FIG. 41 will be described in more detail.

Figure 42:
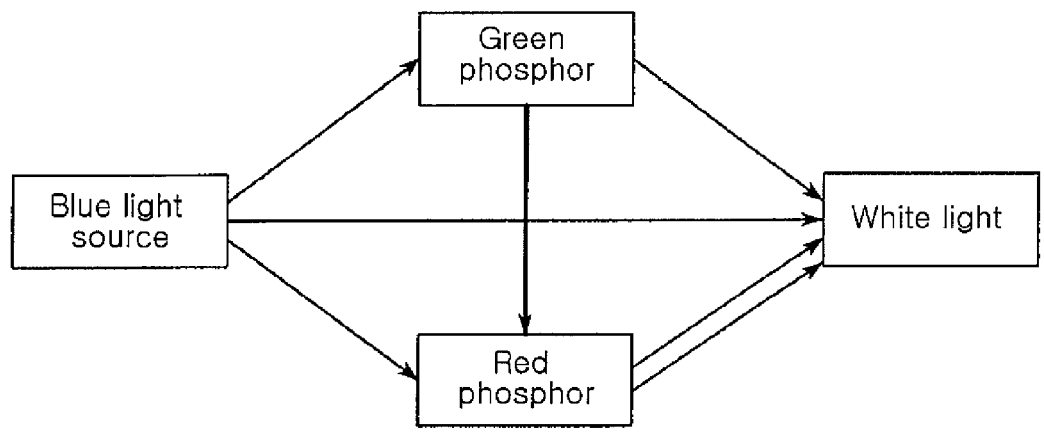
FIG. 42 is a conceptual view schematically illustrating the light emitting device package according to the eighth exemplary form of the present invention illustrated in FIG. 41.

FIG. 42 is a conceptual view schematically showing the light emitting device package according to the eighth exemplary form of the present invention illustrated in FIG. 41. With reference to FIG. 42, blue light is emitted from a blue light source. The blue light source has a peak emission wavelength ranging from about 420 nm to about 480 nm. In particular, the blue light source is a blue LED having a peak emission wavelength ranging from about 420 nm to about 480 nm. Green and red phosphors are excited by the blue light emitted from the blue light source to emit green and red visible light, respectively. The emitted green and red visible light is mixed with blue light (namely, the light emitted from the blue light source), which has transmitted through the phosphor, to output white light. A green phosphor may have a peak emission wavelength ranging from about 490 nm to about 550 nm. The red phosphor is a phosphor (or a fluorescent material) having an emission peak ranging from about 600 nm to about 700 nm, namely, the phosphor including an inorganic compound represented by the empirical formula $(Sr, M)_2SiO_{4-x}N_y$:Eu synthesized according to the present invention, where M is at least one of a monovalent and divalent element, $0<x<4$, and $y=2x/3$, is used. Preferably, the phosphors have a high quantum efficiency at a particular emission wavelength of the blue light source. Also, preferably, each phosphor has a considerable translucency over visible light emitted by the other phosphor. The red phosphor is excited by the light emitted by the green phosphor (green light), as well as excited by blue light emitted by the blue light source, to emit red light. Preferably, the red phosphor has a peak excitation wavelength ranging from about 420 nm to about 500 nm so as to be sufficiently effectively excited by blue light and green light. Also, because the red phosphor is excited by a broad spectrum of light including light emitted from the green phosphor as well as the blue light source (namely, the red phosphor is doubly excited), the quantum yield of the red phosphor can be improved, which leads to an improvement of overall luminous efficiency, luminance and color rendering index. In addition, green light emitted and discharged from the rear side of the output surface, which is left unused in the conventional devices, is used to excite the red phosphor and thus overall luminous efficiency can be further increased. Due to the increase in the quantum yield, the overall luminance and color rendering index of the white light emitting device is improved.

Figure 43:
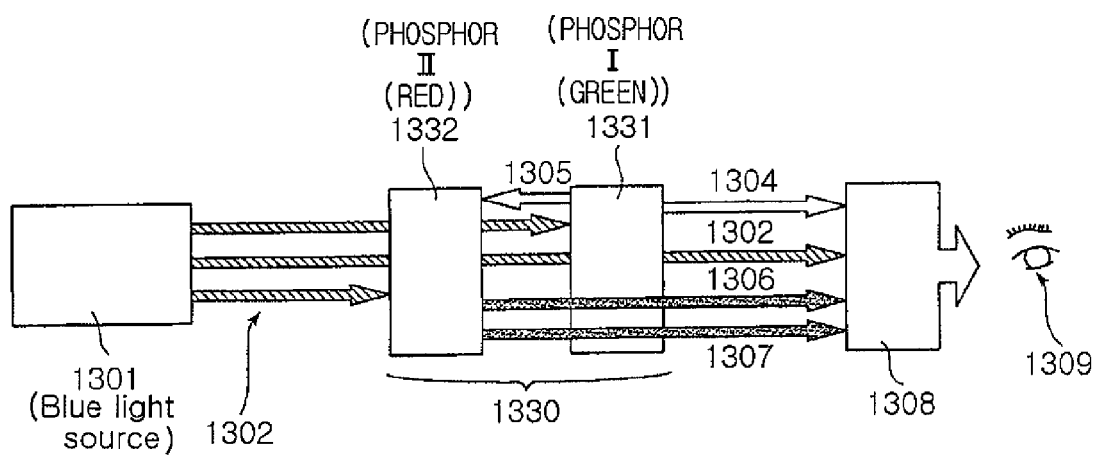
FIG. 43 is a schematic view for explaining in detail an operational principle of a light emitting device package according to the eighth exemplary embodiment of the present invention.

FIG. 43 is a schematic view for explaining an operational principle of the light emitting device package according to the eighth exemplary embodiment of the present invention in detail. With reference to FIG. 43, blue light 1302 is emitted by a blue light source 1301 such as a blue LED and made incident on phosphors 1330, namely, a first phosphor 1332 and second phosphor 1331. Preferably, the phosphors 1330 are formed to have structures separated from each other. This is because the use of phosphors of the separated layer structures is more suitable for effectively using light emitted from the rear side of the output surface than the use of a mixture of the phosphors.

The blue light 1302 emitted from the blue light source 1301 is detectable by the naked eyes and may have a wavelength, for example, ranging from about 420 nm to about 480 nm. Preferably, the blue light source 1301 is a blue LED having a peak emission wavelength ranging from about 420 nm to about 480 nm. After the second phosphor 1331 absorbs the blue light 1302, it emits green light 1304 and 1305 having a peak emission wavelength ranging from about 490 nm to about 550 nm. The first phosphor 1332 absorbs the blue light 1302 and the light (the green light 1305) emitted from the second phosphor 1331 and emits red light 1306 and 1307 having an emission peak ranging from about 600 nm to about 700 nm. In particular, when the first phosphor 1332 has a peak excitation wavelength ranging from about 420 nm to about 500 nm, it can effectively absorb the blue light 1302 and the green light 1305 The red light 1306 is emitted by the first phosphor 1332 according to the absorption of the light 1305 emitted from the second phosphor 1331. The red light 1307 is emitted by the first phosphor 1332 according to the absorption of the light 1302 emitted from the blue light source 1301. An observer 1309 perceives the combination of the green light 1304, the blue light 1302, and the red light beams 1306 and 1307 as white light 1308.

As described above, the first phosphor 1332 is doubly excited by the blue light source 1301 and the second phosphor 1331 to emit red light. Accordingly, the quantum yield of the red phosphor (the first phosphor 1332) is improved. Thus, the overall luminance of the light emitting device is increased and the color rendering index is enhanced. The second phosphor 1331 may be any phosphor so long as it can emit green light having a peak emission wavelength ranging from about 490 nm to about 550 nm in response to the light 1302 emitted from the blue light source 1301. When a blue LED having a peak emission wavelength ranging from about 420 nm to about 480 nm is used as the blue light source 1301, the second phosphor 1331 may be a phosphor having a high quantum efficiency over the light emitted from the blue LED (i.e., the blue light having a peak emission wavelength ranging from 420 nm to 480 nm) and a peak emission wavelength ranging from 490 nm to 550 nm may be used as.

The first phosphor 1332 is a phosphor emitting light having an emission peak ranging from about 600 nm to about 700 nm in response to the light 1302 emitted from the blue light source 1301 and the light 1305 emitted from the second phosphor 1331. The phosphor includes an inorganic compound represented by the empirical formula $(Sr, M)_2SiO_{4-x}N_y$:Eu synthesized according to the present invention, where M is at least one of a monovalent and divalent element, $0<x<4$, and $y=2x/3$. Preferably, the first phosphor 1332 may absorb the light emitted from the second phosphor 1331 having the peak emission wavelength ranging from about 490 nm to about 550 nm as well as the light emitted from the blue LED having the peak emission wavelength ranging from about 420 nm to about 480 nm to emit red light having an emission peak ranging from about 600 nm to about 700 nm. These phosphors may be double excited by the blue light 1302 and the green light 1305. Accordingly, the quantum yield of the red phosphor (i.e., the first phosphor 1332) can be increased, and the overall luminous efficiency, luminance, and color rendering index can be improved.

Figure 44:
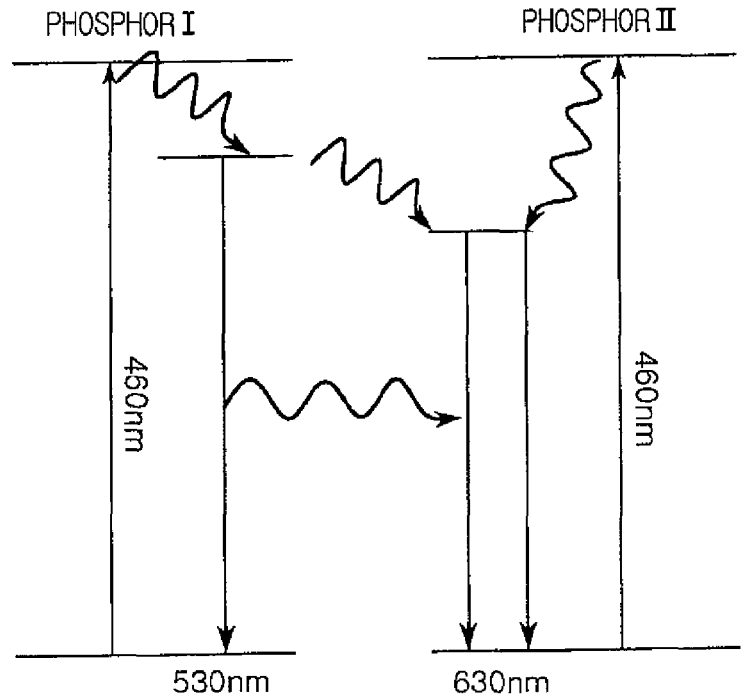
FIG. 44 is a schematic view showing an energy transfer between green phosphor (second phosphor) and red phosphor (first phosphor) used for the light emitting device package of the eighth exemplary form of the present invention.

FIG. 44 is a schematic view showing an energy transfer between the green phosphor (second phosphor) and the red phosphor (first phosphor) used for the light emitting device package of the eighth exemplary form of the present invention. With reference to FIG. 44, the second phosphor is excited by blue light of about 460 nm to emit green light of about 530 nm. Also, the first phosphor absorbs a portion of the light (the green light) emitted from the second phosphor as well as the blue light of about 460 nm to emit red light of about 620 nm. In this manner, the first phosphor is doubly excited so as to emit red light. Namely, the first phosphor layer 1332 is disposed at an upper portion of the blue light source 1301 such as the blue LED or other blue light source like, and the second phosphor layer 1331 is disposed at an upper portion of the first phosphor layer 1332. With such a structure, the light 1305 emitted from the rear side from the second phosphor 1331 is easily absorbed by the first phosphor 1332 to emit the red light 1306. Accordingly, the additional light 1306 emitted from the first phosphor 1332 further increases the overall luminance of the light emitting device and further improves the color rendering index. Also, the light 1305, which would otherwise be discharged from the rear side and wasted, can be effectively used by the first phosphor 1332. The disposition of the phosphors in the layered structure can be easily implemented by forming layers of a molded resin where each phosphor is distributed.

Figure 45:
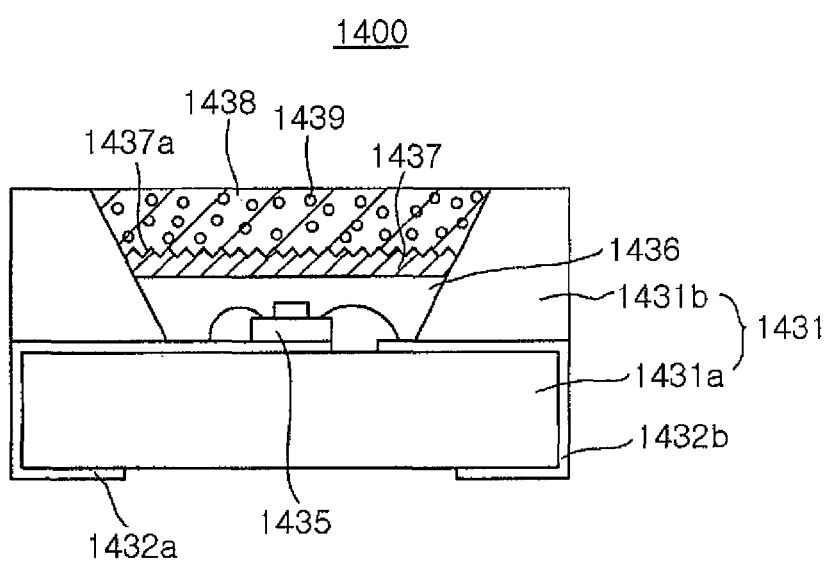
FIG. 45 is a sectional view showing a light emitting device package according to a ninth exemplary form of the present invention.

FIG. 45 is a sectional view showing a light emitting device package according to a ninth exemplary embodiment of the present invention. With reference to FIG. 45, a light emitting device package 1400 includes a package substrate 1431 and an LED chip 1435 mounted on the package substrate 1431. The package substrate 1431 may include a lower package substrate 1431a with two lead frames 1432a and 1432b formed thereon and an upper package substrate 1431b having a cavity. The LED chip 1435 is mounted in the cavity area. Anodes (not shown) of the LED chip 1435 are connected to upper ends of the lead frames 1432a and 1432b by wires, respectively.

A low refraction index area 1436 is provided to cover the LED chip 1435. The low refraction index area 1436 may be an empty space or may be an area filled with a transparent resin having a relatively low refraction index. When the low refraction index area 1436 is an empty space, it has a refraction index (n=1) similar to that of the atmosphere. Meanwhile, when the low refraction index area 1436 is formed with a transparent resin, a general epoxy, silicon, or a mixture thereof, may be used. In this case, the refraction index of the low refraction index area 1436 would vary depending on the material used, preferably about 1.7 or lower. However, the refractive index could be higher than 1.7 if the high refraction index layer has sufficiently high refraction index value.

A high refraction index layer 1437 is formed on the low refraction index area 1436. The high refraction index layer 1437 has at least a higher refraction index than that of the low refraction index layer 1436 and includes a pattern of protrusions and depressions (namely, an irregular pattern) 1437a formed on an upper surface thereof. A wavelength conversion layer 1438 including a phosphor 1439 for converting the wavelength of light emitted from the LED 1435 is formed on the high refraction index layer 1437. The wavelength conversion layer 1438 is a phosphor-contained resin layer and has a refraction index at least lower than that of the high refraction index layer 1437.

The wavelength conversion layer 1438 includes at least the red phosphor having an inorganic compound represented by the empirical formula $(Sr, M)_2SiO_{4-x}N_y$:Eu synthesized according to the present invention, where M is at least one of a monovalent and divalent element, $0<x<4$, and $y=2x/3$, and absorbing light emitted from the LED chip to emit light having an emission peak ranging from about 600 nm to about 700 nm.

The high refraction index layer 1437 employed in the present exemplary embodiment may be made of a resin having a high refraction index by itself or may be implemented as a general transparent resin layer containing high refraction index particles. In this case, the high refraction index particles may be selected from the group consisting of GaP, Si, $TiO_2$, $SrTiO_3$, SiC, cubic or amorphous carbon, carbon nano-tubes, AlGaInP, AlGaAs, SiN, SiON, ITO, SiGe, AlN, GaN, and mixtures thereof.

The high refraction index layer 1437 has a high refraction index so that photons diffused from the phosphor particles 1439 can be reflected by the interface with the low refraction index area 1436. Preferably, the high refraction index layer 1437 has a refraction index of about 1.8 or greater, but if the low refraction index area 1436 is made of a resin having a particular refraction index, the high refraction index layer 1437 may be made of a material having a sufficiently higher refraction index to make a significant difference in the refraction index from that of the particular resin.

Although the interface with the wavelength conversion layer 1438 has a relatively high light extraction threshold angle, light extraction to the wavelength conversion layer 1438 can be easily realized by the pattern of protrusions and depressions 1437a formed on the high refraction index layer 1437. Preferably, a formation interval of the protrusions and depressions 1437a may range from 0.001 μm to 500 μm. If the difference between the refraction index of the high refraction index layer 1437 and that of the wavelength conversion layer 1438 is too great, it might be difficult to realize sufficient light extraction by the protrusions and depressions 1437a. Thus, the refraction index of the high refraction index layer 1437 is preferably 10 or less.

Figure 46:
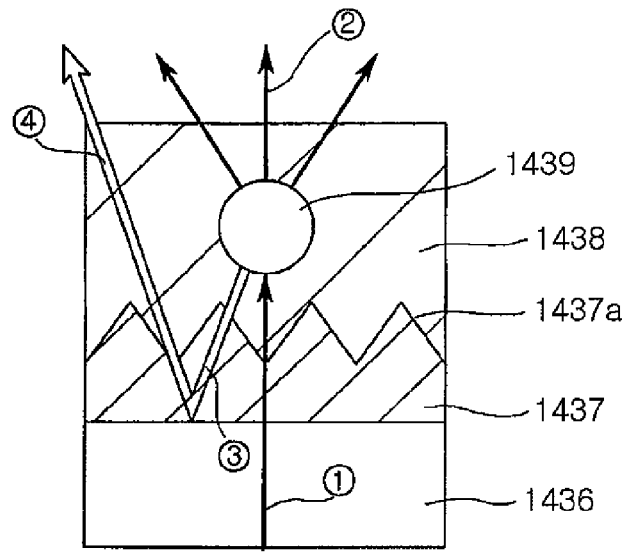
FIG. 46 is a schematic view for explaining a light extraction mechanism of the light emitting device package according to the ninth exemplary embodiment of the present invention illustrated in FIG. 45

FIG. 46 is a schematic view for explaining a light extraction mechanism of the light emitting device package according to the ninth exemplary embodiment of the present invention illustrated in FIG. 45. With reference to FIGS. 45 and 46, light (①) emitted from the LED chip 1435 passes through the low refraction index area 1436 and the high refraction index layer 1437 and proceeds to the wavelength conversion layer 1438. In general, the low refraction index area 1436 has a lower refraction index than nitride constituting the LED chip 1435. In this respect, however, owing to the presence of the pattern of the protrusions and depressions formed on the LED surface, light generated from the LED 1435 can be effectively extracted to the low refraction index area 1436. Also, light going toward the high refraction index layer 1437 from the low refraction index area 1436 proceeds with a high refraction index material, so it can be effectively extracted. The wavelength conversion layer 1438 has a lower refraction index than that of the high refraction index layer 1437, thus having a limited light extraction threshold angle, but light can be effectively extracted by virtue of the protrusions and depressions formed on the upper surface of the high refraction index layer 1437.

Subsequently, the light (①) emitted from the LED is excited at the phosphor particles 1439, and one portion (②) of the excited light can be extracted in a desired direction, e.g., toward the upper portion of the package. Meanwhile, another portion (③) of the excited light may proceed from the wavelength conversion layer 1438 to the high refraction index layer 1437 toward the interior of the package. Because the wavelength conversion layer 1438 has a lower refraction index than that of the high refraction index layer 1437, the light (③) that proceeds toward the interior of the package can enter the high refraction index layer 1437 substantially as it is without a loss. The light (③) that has entered the high refraction index layer 1437 is mostly reflected from the interface with the low refraction index area 1436 due to the high refraction index difference. The reflected light (④) proceeds to an upper portion of the high refraction index layer 1437 and passes through the interface between the high refraction index layer 1437 and the wavelength conversion layer 1438 so as to be extracted in a desired direction. As described above, the high refraction index layer 1437 and the wavelength conversion layer 1438 have a limited light extraction threshold angle at their interface due to the difference in their refraction indexes, but light can be easily extracted by virtue of the protrusions and depressions 1437a formed on the upper surface of the high refraction index layer 1437.

In this manner, the light (③) proceeding to the interior of the package after being diffused by the phosphor particles 1439 can be effectively reflected in the desired upward direction by the high refraction index layer 1437 with the protrusions and depressions 1437a formed thereon and the low refraction index area 1436.

In the present exemplary embodiment, because the wavelength conversion layer containing phosphor particles is disposed at the upper portion and the optical structure including the high refraction index layer with the protrusions and depressions formed thereon and the low refraction index area is introduced at the lower portion of the wavelength conversion layer, the proceeding direction of light diffused in every direction from the phosphor particles can be readjusted to the upward direction, thus improving the light extraction efficiency.

Figure 47:
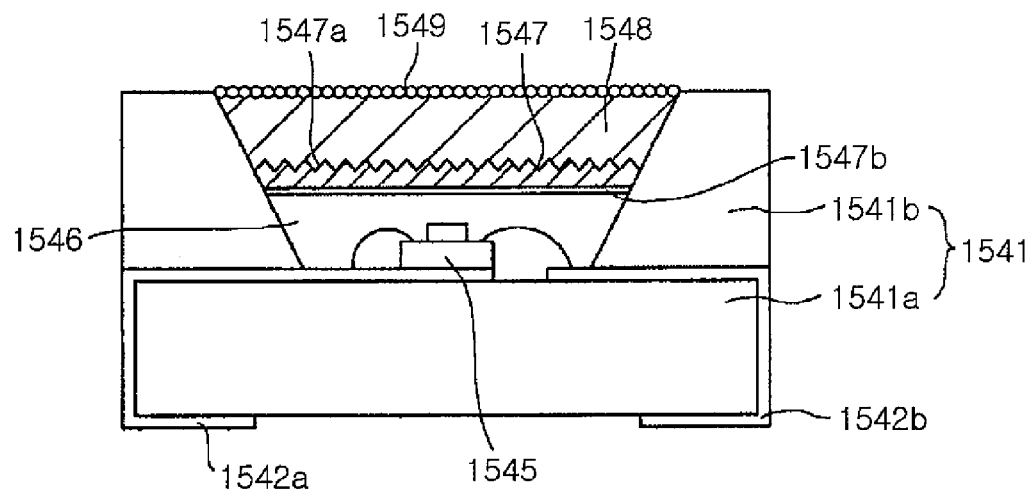
FIGS. 47 to 49 are sectional views of light emitting device packages according to tenth to twelfth exemplary forms of the present invention.
Figure 48:
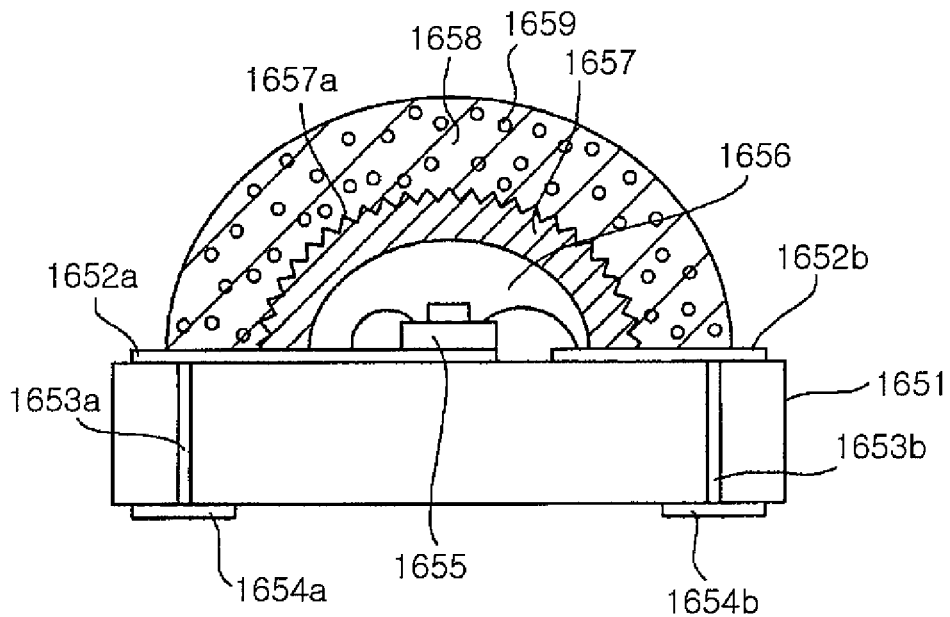
Figure 49:
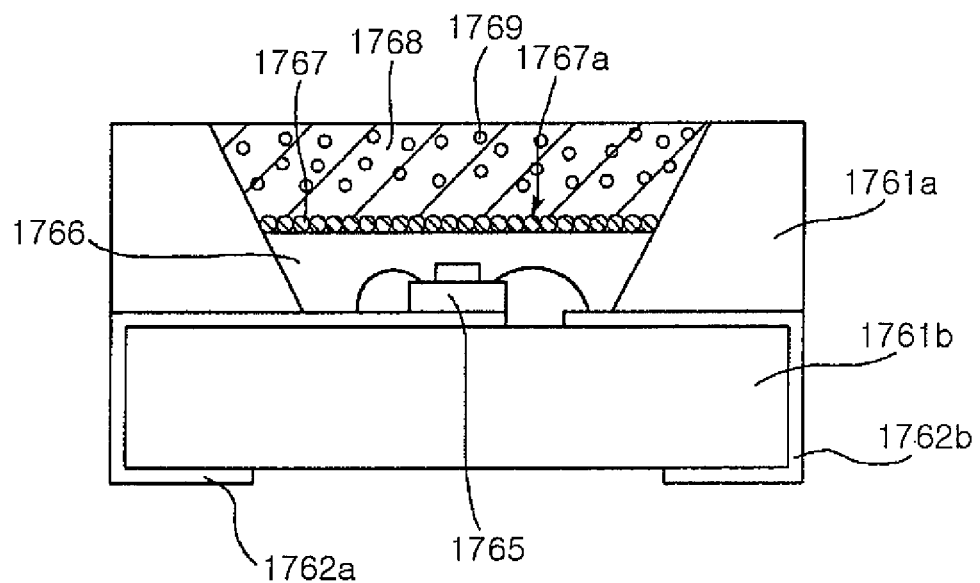

FIGS. 47 to 49 are sectional views of light emitting device packages according to tenth to twelfth exemplary embodiments of the present invention. Specifically, FIG. 47 shows a structure of the light emitting device package according to the ninth exemplary embodiment illustrated in FIG. 45, in which the wavelength conversion layer is improved. FIG. 48 shows an improved structure of the package substrate, and FIG. 49 shows an improved structure of the high refraction index layer, in which the high refraction index layer is formed by using the configuration of the high refraction index layer itself in forming the pattern of protrusions and depressions without using a general molding process or etching process.

First, a light emitting device package 1540 illustrated in FIG. 47 includes a package substrate 1541 and an LED 1545 mounted on the package substrate 1541, which is similar to the light emitting device package illustrated in FIG. 45. The package substrate 1541 may include a lower package substrate 1541a with two lead frames 1542a and 1542b formed thereon and an upper package substrate 1541b having a cavity. Anodes (not shown) of the LED chip 1545 are connected to upper ends of the lead frames 1542a and 1542b by wires, respectively.

A low refraction index area 1546 is provided to cover the LED chip 1545. The low refraction index area 1546 may be an empty space or may be an area filled with a transparent resin having a relatively low refraction index such as an epoxy or a silicon resin. The low refraction index area 1546 may be formed as an empty space area in which a lens (not shown) made of a resin having a low refraction index is disposed to cover the LED chip 1545.

A high refraction index layer 1547 is formed on the low refraction index area 1546. The high refraction index layer 1547 has at least a higher refraction index than that of the low refraction index layer 1546 and includes the pattern of protrusions and depressions (namely, an irregular pattern) 1547a formed on an upper surface thereof. The pattern of protrusions and depressions 1547a formed on the high refraction index layer 1547 can facilitate light extraction to the wavelength conversion layer 1548 having a relatively low refraction index. Preferably, a formation interval of the protrusions and depressions 1547a may range from 0.001 μm to 500 μm, more preferably from 0.001 μm to 300 μm.

Also, in the present exemplary embodiment, an anti-reflective layer 1547b may be formed on a lower surface of the high refraction index layer 1547, namely, on the interface between the high refraction index layer 1547 and the low refraction index area 1546. The anti-reflective layer 1547b may be made of a material having anti-reflection at an optical wavelength band of the LED chip 1545 and promote the progress of the light generated from the LED chip 1545 to the high refraction index layer 1547.

The wavelength conversion layer 1548 containing phosphor 1549 for converting the wavelength of light emitted from the LED 1545 is formed on the high refraction index layer 1547. The wavelength conversion layer 1438 has a refraction index at least lower than that of the high refraction index layer 1547.

In the present exemplary embodiment, the wavelength conversion layer 1548 is formed in a way that a transparent resin area is formed and the phosphor 1549 is then coated on an upper surface of the transparent resin area. Also, in this structure, the layer including the phosphor particles 1549 is situated on the optical structure including the high refraction index layer 1547 and the low refraction index area 1546 so that the light extraction efficiency can be sufficiently improved.

The high refraction index layer 1547 itself may be made of a resin having a high refraction index or a transparent resin containing high refraction index particles. Preferably, the high refraction index layer 1547 has a refraction index of at least 1.8 or larger to allow photons (i.e., light quantum) diffused from the phosphor particles 1549 to be reflected from the interface with the low refraction index area 1546 but 10 or less to facilitate light extraction to the wavelength conversion layer 1548.

The process of fabricating the package according to the present exemplary embodiment is not limited, but when the low refraction index area 1546 is made of a transparent resin such as an epoxy or a silicon resin, the high refraction index layer 1547 and the wavelength conversion layer 1548 can be formed through a continuous coating and hardening process. In this case, the protrusions and depressions 1547a of the high refraction index layer 1547 may be formed by applying a mechanical or chemical etching after the hardening process or may be formed by using a molding frame before the hardening process.

A light emitting device package 1600 illustrated in FIG. 48 includes a package substrate 1651 and an LED 1655 mounted on the package substrate 1651. The package substrate 1651 includes two lead frames 1652a and 1652b formed on an upper surface thereof, two connection pads 1654a and 1654b formed on a lower surface thereof, and conductive via holes 1653a and 1653b connecting the lead frames 1652a and 1652b and the connection pads 1654a and 1654b; however, the package substrate 1651 is not limited thereto.

Similar to the other exemplary embodiments, the light emitting device package 1600 includes a hemispheric low refraction index area 1656 covering the LED 1655, a high refraction index layer 1657 formed on the low refraction index area 1656, and the wavelength conversion layer 1658 formed on the high refraction index layer 1657. The high refraction index layer 1657 has at least a higher refraction index than that of the low refraction index area 1656 and includes a pattern of protrusions and depressions 1657a. The wavelength conversion layer 1658 has a lower refraction index than that of the high refraction index layer 1657.

In the present exemplary embodiment, when the hemispherical low refraction index area 1656 is formed as a transparent resin layer, it can be easily formed by using the conventional molding process such as a transfer molding process. In this case, the other layers 1657 and 1658 may also be formed through a similar molding process. When the low refraction index area 1656 is provided as an empty space, the high refraction index layer 1657 and/or the wavelength conversion layer 1658 may be fabricated to have a desired shape through a molding process and then attached to the package substrate 1651. Although the high refraction index layer 1657 and the wavelength conversion layer 1658 are illustrated as having the hemispherical shape, without being limited thereto, they can be fabricated to have various other shapes in their respective section such as a cubic shape, a pyramidal shape, and etc.

Such different shapes can be similarly adopted to the structure of FIG. 47. For example, in the exemplary form of FIG. 47, the high refraction index layer 1547 has a flat shape but it can be altered to have a hemispherical shape similar to that of FIG. 48 or any other shapes.

With reference to FIG. 49, similar to the exemplary embodiment illustrated in FIG. 45, a light emitting device package 1700 as shown in FIG. 49 includes a package substrate 1761 and an LED chip 1765 mounted on the package substrate 1761. The package substrate 1761 may include a lower package substrate 1761b with two lead frames 1762a and 1762b formed thereon and an upper package substrate 1761a having a cavity.

The LED chip 1765 is mounted in the cavity area. Anodes (not shown) of the LED chip 1765 are connected to upper ends of the lead frames 1762a and 1762b by wires, respectively. A low refraction index area 1766 is provided to cover the LED 1765.

The low refraction index area 1436 may be an empty space or may be an area filled with a transparent resin having a relatively low refraction index. When the low refraction index area 1766 is an empty space, it has a refraction index (n=1) similar to that of the atmosphere. Meanwhile, when the low refraction index area 1766 is formed with a transparent resin, a general epoxy, silicon, or a mixture thereof, may be used. In this case, the refraction index of the low refraction index area 1766 may be any value lower than the refraction index value of a high refraction index layer discussed below. The low refraction index value is preferably about 1.7.

The high refraction index layer 1767 is formed on the low refraction index area 1766. The high refraction index layer 1767 includes high refraction index particles having a higher refraction index than that of the low refraction index area 1766. Accordingly, in the present exemplary embodiment, the shape or cycle of the pattern of the protrusions and depressions 1767a is determined by the grain size or shape of the particles having the high refraction index. The particles having the high refraction index may be made of material selected from the group consisting of GaP, Si, $TiO_2$, $SrTiO_3$, SiC, cubic or amorphous carbon, carbon nanotubes, AlGaInP, AlGaAs, SiN, SiON, ITO, SiGe, AlN, GaN, and mixtures thereof.

At least the upper surface of the high refraction index layer 1767 according to the present exemplary embodiment may be formed by disposing in the cavity area a layer with the high refraction index particles, is prepared by a separate process. Differently, when the low refraction index area 1766 is made of a resin, the high refraction index particles may be densely coated on an upper surface of the resin.

A wavelength conversion layer 1768 containing a phosphor 1769 is formed on the high refraction index layer 1767 in order to convert wavelength of light emitting from the LED 1765. The wavelength conversion layer 1768 may have a lower refraction index than that of the high refraction index layer 1767.

The pattern of protrusions and depressions 1767a formed on the high refraction index layer 1767 facilitate light extraction to the wavelength conversion layer 1768 having a relative lower refraction index. Also, if the difference in the refraction index between the high refraction index layer 1767 and the wavelength conversion layer 1768 is too effective, it would be difficult to realize sufficient light extraction even with the protrusions and depressions 1767a, so the refraction index of the high refraction index layer 1767 is preferably 10 or less.

Figure 50:
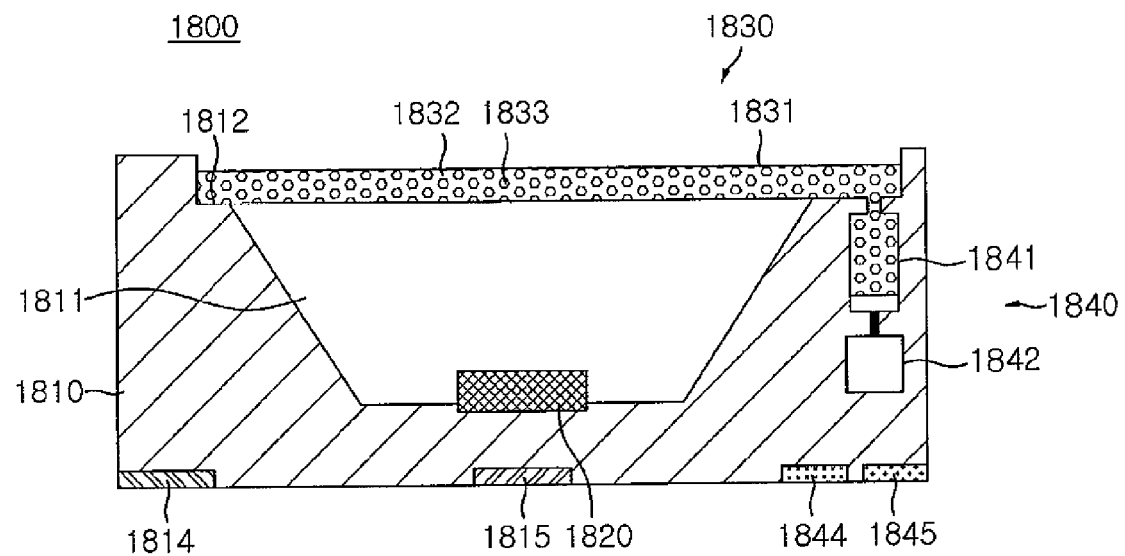
FIG. 50 is a schematic sectional view of a light emitting device package according to a thirteenth exemplary form of the present invention.
Figure 51:
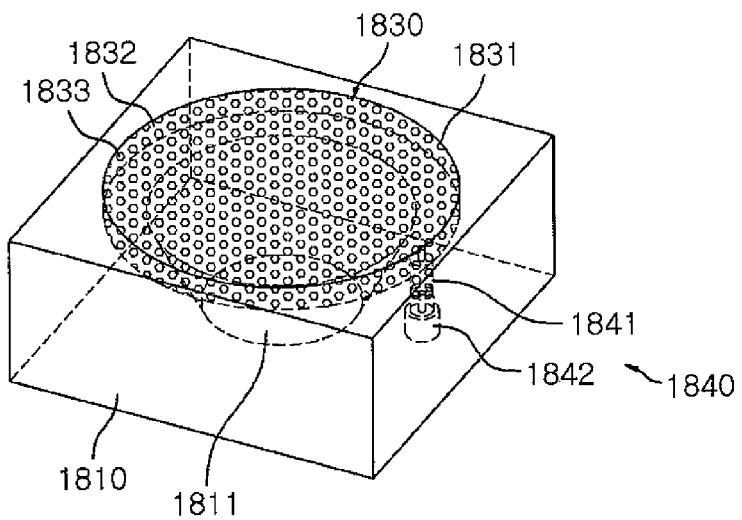
FIG. 51 is a perspective view schematically showing a wavelength conversion unit and a controller of the light emitting device package illustrated in FIG. 50.

FIG. 50 is a schematic sectional view of a light emitting device package according to a thirteenth exemplary embodiment of the present invention and FIG. 51 is a perspective view schematically showing a wavelength conversion unit and a controller of the light emitting device package illustrated in FIG. 50.

First, with reference to FIGS. 50 and 51, a light emitting device package 1801 includes a main body 1810, a light emitting device 1820, a wavelength conversion part 1830, and a controller 1840. The main body 1810 may be made of a plastic resin or a ceramic material and includes a cavity 1811, having a side opened to allow the light emitting device 1820 (to be described) to be accommodated therein. The cavity 1811 has a structure in which an inner circumferential surface slopes forwardly in order to diffuse light generated from the light emitting device 1820. The size of the inner circumferential surface is progressively larger as it extends toward the outer side of the front surface.

Accordingly, if the cavity 1811 has a cylindrical structure with a circular or oval horizontal section, the cavity 1811 has a conic shape such that an inner diameter of the inner side is larger than that of the outer side. However, the present invention is not limited thereto, and the cavity 1811 may have a quadrangular horizontal section and, in this case, the cavity 1811 may have a structure having a pyramidal shape in which an outer section is larger than an inner section.

The main body 1810 may have a mounting portion 1812, having a stepped structure allowing mounting of a wavelength conversion part 1830 (to be described) near the opening of the cavity. The stepped structure of the mounting portion 1812 is formed at the upper end near the front surface of the main body 1810 so that the wavelength conversion part 1830 can be mounted. Preferably, the mounting portion 1812 is formed along an outer circumference of the cavity 1811.

The main body 1810 includes a pair of main terminals 1814 and 1815 having one end exposed from a lower surface of the cavity 1811 so as to be electrically connected with the light emitting device 1820 mounted on the main body 1810 and the other end exposed from the main body 1810. The light emitting device 1820 is a type of semiconductor device emitting light of a certain wavelength by power applied from an external source, and the light emitting device package according to the thirteenth exemplary embodiment of the present invention has the structural characteristic of having a single light emitting device, unlike the conventional art in which a plurality of light emitting devices are employed, in varying a color temperatures. The light emitting device 1820 is accommodated within the cavity 1811 and mounted on the main body 1810 such that it is electrically connected with the pair of main terminals 1814 and 1815 provided within the main body 1810.

Meanwhile, the wavelength conversion part 1830 is mounted on the mounting portion 1812 of the main body 1810 to cover the cavity 1811 in order to convert the wavelength of light emitted from the light emitting device 1820. The wavelength conversion part 1830 includes a fluid accommodating portion 1831 disposed on the path of light emitted from the light emitting device 1820, a transparent fluid 1832 introduced into the fluid accommodating portion 1831, and a phosphor (or fluorescent material) 1833 dispersed in the transparent fluid 1832. The wavelength conversion part 1830, containing the phosphor 1833, converts the capacity of the transparent fluid 1832 introduced into the fluid accommodating portion 1831 to thereby adjust the volume of the fluid accommodating portion 1831 to control a color temperature. The wavelength conversion part 1830 includes a red phosphor having an inorganic compound represented by the empirical formula $(Sr, M)_2SiO_{4-x}N_y$:Eu synthesized according to the present invention, where M is at least one of a monovalent and divalent element, 0<x<4, and y=2x/3, and emitting light having an emission peak ranging from 600 nm to 700 nm by absorbing light emitted from the LED chip.

The fluid accommodating portion 1831 may be made of silicon or a rubber material that can be deformed, i.e. contracted or expanded, and has elasticity with a good force of restitution. Preferably, the fluid accommodating portion 1831 has a light transmission so as not to affect the color temperature. The fluid accommodating portion 1831 may be formed so as to have a hollow tube structure with a certain volume to accommodate the transparent fluid 1832 introduced into the fluid accommodating portion 1831. In FIG. 50, the fluid accommodating portion 1831 has a disk-type structure, but the present invention is not limited thereto and the fluid accommodating portion 1831 may have a polygonal structure such as a quadrangular structure, depending on the shape of an outer section of the cavity 1811. The transparent fluid 1832 introduced into the elastic tube 1831 may contain water, oil, a resin, or the like, in order to have fluidity and contains the uniformly dispersed phosphors 1833 therein.

The controller 1840 is connected with the wavelength conversion part 1830 and controls the color temperature of light by adjusting the volume of the fluid accommodating portion 1831 by changing the capacity of the transparent fluid. The controller 1840 includes a reservoir 1841 connected with the fluid accommodating portion 1831 to accommodate the transparent fluid 1832 and an actuator 1842 connected with the reservoir 1841 to adjust the capacity of the transparent fluid 1832 contained within the fluid accommodating portion 1831. The reservoir 1841 is connected with the fluid accommodating portion 1831 to accommodate a portion of the transparent fluid 1832 filled within the fluid accommodating portion 1831. Accordingly, the transparent fluid 1832, having fluidity, moves between the fluid accommodating portion 1831 and the reservoir 1841, rather than being fixed solely in the fluid accommodating portion 1831, and accordingly, the capacity of the transparent fluid 1832 within the fluid accommodating portion 1831 can be varied. The reservoir 1841 is made of the same material as that of the fluid accommodating portion 1831, and preferably, is integrally formed with the fluid accommodating portion 1831.

The actuator 1842 is connected with the reservoir 1841 to adjust the capacity of the transparent fluid 1832 filled in the fluid accommodating portion 1831. Namely, through an expansion and contraction operation of the actuator 1842, the transparent fluid 1832 within the reservoir 1841 connected with the actuator 1842 can be moved to the fluid accommodating portion 1831 or may be moved from the fluid accommodating portion 1831 to the reservoir 1841, thus adjusting the capacity of the transparent fluid 1832 within the fluid accommodating portion 1831. The actuator 1842 may include a piezo-actuator (PZT), an MEMS element, and the like, but the present invention is not limited thereto. The actuator 1842 is driven by power applied from an external source, for which a plurality of auxiliary terminals 1844 and 1845 are provided. One end of the pair of auxiliary terminals 1844 and 1845 is electrically connected with the actuator 1842 and the other end thereof is exposed from the main body 1810.

An electronic device (not shown) may be provided to control the operation of the actuator 1842. A detailed structure for connecting the actuator 1842 and the auxiliary terminals 1844 and 1845 is omitted. In FIG. 50, the auxiliary terminals 1844 and 1845 are exposed from the lower surface of the main body 1810, but the present invention is not limited thereto and the auxiliary terminals 1844 and 1845 may be exposed from the side surface of the main body 1810. The reservoir 1841 and the actuator 1842 may be provided to be buried at the inner side of the main body 1810 such that they are adjacent to the cavity 1811. In this case, preferably, an accommodating recess (not shown) for accommodating the reservoir 1841 and the actuator 1842 may be formed in the main body 1810. Accordingly, the reservoir 1841 and the actuator 1842 can be insertedly mounted in the accommodating recess.

In the light emitting device package according to the thirteenth exemplary embodiment of the present invention, the reservoir 1841 and the actuator 1842 are illustrated to be disposed to be parallel to an optic axis along a shorter-axis direction of the main body 1810. However, without being limited thereto, the reservoir 1841 and the actuator 1842 may be disposed to be perpendicular to the optic axis along a longer-axis direction of the main body 1810, and in this case, the thickness of the main body 1810 can be reduced and the reservoir 1841 and the actuator 1842 can be more effectively mounted.

The fluid accommodating portion 1831 is mounted on the step of the mounting portion 1812 to cover the cavity 1811, and in this case, the cavity 1811 of the main body 1810 may be filled with a transparent resin to hermetically seal the light emitting device 1820 disposed within the cavity 1811. Also, the cavity 1811 may be filled with air to cover the light emitting device 1820 disposed within the cavity 1811, and in this case, the light emitting device is hermetically sealed by the fluid accommodating portion 1831 mounted to cover the cavity 1811.

Figure 52:
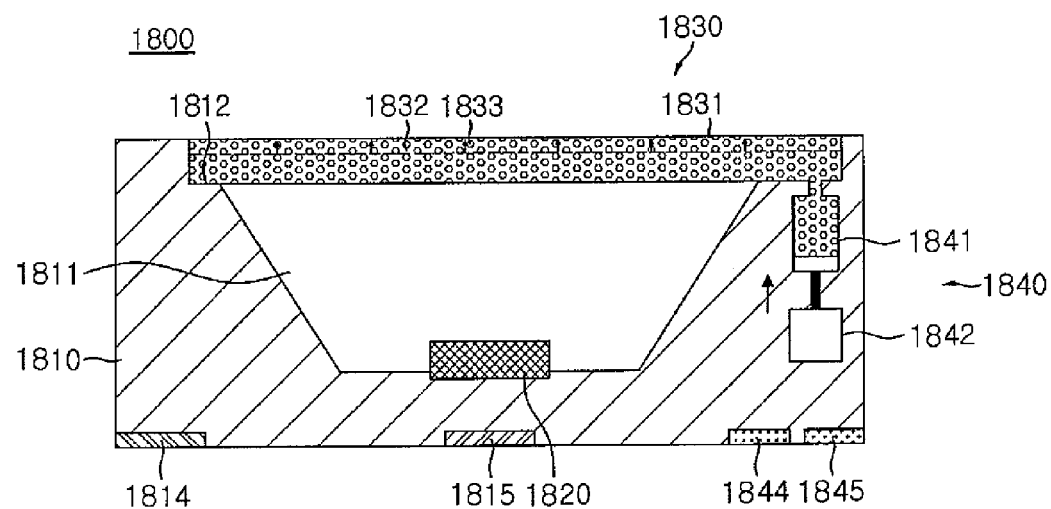
FIGS. 52 and 53 are sectional views for explaining a method for varying a color temperature by operating the wavelength conversion unit and the controller illustrated in FIG. 50.

A method for varying a color temperature by operating the wavelength conversion part 1830 and the controller 1840 will now be described with reference to FIGS. 52 and 53. First, as shown in FIG. 52, when the actuator 1842 expands as external power source is applied thereto via the pair of auxiliary terminals 1844 and 1845, the reservoir 1841 connected with the actuator 1842 is contracted by the actuator 1842 to have a smaller volume. In this case, the transparent fluid 1832 stored in the reservoir 1841 moves to the fluid accommodating portion 1831 to increase the transparent fluid 1832 filling the fluid accommodating portion 1831. Accordingly, the fluid accommodating portion 1831 expands due to the increased transparent fluid 1832, and the thickness of the phosphor layer increases similarly. As a result, light generated from the light emitting device 1920 passes through a thicker phosphor fluid layer, and thus, the color temperature of the emitted light can be lowered.

Figure 53:
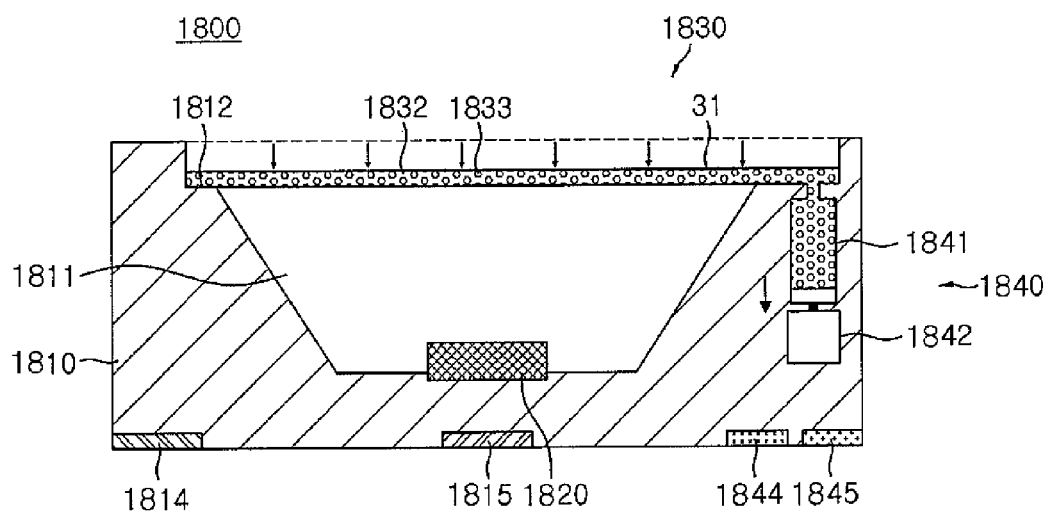

As shown in FIG. 53, when the actuator 1842 contracts, the reservoir 1841 connected with the actuator 1842 is expanded according to the contraction of the actuator 1842 so as to have an increased volume. In this case, the transparent fluid 1832 stored in the fluid accommodating portion 1831 moves into the reservoir 1841, so that the amount of the transparent fluid 1832 filling the fluid accommodating portion 1831 decreases. Accordingly, the fluid accommodating portion 1831 is contracted due to the transparent fluid 1832 which has been moved into the reservoir 1841, having a reduced volume, and the phosphor fluid layer is reduced in its thickness as much. As a result, light generated from the light emitting device 120 passes through a phosphor fluid layer with a reduced thickness, and thus, the color temperature of the emitted light increases.

In FIG. 53, the fluid accommodating portion 1831 expands and contracts with its flat front or upper surface, but the present invention is not limited thereto. The front surface of the fluid accommodating portion 1831 may be a convex or concave dome shape. The variation of the color temperature can be more precisely adjusted by the electronic device (not shown) that controls the actuator 1842. Therefore, unlike the conventional art, the color temperature can be easily adjusted only by the single light emitting device, and a lighting device or apparatus can be made smaller because there is no need to secure the distance for color mixing.

A surface light source apparatus having a light emitting device package according to various exemplary embodiments of the present invention will now be described. The surface light source apparatus according to an exemplary embodiment of the present invention includes light emitting device packages according to the present invention as described above. The light emitting device package can be used for a backlight apparatus and also many other applications like a general lighting apparatus, a headlight for a vehicle, etc.

Figure 54:
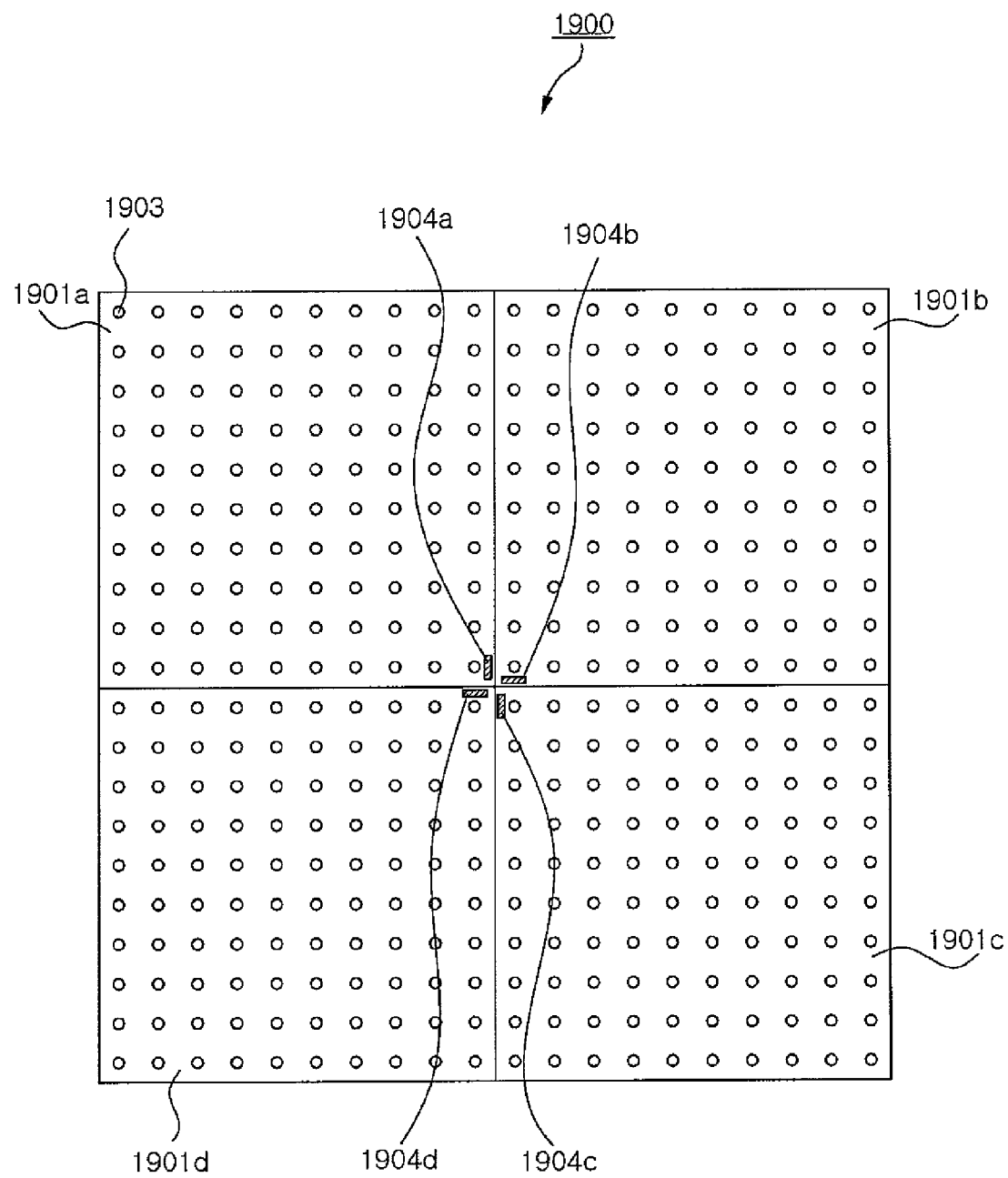
FIG. 54 is a plan view schematically showing an arrangement structure of light emitting modules of a surface light source apparatus according to a first exemplary form of the present invention.
Figure 55:
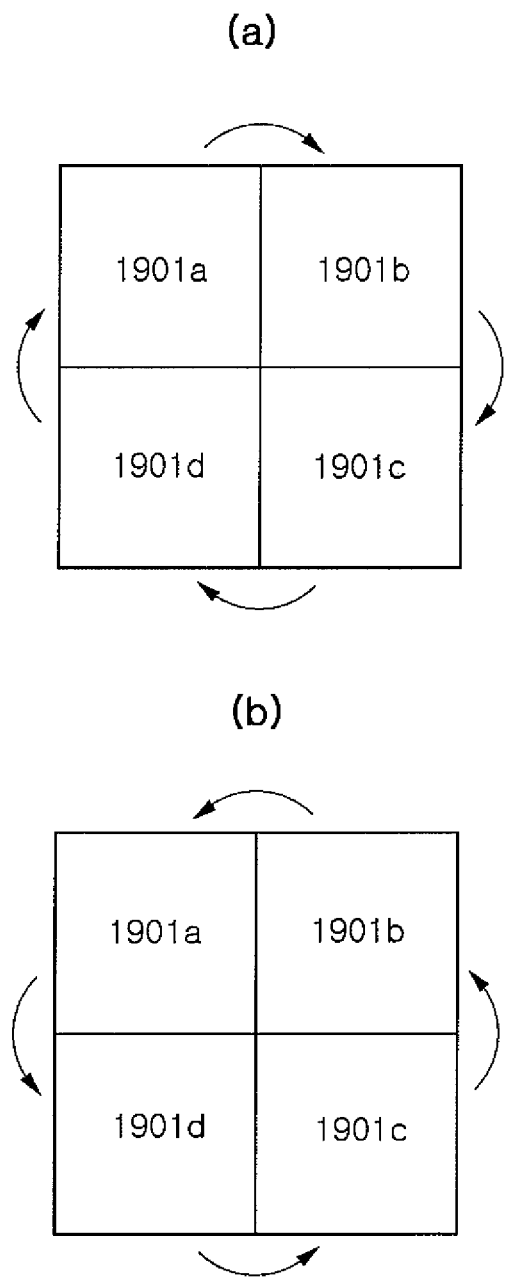
FIGS. 55(a) and (b) illustrate schemactic views for explaining a rotation disposition scheme of the light emitting modules of FIG. 54.

FIG. 54 is a plan view schematically showing an arrangement structure of light emitting modules of a surface light source apparatus according to an exemplary embodiment of the present invention, and FIG. 55 illustrates a rotation disposition scheme of the light emitting modules in FIG. 54.

First, with reference to FIG. 54, a surface light source apparatus 1900 includes first to fourth light emitting modules 1901*a* to 1901*d*. The first to fourth light emitting modules 1901*a* to 1901*d* include a plurality of light emitting devices 1903 and connectors 1904*a* to 1904*d*. The plurality of light emitting devices 1903 are arranged two-dimensionally by rows and columns to form a light emitting area, and in particular, when the surface light source apparatus 1900 employs LEDs, it can be used for a backlight unit, a lighting apparatus, and the like. The first to fourth light emitting modules 1901a to 1901d may have the same shape as a regular square and have a structure in which the plurality of light emitting devices 1903 and the connectors 1904a to 1904d are disposed on an insulating substrate.

The connector 1904a is disposed to be adjacent to one vertex of the first light emitting module 1901a. In this case, the vertex of the first light emitting module 1901a corresponds to a central point of the regular square formed by the first to fourth light emitting modules 1901a to 1901d, namely, a central point of the entire surface light source apparatus 1900 (will be referred to as the 'central point', hereinafter). In this case, 'adjacency' may be understood to mean that the connector 1904a is disposed to be closest to a particular vertex among four vertexes of the first light emitting module 1901a, and the particular vertex is located at or near a rotational central point of the light emitting module.

The second to fourth light emitting modules 1901b to 1901d have a structure equivalent to the structure of the first light emitting module 1901a, which is sequentially rotated at an angel of 90 degrees by using the rotational central point as an axis. For example, the plurality of light emitting devices 1903 and the connector 1904b of the second light emitting module 1901b have the arrangement of the plurality of light emitting devices 1903 and the connector 1904a of the first light emitting module 1901a, when the first light emitting module is rotated by 90 degrees clockwise. Likewise, the plurality of light emitting devices 1903 and the connector 1904c of the third light emitting module 1901c have the arrangement of the plurality of light emitting devices 1903 and the connector 1904b of the second light emitting module 1901b when the second lighting module is rotated by 90 degrees clockwise. The fourth light emitting module 1901d can be also arranged in the same manner. Such a rotational disposition method is illustrated in FIG. 55(a). In FIG. 55(b), the counterclockwise rotational direction is shown rather than clockwise.

As shown in FIG. 54, the connectors 1904a to 1904d included in the first to fourth light emitting modules 1901a to 1901d, respectively, are disposed to be adjacent to the central point and very close to each other. Accordingly, a wiring structure for a power connection can be simple. Also, because the first to fourth light emitting modules 1901a to 1901d have a sequential 90-degree rotational disposition structure, the surface light source apparatus 1900, according to the present exemplary embodiment, may be configured only with one type of a light emitting module. If the rotational disposition structure is not employed, the first to fourth light emitting modules 1901a to 1901d should have different structures in order to allow the connectors 1904a to 1904d to be disposed to be adjacent to the central point, which, thus, requires four types of light emitting modules. Therefore, in the case of the surface light apparatus according to the present exemplary embodiment, because the distance between the connectors 1904a to 1904d is shortened, the electrical wiring structure can be simpler and only the single light emitting module is required, and the manufacturing cost thereof can thereby be reduced resulting from the standardization of the light emitting module and the improvement of productivity.

Figure 56:
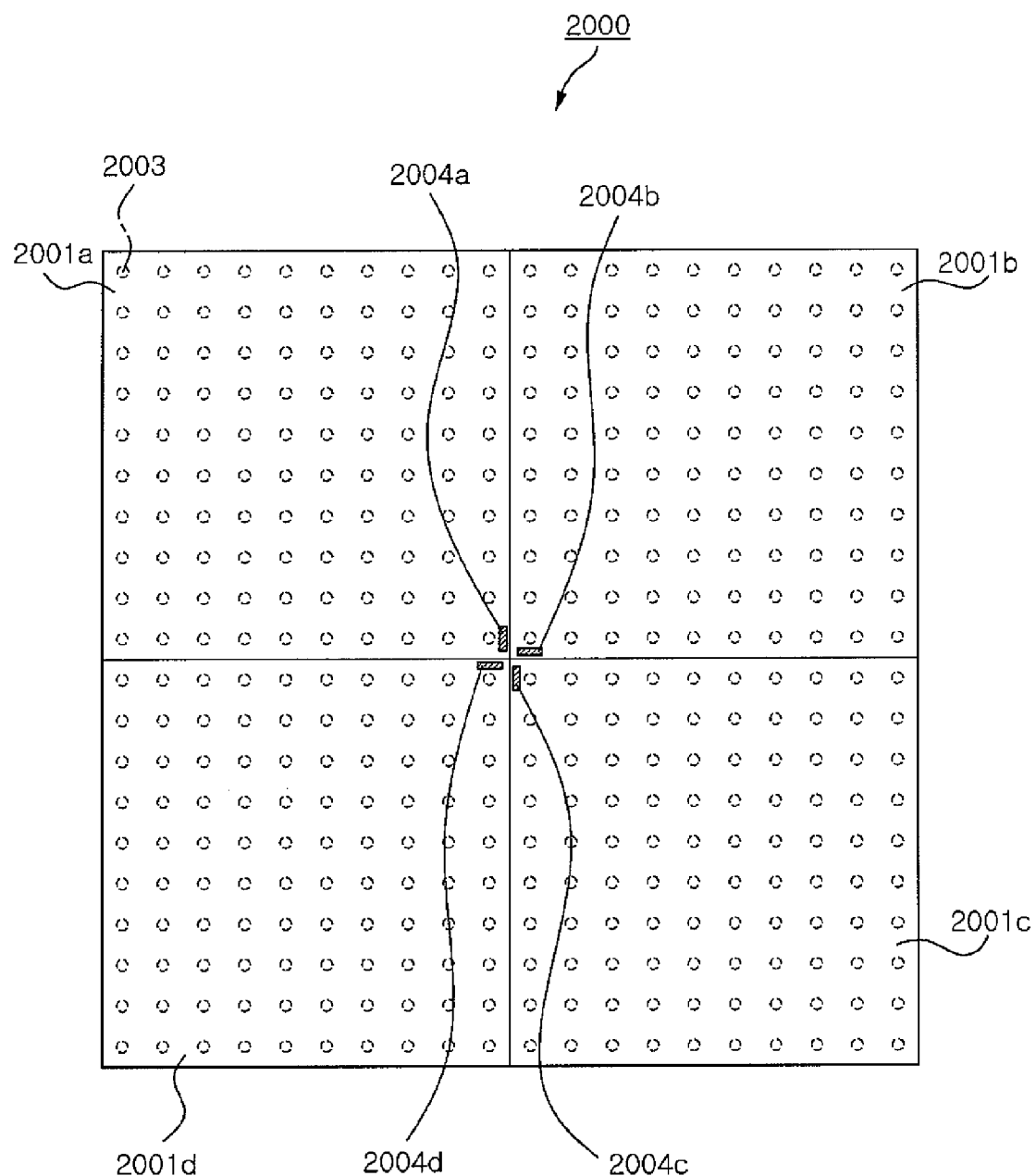
FIG. 56 is a plan view schematically showing an arrangement structure of light emitting modules of a surface light source apparatus according to a second exemplary form of the present invention.

FIG. 56 is a plan view schematically showing an arrangement structure of light emitting modules of a surface light source apparatus according to another exemplary embodiment of the present invention.

With reference to FIG. 56, a surface light source apparatus according to the second exemplary form of the present invention includes first to fourth light emitting modules 2001a to 2001d which include a plurality of light emitting devices 2003 and connectors 2004a to 2004d, respectively. In the case of the surface light source apparatus according to this exemplary embodiment of the present invention, unlike that of the other exemplary embodiment illustrated in FIG. 54, the connectors 2004a to 2004d are formed in a separate area with respect to the light emitting devices 2003. Namely, FIG. 56 shows the surface light source apparatus 2000 viewed from the direction in which the connectors 2004a to 2004d are disposed. The connectors 2004a to 2004d may be formed on the opposite side of the light emitting devices 2003 in the first to fourth light emitting modules 2001a to 2001d, and accordingly, the light emitting devices 2003 may be disposed without being restricted by the connectors 2004a to 2004d.

Figure 57:
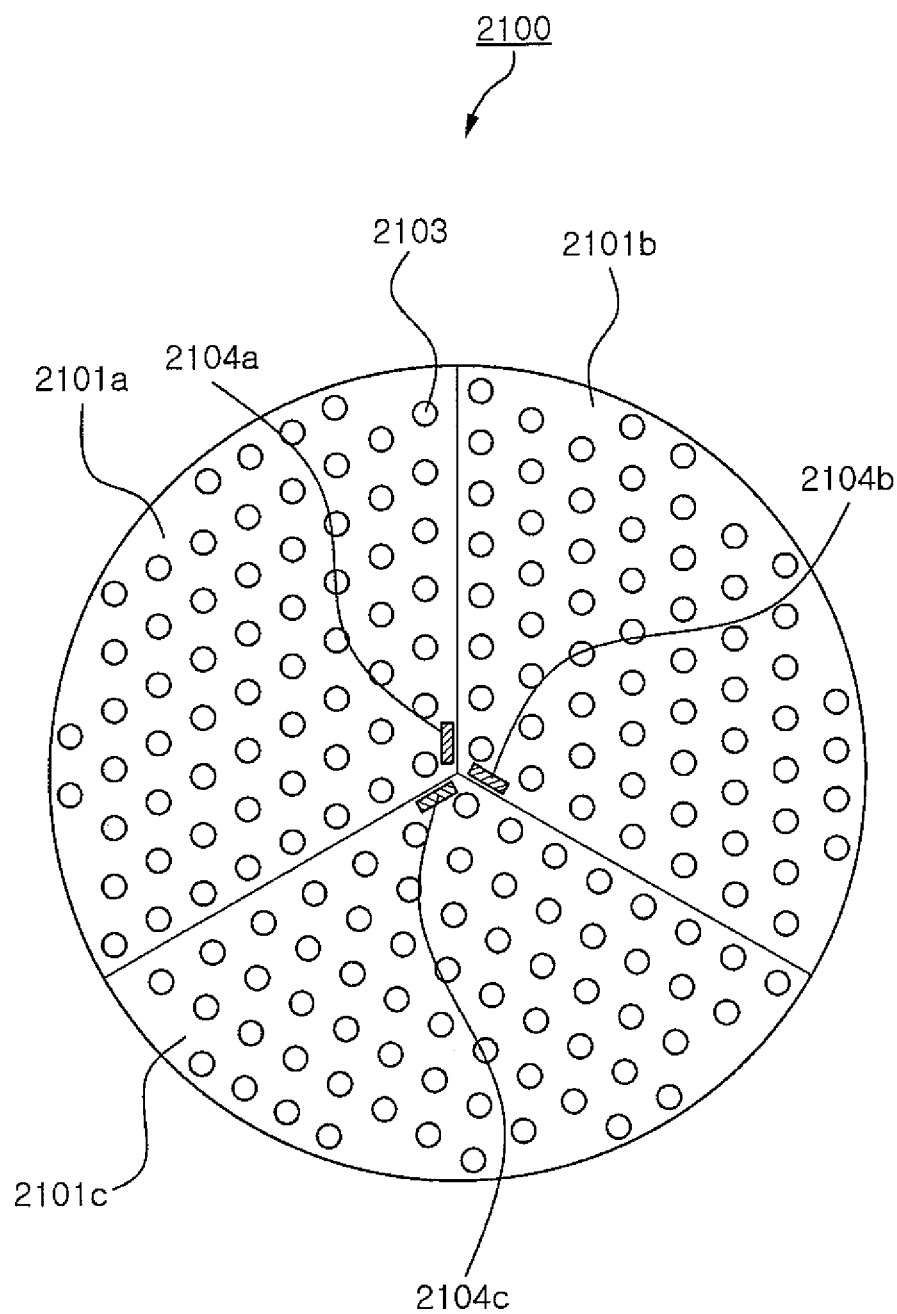
FIG. 57 is a plan view schematically showing an arrangement structure of light emitting modules of a surface light source apparatus according to a third exemplary form of the present invention.

FIG. 57 is a plan view schematically showing an arrangement structure of light emitting modules of a surface light source apparatus according to a third exemplary form of the present invention.

With reference to FIG. 57, a surface light source apparatus 2100, according to the third exemplary form of the present invention, includes first to third light emitting modules 2101a to 2101c. The shape formed by an outer boundary line of the first to third light emitting modules 2101a to 2101c, namely, a light emitting area, is circular. Just as in the embodiment illustrated in FIG. 54, the first to third light emitting modules 2101a to 2101c have the same configuration and have a fan-like shape as the angle formed with the vertex shared by the first to third light emitting modules 2101a to 2101c, namely, a rotational central point, is set at an angle of 120 degrees (360 degrees/3). A plurality of light emitting devices 2103 included in the first light emitting module 2101a are two-dimensionally arranged in first and second directions, and the first and second directions are set at an angle of 120 degrees. In this case, the first direction is the same direction as that of a boundary line between the first and second light emitting modules 2101a and 2101b, and the second direction is the same direction as that of a boundary line between the first and third light emitting modules 2101a and 2101c.

The plurality of light emitting devices 2103 and a connector 2104b of the second light emitting module 2101b have the arrangement of the plurality of light emitting devices 2103 and a connector 2104a of the first light emitting module 2101a when the first light emitting module is rotated by 120 degrees clockwise around the central point as an axis. Similarly, the plurality of light emitting devices 2103 and a connector 2104c of the third light emitting module 2101c have the arrangement of the plurality of light emitting devices 2103 and the connector 2104b of the second light emitting module 2101b when the second light emitting module is rotated by 120 degrees clockwise around the central point as an axis. In another exemplary embodiment of the present invention, the circular surface light source apparatus 2100 has the structure of three equally divided parts, but the present invention is not limited thereto and the surface light source apparatus 2100 may have a n-angular shape ((n is a natural number of 3 or larger) such as an equilateral triangular shape, a regular pentagonal shape, and the like, and in this case, the n number of light emitting modules may be arranged at a rotational angle of 1/n×360 degrees.

Figure 58:
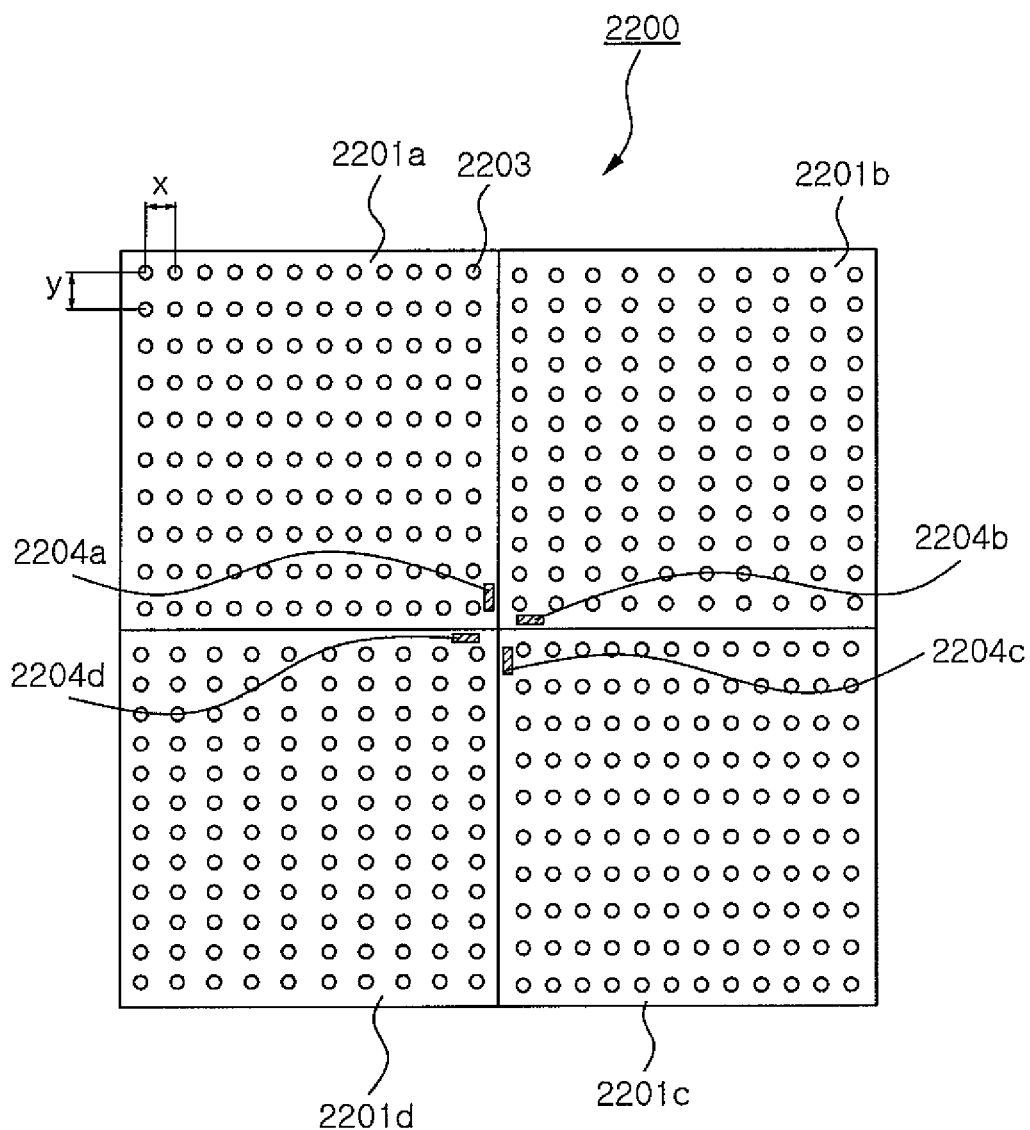
FIG. 58 is a plan view schematically showing an arrangement structure of light emitting modules of a surface light source apparatus according to a fourth exemplary form of the present invention.

FIG. 58 is a plan view schematically showing an arrangement structure of light emitting modules of a surface light source apparatus according to a fourth exemplary form of the present invention.

With reference to FIG. 58, a surface light source apparatus 2200 has a similar structure as that of the surface light source apparatus 1900 as described above with reference to FIG. 54.

That is, the surface light source apparatus 2200 according to a this exemplary embodiment of the present invention includes first to fourth light emitting modules 2201a to 2201d. The first to fourth light emitting modules 2201a to 2201d include a plurality of light emitting devices 2203 and connectors 2204a to 2204d, respectively, and the second to fourth light emitting modules 2201b to 2201d can be obtained by sequentially rotating the first light emitting module 2201a by 90 degrees.

The plurality of light emitting devices 2203 are arranged in rows and columns, namely, in x and y directions, and in this case, a pitch (x) in the x direction and a pitch (y) in the y direction are different. In the present exemplary embodiment, the pitch (y) in the y direction is larger than the pitch (x) in the x direction, which can be generally employed, and accordingly, the number of light emitting devices 2203 used overall can be reduced. In particular, the pitch (x) in the x direction in this example is about 26 mm-27 mm, and the pitch (y) in the y direction is about 29 mm-37 mm. While the pitch (y) in the y direction is larger than the pitch (x) in the x direction in this embodiment, the pitch (x) in the x direction may be larger than the pitch (y) in the y direction. Simply, the pitch (x) in the x direction and the pitch (y) in the y direction only need to be different. Meanwhile, the pitch used in the present invention corresponds to the distance between the centers of the neighboring light emitting devices 2203 separated in one direction.

In case of the light emitting device arrangement structure in which the x and y directional pitches are different, as the pitch in the y direction increases, luminance non-uniformity can be minimized. In the first light emitting module 2201a, the pitch (y) in the y direction is larger than the pitch (x) in the x direction, but the second light emitting module 2201b has pitch the opposite of the first light emitting module 2201a and the third light emitting module 2201c has pitch the opposite of the second light emitting module 2201b. The fourth light emitting module 2201d, formed by rotating the third light emitting module 2201c by 90 degrees clockwise, has the same pitch structure as that of the second light emitting module 2201b. In this manner, because the light emitting modules have the opposite arrangement structure as that of their neighboring light emitting modules, luminance non-uniformity caused in the case that the pitches in the x and y directions are different can be minimized. As a result, the surface light source apparatus 2200 may have a reduced number of light emitting devices 2203 while maintaining the uniformity in the luminance distribution.

In this case, the problem of luminance degradation, caused as the number of light emitting devices 2203 is reduced, may be solved by increasing an injection current. In this manner, when the disposition method of the first light emitting module 2201a and an area taken by the first light emitting module 2201a in the entire light emitting area are determined, the disposition method of the other remaining light emitting modules can be determined by rotating the first light emitting module 2201a clockwise or counterclockwise, and in this case, no matter which direction the first light emitting module 2201a is rotated in, the luminance uniformity can be obtained and the number of light emitting devices reduced.

Figure 59:
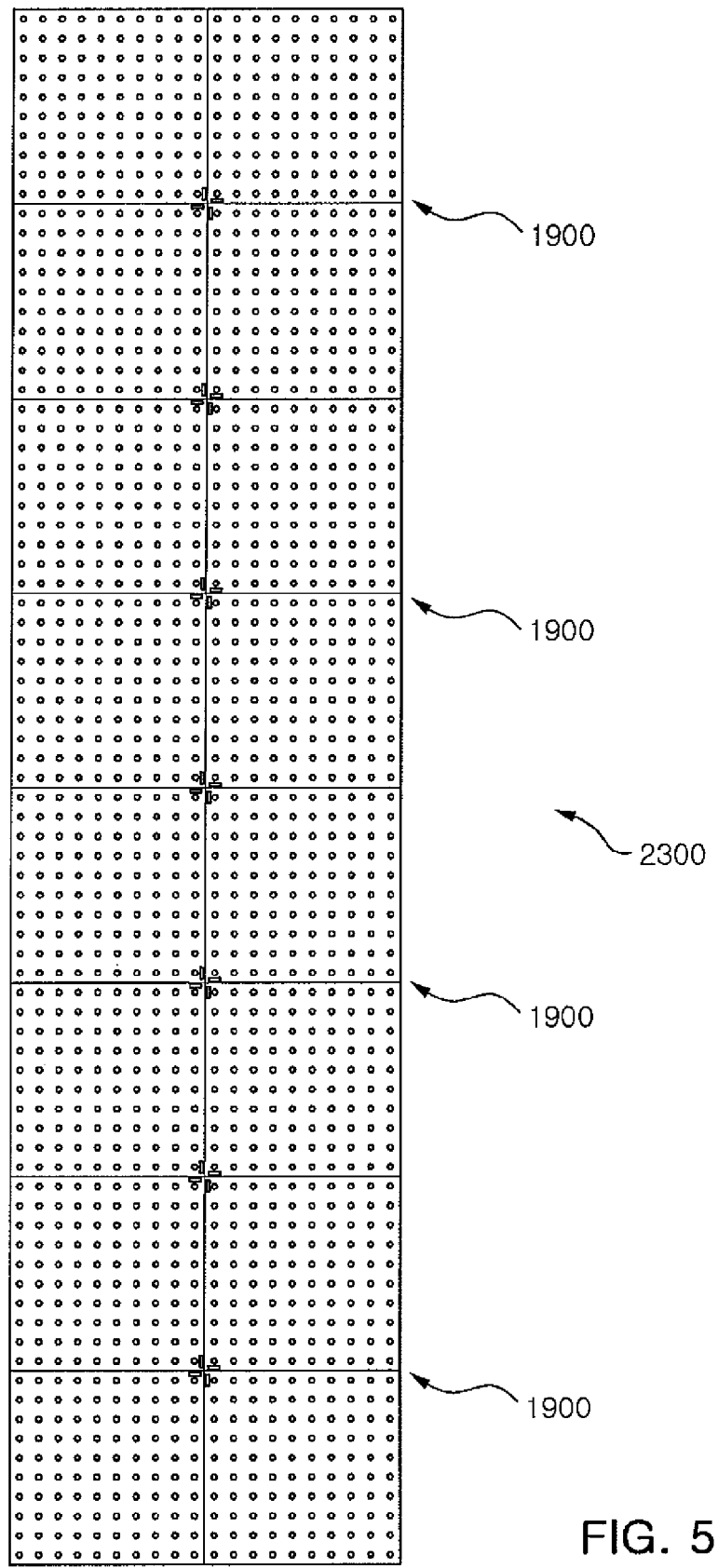
FIG. 59 is a plan view schematically showing an arrangement structure of light emitting modules of a surface light source apparatus according to a fifth exemplary form of the present invention.

In the first to fourth exemplary forms of the present invention, the overall shape of the surface light source apparatus is the quadrangular shape or the circular shape, but the present invention can be also applicable for a rectangular surface light source apparatus as shown in FIG. 59 or any other shape.

FIG. 59 is a plan view schematically showing an arrangement structure of light emitting modules of a surface light source apparatus according to a fifth exemplary form of the present invention. In the fifth exemplary form of the present invention, a surface light source apparatus 2300 has a rectangular shape, and may be formed by attaching four surface light source apparatuses 1900, according to the first exemplary form of the present invention illustrated in FIG. 54, in a side by side manner. The surface light source apparatus, provided according to the present invention, may be applicable to a size such as 300*1200, 600*1200, or the like, as well as to the size such as 300*300 or 600*600. In addition, the surface light source apparatus having the above-described structure may be employed in a backlight unit or the like that irradiates light from a rear surface of an LCD panel or other display devices.

The surface light source apparatus described above employs the light emitting device packages according to the present invention, and each light emitting device package includes a wavelength conversion part including at least the red phosphor having an inorganic compound represented by the empirical formula $(Sr, M)_2SiO_{4-x}N_y:Eu$ synthesized according to the present invention, where M is at least one of a monovalent and divalent element, $0<x<4$, and $y=2x/3$, and absorbing light emitted from the LED chip to emit light having an emission peak ranging from about 600 nm to about 700 nm.

Figure 60:
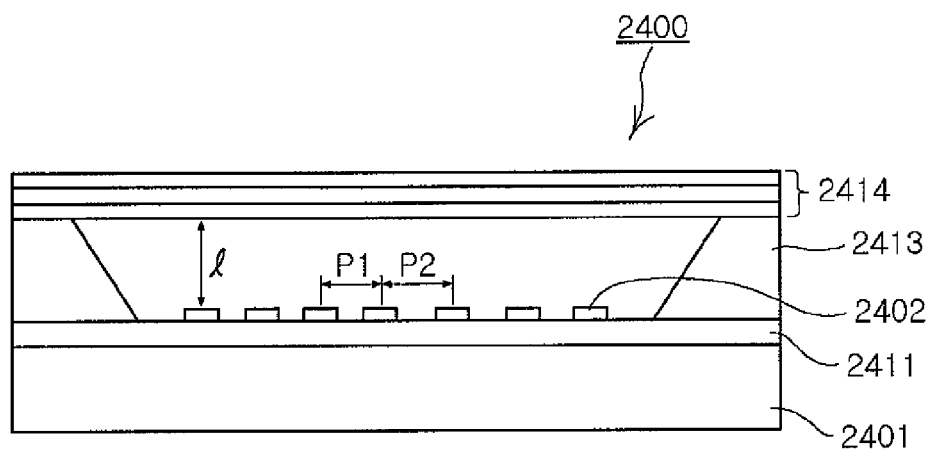
FIG. 60 is a sectional view of a backlight unit in a first exemplary form employing the surface light source apparatuses according to the first to fifth exemplary forms of the present invention.

FIG. 60 is a sectional view of a backlight unit in a first exemplary form employing the surface light source apparatuses according to the first to fifth exemplary forms of the present invention.

With reference to FIG. 60, a backlight unit 2400 may include the surface light source apparatuses having structures as described above, and one of the surface light source apparatuses is described below as an example. The surface light source apparatus includes a plurality of light emitting devices 2402 disposed on a substrate 2401 and are arranged with different pitches P1 and P2. Although not shown in detail, a light emitting area of the surface light source apparatus is equally divided into n parts to form first to nth light emitting modules, and the second to nth light emitting modules are formed by sequentially rotating the first light emitting module by 360 degrees/n clockwise or counterclockwise. Although not shown, a connector is disposed to be adjacent to a rotational center of the first to nth light emitting modules to thereby obtain efficiency in electrical wiring.

Optical sheets 2414 are disposed at an upper portion of the surface light source apparatus. The optical sheets 2414 include a diffusion sheet or a diffuser for uniformly diffusing incident light and a light collecting sheet or the like, disposed on the diffusion sheet or diffuser, collecting the incident light in a vertical direction. The optical sheets 2414 may additionally include a protection sheet disposed on the light collecting sheet to protect a lower optical structure. A side wall 2413 having a slope face in the direction in which the light emitting device 2402 is disposed is formed at edges of an upper surface of the substrate 2401 to surround the light emitting device 2402. A reflection layer 2411 may be formed on the substrate 2401 in order to upwardly reflect light emitted from the light emitting device 2402. Preferably, the pitches P1 and P2, the arrangement spaces between the light emitting devices 2402 are shorter than an optical distance (1). If this condition is not met, the luminance uniformity of the surface light source apparatus may deteriorate, and a hot spot may be seen. Here, the optical distance (1) may be understood as a distance from a light emission surface of the light emitting device 2402 to the optical sheet 2414, namely, a distance along which light proceeds in the vertical direction.

Figure 61:
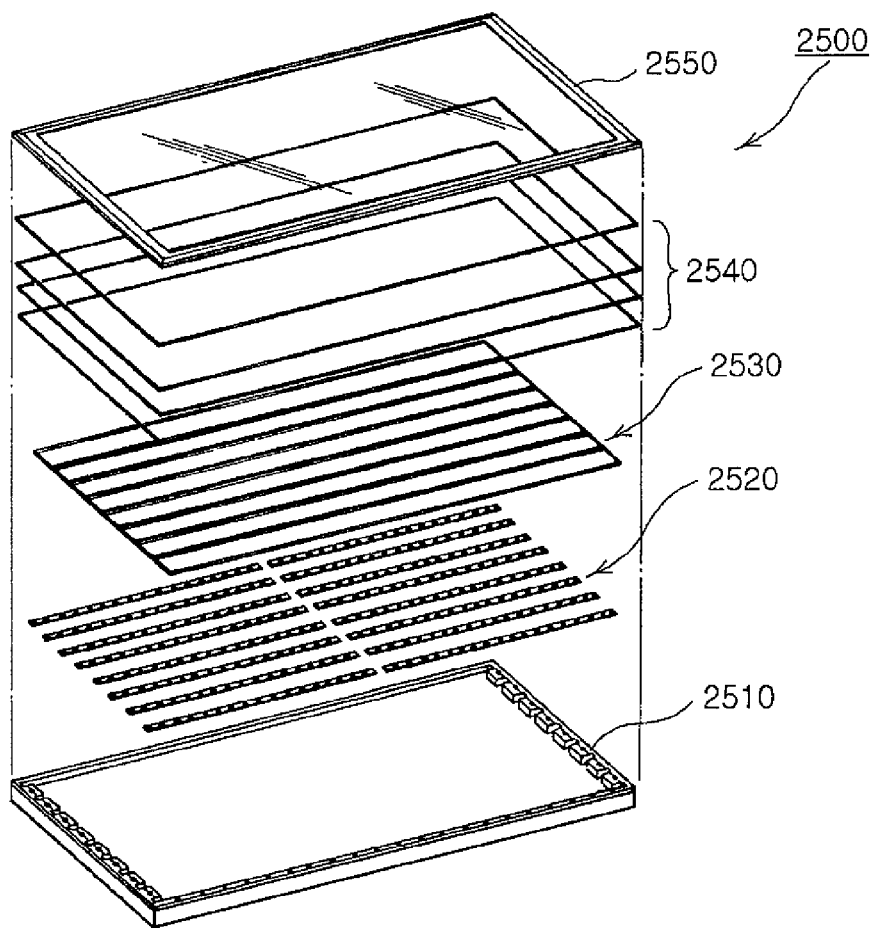
FIG. 61 is a perspective view of a surface light source apparatus according to a sixth exemplary form of the present invention.

FIG. 61 is a perspective view of a surface light source apparatus according to another exemplary embodiment of the present invention. As shown in FIG. 61, a surface light source apparatus 2500 includes a lower frame 2510, a light emitting device package 2520, a light guide plate 2530, and optical sheets 2540. In this case, the surface light source apparatus 2500 may be employed in a liquid crystal display (LCD) device along with a liquid crystal panel 2550 displaying an image by adjusting light transmittance. The optical sheets 2540 are mounted on the light guide plate 2530 and may include a diffuser, a diffusion sheet, a prism sheet, and/or a protection sheet.

The light guide plate 2530 is divided into a plurality of parts, and the plurality of light guide plates are disposed in parallel at a receiving space of the lower frame 2510. The light emitting device package 2520 is disposed at the side of the light guide plate 2530. Here, the plurality of light guide plates 2530 may be separately disposed or may be integrally connected and disposed.

The light emitting device package 2530 includes a wavelength conversion part including the red phosphor having an inorganic compound represented by the empirical formula $(Sr, M)_2SiO_{4-x}N_y$:Eu synthesized according to the present invention, where M is at least one of a monovalent and divalent element, $0<x<4$, and $y=2x/3$, a blue phosphor, a green phosphor, and yellow phosphor appropriately mixed in a resin material. Although not shown, a reflection plate may be additionally provided at a lower portion of the light guide plates 2530, and the surface light source apparatus according to the present exemplary form may be fixedly mounted in an inner space of the lower frame.

Figure 62:
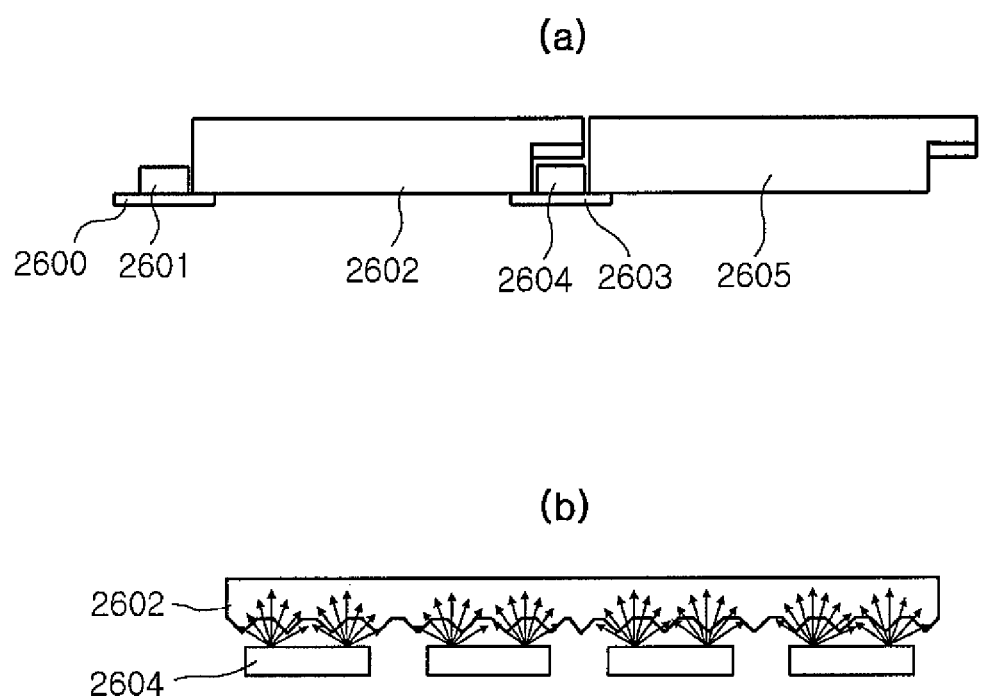
FIGS. 62(a) and (b) are schematic sectional views for explaining a surface light source apparatus according to a seventh exemplary form of the present invention.

FIG. 62 is a schematic sectional view for explaining a surface light source apparatus according to another exemplary embodiment of the present invention.

As shown in FIG. 62(a), a surface light source apparatus is a tandem-type surface light source apparatus having n number of LED light sources and n number of flat type light guide plates. In the LED light sources, a plurality of LED packages 2601 and 2603 are arranged in a row on a substrate 2600 and 2603, and the n number of LED light sources thusly formed are arranged to be parallel to each other. Flat type light guide plates 2602 and 2605 are arranged and installed at one side along the n number LED light sources.

Also, the surface light source apparatus includes a reflection member (not shown) disposed at a lower portion of the LED packages 2601 and 2604 and at a lower portion of the flat type light guide plates 2602 and 2605 in order to reflect light output from the LED light sources. Also, an optical sheet such as a diffusion sheet or a prism sheet is formed at an upper portion of the flat type light guide plates. The diffusion sheet diffuses, in various directions, light output toward a liquid crystal panel after being reflected from the reflection member and refracted from the flat type light guide plates. The prism sheet serves to collect light, which has passed through the diffusion sheet, to an inner side of a front viewing angle.

In detail, the LED light sources are configured as a plurality of LED packages in which top view LEDs are mounted, respectively. The flat type light guide plates 2602 and 2605 are disposed in the direction, in which light is emitted from the LED light sources, and made of a transparent material. Compared with a wedge type light guide plate, the flat type light guide plates 2602 and 2605 have a simpler shape so as to be easily mass-produced and adjusting the positions of the light guide plates on the LED light sources is also easy.

In addition, the flat type light guide plates 2602 and 2605 include a light receiving portion to which light emitted from the LED light sources is made incident, a light output portion formed to be flat with a uniform thickness and having a light output face outputting light, made incident from the LED light sources, toward the liquid crystal panel as illumination light, and a front end portion formed at the opposite side of the light input portion based on the light output portion and having a thickness less than that of the light receiving portion. The front end portion of the flat type light guide plate 2602 is disposed to cover the LED package 2604. Namely, the (n+1)th LED light source is positioned at a lower portion of the front end portion of the nth flat type light guide plate. The front end portion of the flat type light guide plate 2602 has a prism shape on its lower surface.

As shown in FIG. 62(b), light coming from the LED package 2604 is not directly output to the light guide plate 2602 but diffused by the prism shape provided on the lower surface of the front end portion of the flat type light guide plate 2602. Accordingly, a hot spot is not generated on the light guide plate above the LED light source.

Figure 63:
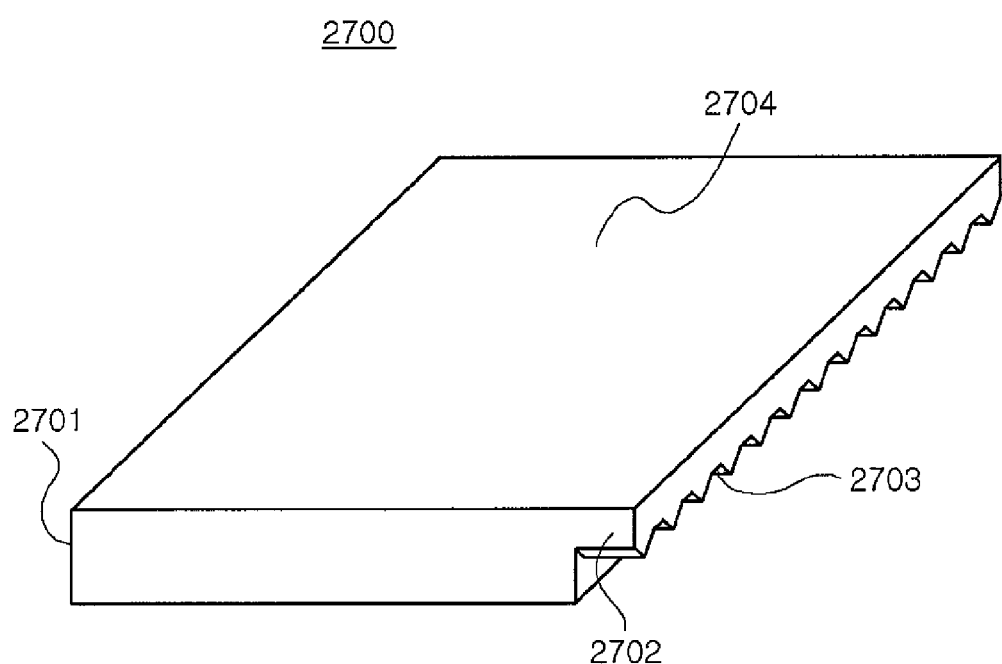
FIG. 63 is a schematic perspective view for explaining a flat type light guide plate illustrated in FIG. 62.

FIG. 63 is a schematic perspective view for explaining a flat type light guide plate illustrated in FIG. 62. As shown in FIG. 63, a flat type light guide plate 2700 includes a light receiving portion 2701 to which light emitted from the LED light sources including a plurality of LED packages is made incident, a light output portion formed to be flat with a uniform thickness and having a light output face 2704 outputting light, made incident to the light receiving portion 2701, toward the liquid crystal panel as illumination light, and a front end portion 2702 formed at the opposite side of the light input portion 2701 based on the light output portion and having a thickness less than that of an incident section of the light receiving portion 2701.

The front end portion 2702 has a prism shape 2703 in order to distribute a portion of the light coming from the LED package arranged at its lower portion. The prism shape 2703 may be at least one of a triangular prism, a conic prism, and a hemispherical prism that can distribute and diffuse incident light. Also, the prism shape of the front end portion 2702 may be formed at the entire front end portion 2702 or may be formed partially at only an upper portion of the LED package. Owing to the prism shape, a hot spot is not generated on the light guide plate above the LED package.

Accordingly, in the flat type light guide plate according to an exemplary embodiment of the present invention, because the front end portion of the flat type light guide plate 2700 is processed to have the prism shape, the process of processing a diffusion sheet and a prism sheet between the LED package and the light guide plate in order to disperse a hot spot generated on the light guide plate above the LED package by a portion of light coming from the LED package is not necessary, and thus, the fabrication process is simplified.

Figure 64:
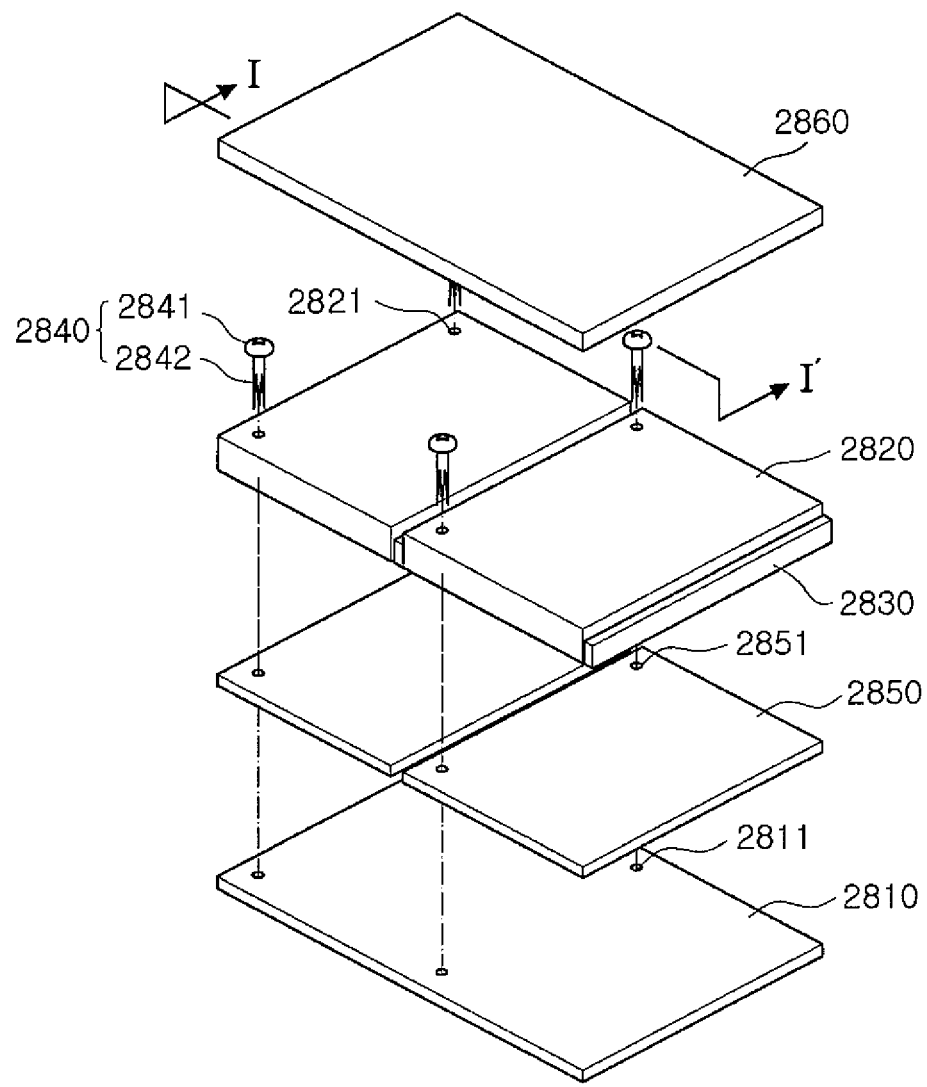
FIG. 64 is an exploded perspective view of a backlight apparatus according to a second exemplary embodiment of the present invention.
Figure 65:
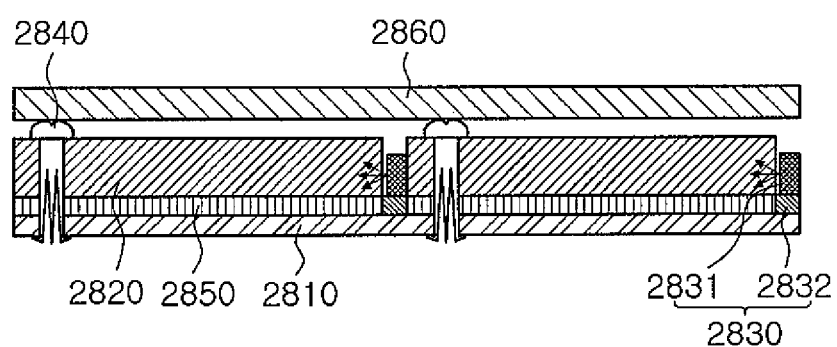
FIG. 65 is a sectional view taken along line I-I' after the backlight apparatus illustrated in FIG. 64 is stacked.

FIG. 64 is an exploded perspective view of a backlight apparatus according to a second exemplary embodiment of the present invention, and FIG. 65 is a sectional view taken along line I-I' after the backlight apparatus illustrated in FIG. 64 is stacked.

With reference to FIGS. 64 and 65, the backlight apparatus includes a lower cover 2810, a light guide plate 2820, a light source device 2830, and fixing units 2840. The lower cover 2810 has a receiving space. For example, the receiving space may be formed by a plate forming a bottom surface of the lower cover 2810 and a side wall bent from the edge of the plate. The lower cover 2810 may include fastening holes or fastening portions 2811 to which the fixing units 2840 (to be described) are fastened. Here, the fastening holes or the fastening portions 2811 may be through hole portions through which the fixing units 2840 pass or recess portions into which the fixing units 2840 are inserted.

The light guide plate 2820 may be divided into a plurality of parts. The plurality of divided light guide plates 2820 are disposed in parallel in a receiving space of the lower cover

2810. Each light guide plate 2820 has through holes 2821 penetrating the body. The through holes 2821 are disposed at the edges of the light guide plates 2820. However, in the present invention, the positions and number of the through holes 2821 are not limited thereto. The through holes 2821 are disposed to correspond to the fastening portions 2811. The light guide plate 2820 is illustrated to have a rectangular shape, but the present invention is not limited thereto and the light guide plate 2820 may have various shapes such as a triangular shape, a hexagonal shape, and the like.

A plurality of light source apparatuses 2830 are disposed at one side of each of the light guide plates 2820 in order to provide light to the light guide plates 120. Each light source apparatus 2830 may include a light source, namely, the LED package 2831, for forming light, and a substrate 2832 having a plurality of circuit patterns for applying a driving voltage of the LED package 2831. For example, the LED package 2831 may include sub-LEDs, each implementing blue, green, and red colors. In this case, the sub-LEDs may include a blue LED and a phosphor for converting a portion of blue light emitted from the blue LED into red and green colors. In this case, the blue, the red and green colors may be mixed to implement white light. Here, the red phosphor includes the inorganic compound represented by the empirical formula $(Sr, M)_2SiO_{4-x}N_y$:Eu synthesized according to the present invention, where M is at least one of a monovalent and divalent element, $0 < x < 4$, and $y = 2x/3$.

Light from the light source apparatus 2830 is made incident to the side of the light guide plate 2820 and then output to an upper side through total reflection within the light guide plates 2820. The fixing units 2840 serve to fix the light guide plates 2820 to the lower cover 2810 in order to prevent the light guide plates 2820 from moving. The fixing units 2840 are inserted into the through holes 2821 of the light guide plates 2820 to fix the light guide plates 2820 to the lower cover 2810. In addition, the fixing units 2840 may be inserted into the fastening portions 2811, e.g., the through hole portions or recess portions, of the light guide plates 2820 after passing through the through holes 2821. Each of the fixing units 2840 includes a body portion 2842 and a head portion 2841 extending from the body portion 2842.

The body portion 2842 passes through the through holes of the light guide plates 2820 so as to be fastened to the fastening portions 2811. Namely, the body portion 2842 serves to couple the light guide plate 2820 and the lower cover 2810 to fix the light guide plate 2820 onto the lower cover 2810. The head portion 2841 has a larger width than that of the body portion 2842 to thereby prevent the fixing unit 2840 from being completely released through the through hole 2821 of the light guide plate 2820. The head portion 2842 may have one of various sectional shapes, for example, a semicircular sectional shape, a semi-oval sectional shape, a quadrangular sectional shape, and a triangular sectional shape. Here, when the head portion 2841 has the triangular sectional shape, contact between the fixing unit 2840 and an optical member 2860 (to be described) can be minimized, thus minimizing the generation of a black spot due to the fixing unit 2840.

The optical member 2860 is disposed to be spaced apart from the light guide plate 2820, so light output from the light guide plate 2820 can be uniformly provided onto the optical member 2860. Here, because the head portion 2841 supports the optical member 2860, it serves to maintain the space between the light guide plate 2820 and the optical member 2860. Here, the space between the light guide plate 2820 and the optical member 2860 may be adjusted by adjusting the height of the head portion 2841. The fixing member 2840 may be made of a material allowing light to be transmitted therethrough, namely, transparent plastic, in order to minimize the potential negative influence on picture quality.

In addition, a reflection member 2850 may be disposed under the light guide plates 2820. The reflection member 2850 reflects light output to the lower portion of the light guide plates 2820 to make it incident on the light guide plate 2820 again, thus improving the light efficiency of the backlight apparatus. The reflection member 2850 may include through portions 2851 corresponding to the through hole 2821s and fastening portions 2811. The fixing units 2840 may be fastened to the fastening portions 2811 by way of the through holes 2821 and the through portions 2851. Accordingly, when the reflection member 2850 is divided into a plurality of parts like the light guide plates 2820, they can be fixed on the lower cover 2810 by means of the fixing units 2840.

In addition, the backlight apparatus may further include the optical member 2860. The optical member 2860 may include, for example, a diffuser, a diffusion sheet, a prism sheet, and/or a protection sheet disposed on the light guide plates 2820. Thus, in the present exemplary embodiment, because the backlight apparatus includes the plurality of divided light guide plates, a local dimming effect can be further improved through partial driving. In addition, because the plurality of divided light guide plates are fixed to the lower cover by using the fixing units, a partial illumination deficiency otherwise caused as the light guide plates move about can be prevented. Also, because the space between the light guide plates and the optical member can be uniformly maintained by the fixing units, uniform light can be provided to the liquid crystal panel.

Figure 66:
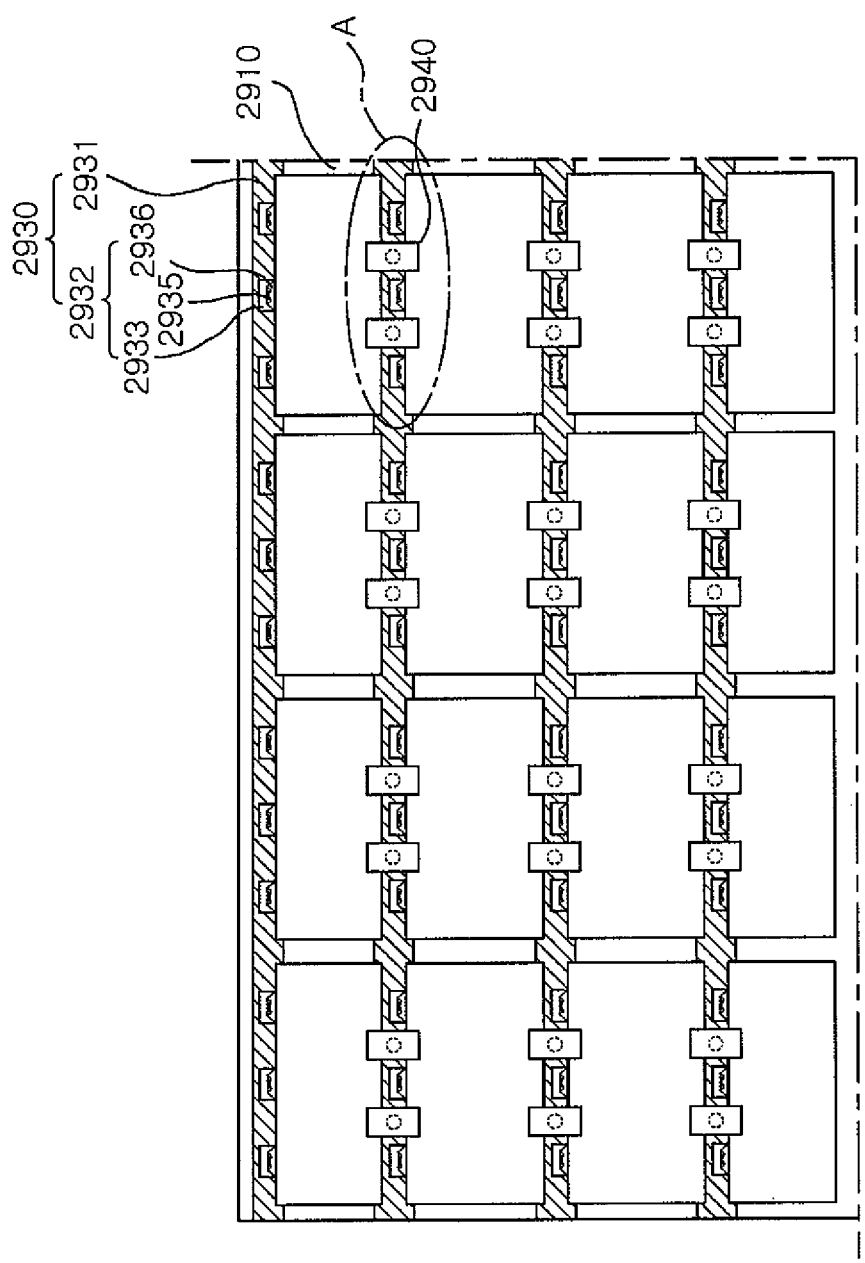
FIG. 66 is a plan view of an LED backlight apparatus according to a third exemplary form of the present invention.
Figure 67:
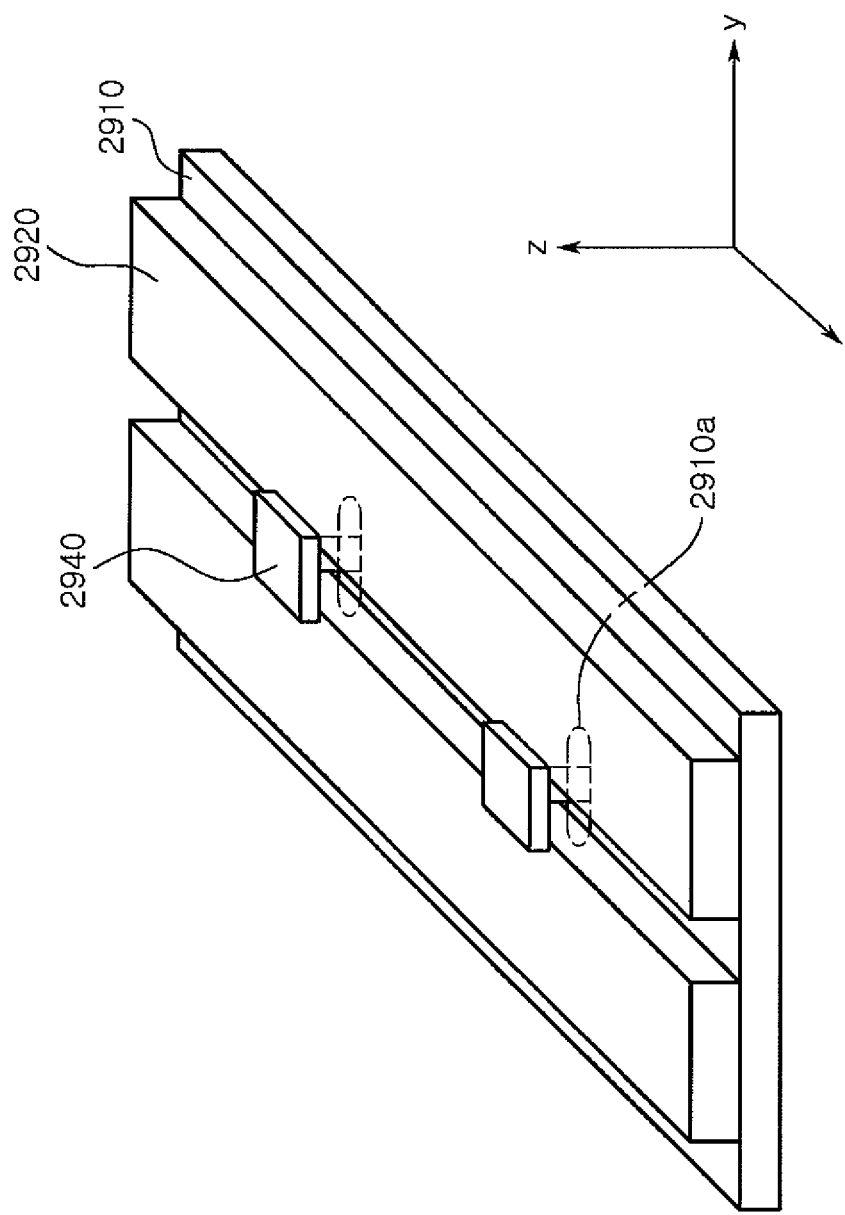
FIG. 67 is a sectional perspective view of a region 'A' illustrated in FIG. 66 before a substrate is fastened.
Figure 68:
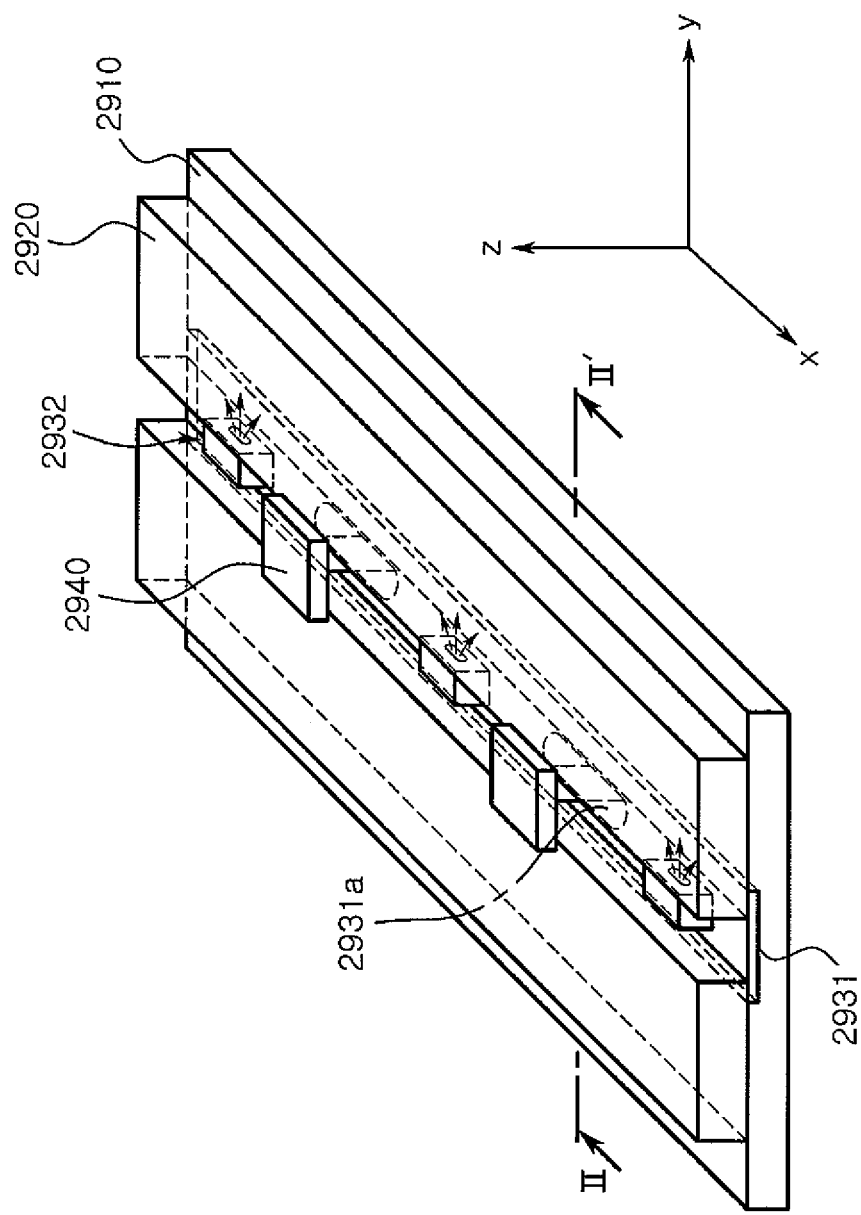
FIG. 68 is a sectional perspective view of the region 'A' illustrated in FIG. 66 after the substrate is fastened.
Figure 69:
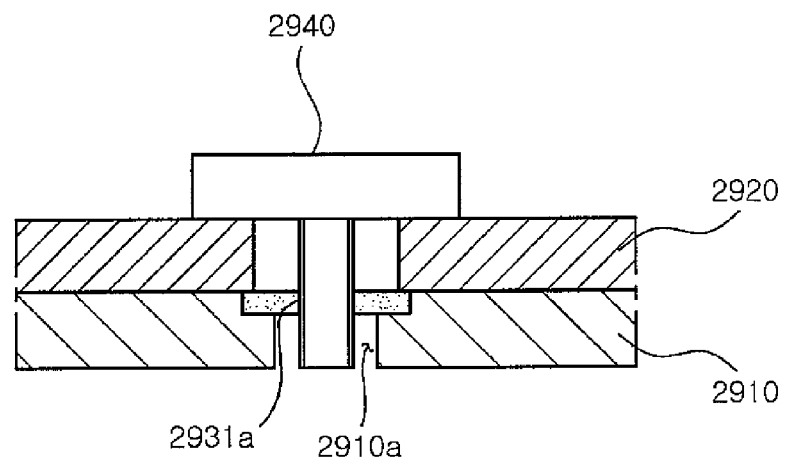
FIG. 69 is a sectional view taken along line II-II' in FIG. 68.

FIG. 66 is a plan view of an LED backlight apparatus according to an exemplary embodiment of the present invention. FIG. 67 is a sectional perspective view of a region 'A' illustrated in FIG. 66 before a substrate is fastened, and FIG. 68 is a sectional perspective view of the region 'A' illustrated in FIG. 66 after the substrate is fastened. FIG. 69 is a sectional view taken along line II-II' in FIG. 68.

As shown in FIGS. 66 to 69, the LED backlight apparatus according to the third exemplary form of the present invention includes a lower cover 2910 having a fastening hole or a fastening portion configured as a first through hole 2910a or a recess, a plurality of light guide plates 2920 disposed on the lower cover 2910, a substrate 2931 provided to be horizontal to a bottom surface of the lower cover 2910 at one side of each of the light guide plates 2920, including a wiring to which voltage is applied, and having a second through hole 2931a corresponding to the first through hole 2910a (or facing the first through hole 2910a), a plurality of LED packages 2932 mounted on the substrate 2931 provided at one side of the light guide plates 2920 and providing light, and a fixing unit 2940 fastened to the second through hole 2931a of the substrate 2931 and/or to the first through hole 2910a of the lower cover 2910 to press the edge portions of one side of the light guide plates 2920.

Here, the lower cover 2910 having the first through hole 2910a (or a (fastening) recess formed to be concave on the plate) penetrating the plate that forms a bottom surface of a receiving space and having a circular, rectangular or oval shape, or the like, is made of a material such as ferrite (Fe), an electrolytic galvanized iron (EGI), or the like, and constitutes a lower frame. The lower cover 2910 may include a side wall, namely, a side frame, formed to vertically extend in an upward direction from an edge portion of the plate forming the bottom surface. In this case, the bottom surface of the lower frame may be divided into a plurality of regions formed in a row in order to configure a separation type backlight apparatus. In this case, the plurality of regions may be demarcated by, for example, a recess formed at one region. Of course, the recess demarcating the plurality of regions corresponds to a receiving recess of the substrate 2931 (to be described).

The first through hole 2910a may have various shapes other than the circular, oval or rectangular shape. Also, the first through hole 2910a may have a width in a length direction. That is, specifically, the first through hole 2910a may include two longer sides parallel to each other and two shorter sides formed to be connected with both ends of the two longer sides with a certain curvature, and in this case, preferably, the first through hole 2910a is formed on the lower cover 2910a such that the longer axis direction (Y axis) is consistent with a direction in which light proceeds. The (fastening) recess has the same structural characteristics.

A reflection plate (not shown) may be formed on the entire bottom surface of the lower cover 2910, or if the lower cover 2910 includes a receiving recess, in which the substrate 291 is received, formed on the bottom surface thereof, a plurality of reflection plates (not shown) may be attached to the bottom surface, excluding the receiving recess. As the reflection plate, a white polyester film or a film coated with metal (Ag, Al) or the like is used. The reflectivity of visible light of the reflection plate is approximately 90 percent to 97 percent, and the thicker the coated film is, the higher the reflectivity is.

The plurality of reflection plates provided on the bottom surface of the lower cover 2910 may be formed to extend so as to be positioned between the LED packages 2932 providing light and the light guide plates 2920 positioned to be adjacent to the rear surface of the LED packages 2932. In this case, light induced after being provided from one side of the light guide plates 2920 can be reflected by the reflection plates without being interfered with by the LED packages 2932 disposed at the other side of the light guide plates 2920, and then provided toward the optical member (not shown) provided at the upper side, thus increasing the reflection efficiency of light.

An LED light source 2930 is provided in the receiving recess of the lower cover 2910 or at one side of the light guide plate 2920. The LED light source 2930 includes the substrate 2931, namely, a PCB, provided, for example, in the receiving recess such that it is horizontal to the bottom surface of the lower cover 2910, including a wiring to which voltage is applied from an external source, and having the second through hole 2931a corresponding to the first through hole 2910a of the lower cover 2910, and the LED packages 2932 mounted on the substrate 2931.

Here, the substrate 2931 includes the LED packages 2932 and the second through hole 2931a formed between the LED packages 2932. The substrate 2931 having the second through hole 2931a may be provided on the bottom surface of the lower cover 2910 such that the second through hole 2931a corresponds to (or is aligned with) the first through hole 2910a of the lower cover 2910, and the through hole 2931a may have a circular or oval shape such as that of the first through hole 2910a, but in the present invention, the second through hole 2931a includes two longer sides parallel to each other and two shorter sides formed to be connected with both ends of the two longer sides with a certain curvature, and the longer axis direction (X axis) of the second through hole 2931a is perpendicular to a direction in which light proceeds. As a result, the longer axis direction (X axis) of the second through hole 2931a of the substrate 2931 crosses the longer axis direction (Y axis) of the first through hole 2910a of the lower cover 2910.

In this case, the size of the second through hole 2931a formed on the substrate 2931, specifically, the space (or distance) between the two longer sides, may be related to the diameter of the body of the fixing unit 2940 with the thread. This is because the size of the second through hole 2931a may affect the space with the light guide plate 2920 to which light provided from the LED packages 2932 is made incident to be induced. This will be described in detail later.

Also, the LED package 2932 includes a package body 2933 fixed on the substrate 2931 to form an external frame and having a receiving recess, an LED chip 2935 mounted in the receiving recess of the package body 2933 and providing light, and a pair of first and second electrode structures (not shown) formed to be exposed from the receiving recess, having the LED chip 2935 mounted thereon, and electrically connected with a wiring on the substrate 2031.

In this case, when the LED chip 2935 is a blue LED chip, the LED package 2932 may further include a resin packing unit 2936 formed in the receiving recess. In this case, the resin packing unit 2936 may include red and green phosphors. For example, the resin packing unit 2936 may be formed by injecting an epoxy resin or a silicon resin in the form of gel containing red and green phosphors into the receiving recess of the package body 2933 and then performing UV (ultraviolet) hardening or thermosetting thereupon.

Of course, here, the present invention is not meant to be limited to the LED package 2932 including the blue LED chip and a yellow phosphor. That is, the LED package 2932 may include a near ultraviolet chip and a resin packing unit providing on the near ultraviolet chip and including a mixture of red, green, and blue phosphors or a resin packing unit including red, green, and blue phosphors which are sequentially stacked. Here, the red phosphor includes an inorganic compound represented by the empirical formula $(Sr, M)_2SiO_{4-x}N_y:Eu$ synthesized according to the present invention, where M is at least one of a monovalent and divalent element, $0<x<4$, and $y=2x/3$.

The plurality of light guide plates 2920 are provided on the bottom surface of the lower cover 2910 demarcated by a plurality of regions. Preferably, the sides of the light guide plates 2920 may be tightly attached to the package body 2933 so that light provided from the LED chip 2935 mounted in the receiving recess of the package body 2933 can be introduced to the light guide plates 2920 without a loss. The light guide plates 2920 are made of a material of PMMA (Poly methyl methacrylate), because PMMA, having the lowest level of light absorption in the viable spectrum, provides advantageously high transparency and gloss. Also, PMMA has high mechanical strength, is not easily broken or deformed, is light and has strong chemical-resistance. In addition, PMMA has a visible ray transmittance as high as 90 percent to 91 percent, a significantly low level of internal light loss, mechanical properties such as tensile strength, bending strength, and the like, and a strong chemical-resistance and tolerance.

The fixing units 2940 are fastened to the substrate 2931 between the light guide plates 2920. The fixing units 2940 are formed as screws or the like made of a transparent material and fastened by penetrating the second through hole 2931a of the substrate 2931 and the first through hole 2910a of the lower cover 2910 corresponding to the second through hole 2931a, in order to fix the neighboring light guide plates 2920 while uniformly maintaining the space between the light guide plates 2920 provided at both sides of the LED packages 2932, namely, at the front surface of the LED packages 2932 from which light is output and at the rear surface of the LED packages 2932 positioned at the opposite side of the front side. In this case, the fixing units may be made of a transparent material to allow light induced from within the light guide plates 2920 to be provided to the optical member disposed at an upper side without interruption. Preferably, the fixing units 2940 are made of the same material as that of the light guide plates 2920.

The fixing unit 2940, according to the present exemplary embodiment, includes a head portion having various shapes, substantially, shapes such as circular or quadrangular shapes and a body portion extending from the head portion and having a cylindrical shape or a column-like shape. The fixing unit may be fixed to the second through hole 2931*a* of the substrate 2931 and/or the first through hole 2910*a* of the lower cover 2910 through the thread formed on the outer surface of the body portion of the fixing unit 2940. Of course, here, the body portion of the fixing unit 2940 may have a square pillar-like shape. The size of the head portion is designed to cover the space between the light guide plates 2920 and a portion of one edge portion of the light guide plate 2920, so it can be slightly altered according to the space between the light guide plates 2920. Preferably, the diameter of the body portion is equal to the space or distance between two parallel longer sides of the second through hole 2931*a* of the substrate 2931 and/or the first through hole 2910*a* of the lower cover 2910.

The size of the head portion or the length of the diameter of the body portion of the fixing unit 2940 may be slightly altered in relation to the size of the second through hole 2931*a* of the substrate 2931 as mentioned above. For example, if the size of the second through hole 2931*a* of the substrate 2931 is small, the diameter of the body portion of the fixing unit 2940 correspondingly becomes smaller, which means that the space between the LED package 2932 and the light guide plate 2920 can be reduced. When the fixing unit 2940 is fastened to the substrate 1931 and/or the lower cover 2910 in a screw manner, the head portion of the fixing unit 2940 presses the upper corner portion of the light guide plate 2920 disposed to be adjacent to the substrate 2931 to which the LED package 2932 is fixed, whereby the light guide plate 2920 can be prevented from moving, even in the case that an external impact is applied thereto. In this case, a nut may be fastened to a portion of the fixing unit 2940 exposed from the first through hole 2910*a* of the lower cover 2910, reinforcing the resultant strength.

As a result, the fixing unit 2940 fastened to the substrate 2931 serves as a spacer between the LED package 2932 and the light guide plate 2920, uniformly maintaining the space between the LED package 2932 and the light guide plate 2920, so contraction and/or expansion of the light guide plate 2920 can be properly managed (handled). Of course, the fixing unit 2920 does not necessarily have the thread form. For example, as mentioned above with reference to FIG. 65, the fixing unit may be fastened after passing through the second through hole 2931*a* of the substrate 2931 and the first through hole 2910*a* of the lower cover 2910 through a hook portion formed at the end portion corresponding to the head portion of the screw, and then fixed by the lower cover 2910.

An optical member (not shown) is provided at an upper portion of the plurality of light guide plates 2920 in order to complement the optical characteristics of light provided through the light guide plate 2920. In this case, the optical member may include a diffuser having a diffusion pattern to reduce non-uniformity in light which has been transmitted through the light guide plates 2920, a prism sheet having a light collecting pattern to enhance a front luminance of light, and the like. Through such a configuration, the space between the light guide plates 2920 can be uniformly maintained by the fixing units 2940, thus fixing the light guide plates 2920, a movement of the light guide plates 2920 otherwise due to an external impact or the like can be prevented, and a contraction of the light guide plates 2920 in the direction (X axis) perpendicular to the direction in which light proceeds can be properly coped with (handled). Also, even if the substrate 2931 contracts in the longer axis direction (X axis) of the second through hole 2931*a* of the substrate 2931, formed to have the longer axis direction and the shorter axis direction due to the second through hole 2931*a*, it can be properly managed.

In addition, through the first through hole 2910*a* of the lower cover 2910 having the longer axis direction (Y axis) formed along the light processing direction and the fixing unit 2940 fastened to the first through hole 2910*a*, when the light guide plate 2920 expands and/or contracts, the light guide plate 2920, the fixing unit 2940 and/or the substrate 2931 may move together along the longer axis direction (Y axis) of the first through hole 2910*a* of the lower cover 2910, so that the uniform space between the light guide plates 2920 and the LED packages 2932 can be maintained, decreasing the incidence of a spot or a Becke line phenomenon when compared with the conventional art.

A liquid crystal display (LCD) device, according to an exemplary embodiment of the present invention, includes the LED backlight apparatus according to the exemplary embodiments described above and also a liquid crystal panel (not shown) provided on the optical member. In this case, the LCD device may additionally include a mold structure of main support in order to prevent distortion of the LCD against an external impact or the like, and in this case, the backlight apparatus is provided at a lower side of the main support and the liquid crystal panel is loaded at an upper side of the main support. The liquid crystal panel is formed by attaching a thin film transistor (TFT) array substrate and a color filter substrate and includes a liquid crystal layer injected between the two substrates.

Signal wirings such as gate lines, data lines, and the like, are formed to cross each other on the TFT array substrate, and a TFT is formed at each crossing of the data line and the gate line. The TFT switches video signals, namely, data signals of red (R), green (G), and blue (B), to be transmitted to liquid crystal cells of the liquid crystal layer from the data lines in response to scan signals provided through the gate lines. Also, pixel electrodes are formed at a pixel area between the data line and the gate line.

On the color filter substrate, there are disposed black matrices formed to correspond to the gate lines and the data lines of the TFT array substrate, color filters formed on regions demarcated by the black matrixes to provide red (R), green (G), and blue (B) colors, a common electrode provided on the black matrixes and the color filters, and the like.

Data pads extending from the data lines and gate pads extending from the gate lines are formed on edge portions of the TFT array substrate to which the color filter substrate is attached. A gate driver and a data driver are connected to the data pads and the gate pads, respectively, in order to apply signals. An upper cover is provided on the liquid crystal panel, covering the edge portions of the four sides of the liquid crystal panel and fixed to the lower cover 2910 or to a side wall of the main support. The upper cover is made of the same material as that of the lower cover 2910.

Figure 70:
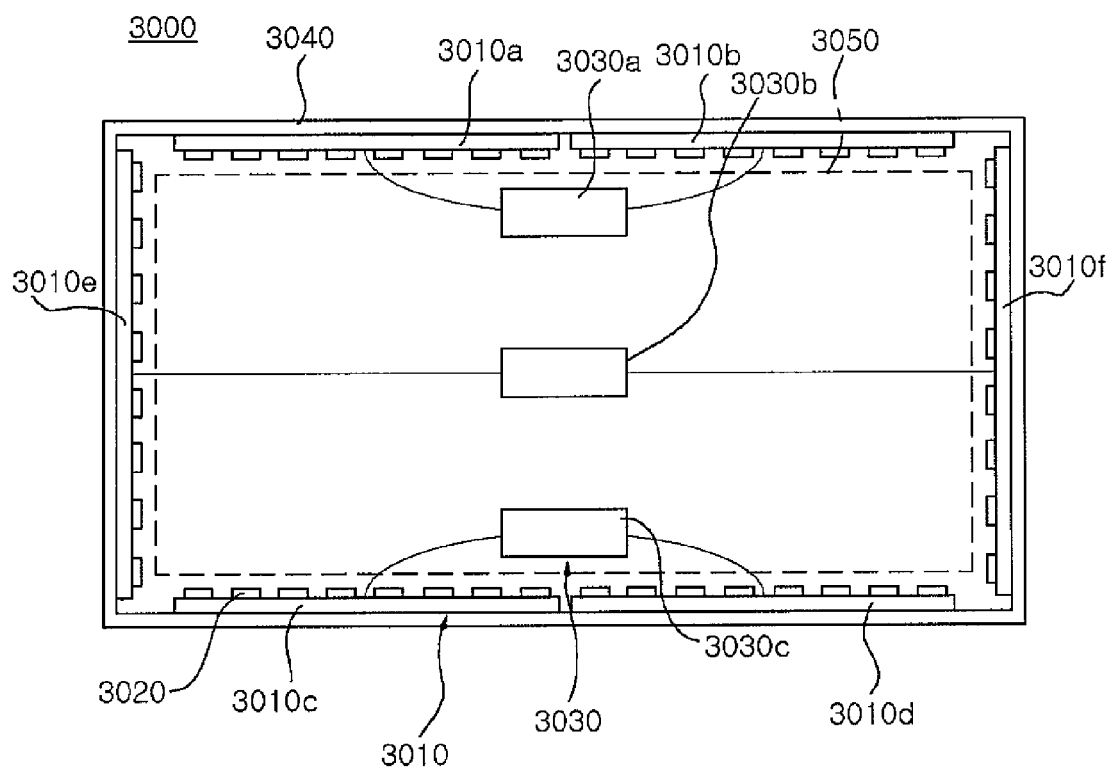
FIG. 70 is a plan view schematically showing a backlight unit according to a fourth exemplary form of the present invention.
Figure 71:
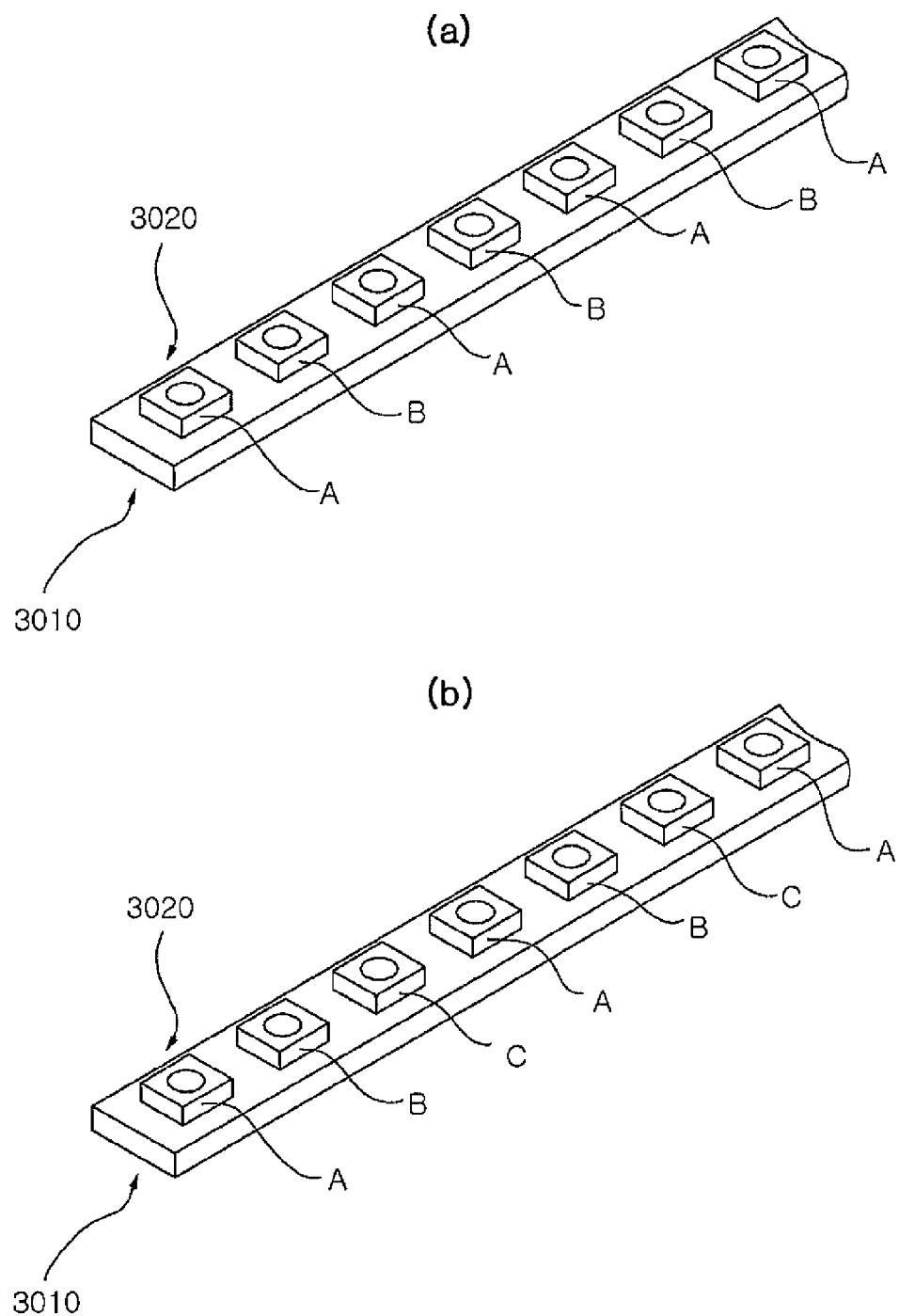
FIGS. 71(a) and (b) are perspective views showing examples of LED combinations mounted on LED modules illustrated in FIG. 70.
Figure 72:
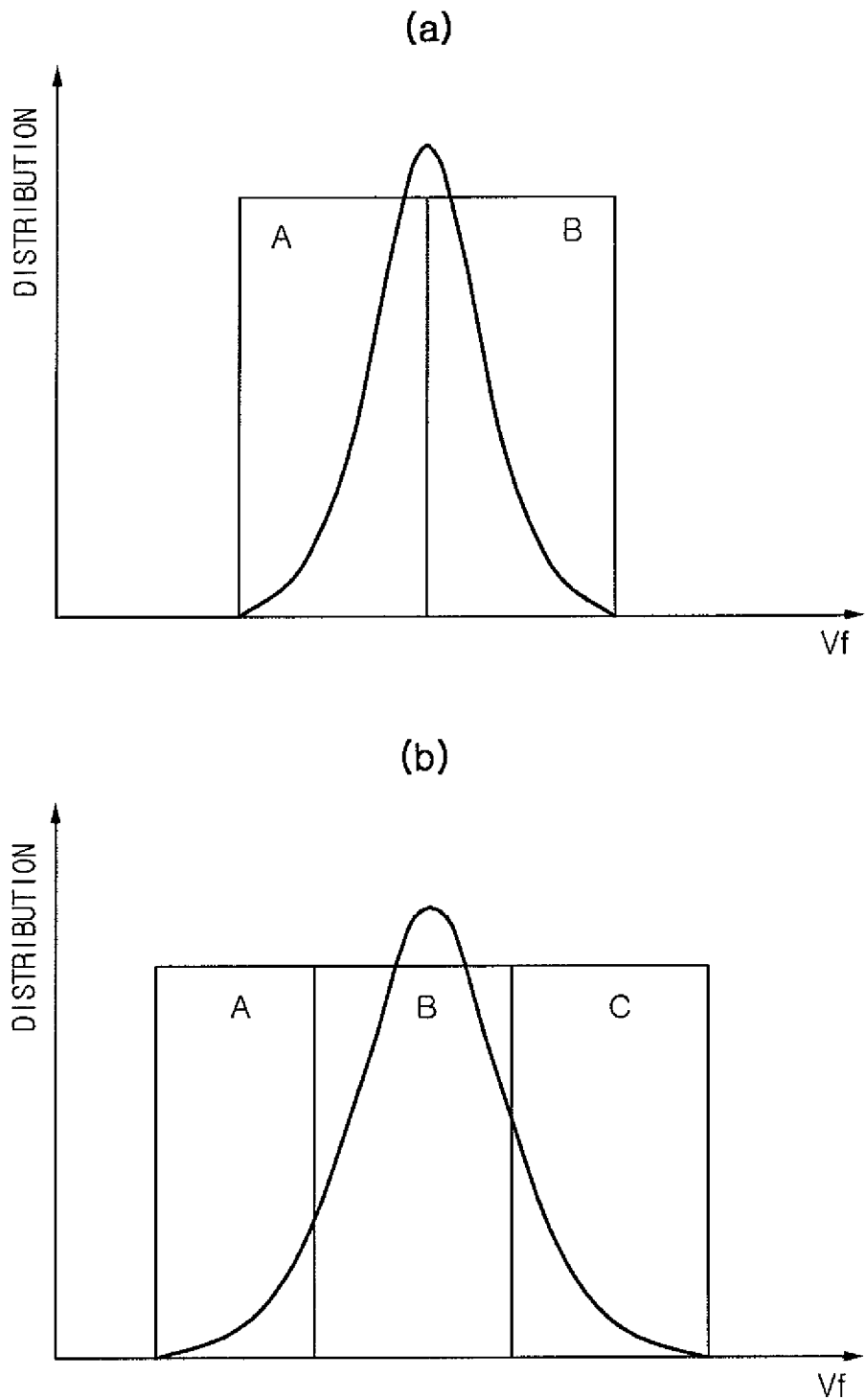
FIGS. 72(a) and (b) are graphs showing an LED distribution according to a forward voltage.

FIG. 70 is a plan view schematically showing a backlight unit according to a fourth exemplary form of the present invention, FIG. 71 is a perspective view showing examples of LED combinations mounted on LED modules illustrated in FIG. 70, and FIG. 72 is a graph showing an LED distribution according to a forward voltage.

With reference to FIGS. 70 to 72, a backlight unit according to the fourth exemplary form of the present invention includes a plurality of LED modules 3010 having a plurality of LEDs 3020 and one or more drivers 3030 for adjusting the brightness of the plurality of LEDs 3020 provided in the plurality of LED modules 3010. Hereinafter, an edge type backlight unit in which LED modules 3010 are disposed to be employed as linear light sources facing one side or a plurality of sides of the light guide plate 3050 along an inner side of a frame 3040 will be described as a reference. However, the present invention is not limited thereto and a direct type backlight unit can be also used, a device which merely differs in the disposition of the LED modules, so a detailed description thereof will be omitted.

The LED module 3010, which includes a plurality of LEDs 3020 to emit white light, can be a unit employed as a surface light source or a linear light source with a certain area by itself, and may include a sub-mount such as a substrate and the plurality of LEDs 3020 mounted thereupon. Here, preferably, the plurality of LEDs 3020 are white LEDs, but the present invention is not necessarily limited thereto. For example, LEDs emitting blue light may be implemented and phosphors may be placed on the color filter substrate.

As shown in FIG. 71, the plurality of LEDs 3020 included in each of the LED modules 3010 are mounted on the substrate and are electrically connected to each other, and in this case, the plurality of LEDs 3020 provided in each LED module form an LED array with the LEDs connected in series. The present invention is characterized in that the LED characteristics are divided into certain sections which are combined to form the LED array provided in each LED module 3010. In general, single LED products manufactured by packaging an LED chip have the characteristics of color coordinates, luminance, forward voltage ($V_f$), wavelength, and the like, corresponding to a section of a particular range, and the values of the characteristics are not the same for every LED single product but have a slight difference, exhibiting a dispersion. Namely, the range section of the color coordinates and the range section of the forward voltage of each of the single LED products are not all consistent but may have a difference in an upper limit value or a lower limit value. Thus, in forming an LED array by mounting a plurality of LEDs 3020, if LEDs having characteristics corresponding only to a particular range section only are mounted, for example, if only LEDs having a high forward voltage ($V_f$) are mounted to form an LED array, or if only LEDs having a low forward voltage ($V_f$) are mounted to form an LED array, there would be much voltage difference ($\Delta V$) to degrade luminance uniformity to cause blurs on the screen.

Thus, in an exemplary embodiment of the present invention, the forward voltage ($V_f$) of the plurality of LEDs, among the characteristics of the LEDs, is divided into a plurality of sections according to LED distribution, LEDs having a forward voltage corresponding to each section are alternately mounted by section to form an LED array. Here, the forward voltage ($V_f$) refers to a voltage applied to both ends of an LED terminal connected in a forward direction.

FIGS. 72(a) and 72(b) are graphs showing LED distribution according to the forward voltage ($V_f$). As shown in FIG. 72(a), when the range of the forward voltage ($V_f$) of the LEDs 3020 is narrow, the range may be divided into two sections (sections A and B) based on the center of the distribution. In this case, the mounted LED 3020s are classified into two types: one having the forward voltage corresponding to the section A and the other having the forward voltage corresponding to the section B, and they are alternately mounted to form an LED array. FIG. 72(a) illustrates an LED array in which the LEDs are combined in the order of ABAB . . . , but the present invention is not limited thereto and the LEDs can also be mounted according to various other combination methods such as AABB, ABBA, etc., to form an LED array.

With reference to FIG. 72(b), when the range of the forward voltage ($V_f$) of LEDs is wide, the range can be divided into three sections (sections A, B, and C). In this case, the types of the mounted LEDs 3020 are classified into a type of LED 3020 having the forward voltage corresponding to section A, a type of LED 3020 having the forward voltage corresponding to section B, a type of LED 3020 having the forward voltage corresponding to section C, and these types of LEDs 3020 are alternately mounted to form an LED array. FIG. 72 illustrates an LED array in which the LEDs are combined in the order of ABCABC . . . , but the present invention is not limited thereto and the LEDs can be mounted according to various other combination schemes such as ABAC, ABBC, and the like, to form an LED array. Also, in FIGS. 71 and 72, the range of the forward voltage ($V_f$) is divided into two or three sections, but the present invention is not limited thereto, and the range of the forward voltage ($V_f$) may be divided into various other sections.

Because the LEDs 3020, each having the forward voltage ($V_f$) corresponding to each section, are alternately mounted, an average value of the forward voltage of the LED module 3010 including the LEDs 3020 can be estimated and the dispersion can be reduced to be set to have a particular value range. Also, because the deviation of the forward voltages ($V_f$) between the LEDs 3020 connected in series within the module is reduced, the voltage difference ($\Delta V$) between the LED modules 3010 can be reduced to obtain an overall uniform luminance.

One or more drivers 3030 are provided to adjust the brightness of the plurality of LEDs 3020 provided in each of the plurality of LED modules 3010, and electrically connected with the LED modules 3010. Although not shown, a sensor may be provided to sense light emitted from the LEDs to compare a predetermined luminance and color sense and a detected luminance and color sense so that the brightness of LEDs can be adjusted by compensating for the difference. Also, a controller may be further provided to be connected with the driver 3030 to control the driver 3030. As illustrated, the LED modules 3010 are connected with one driver 3030, and the driver 3030 is connected with two or more LED modules 3010. In this case, the LED modules 3010 connected with the same driver 3030 have forward voltages having a small voltage difference therebetween or the same range of forward voltages. This can be adjusted by combining the LEDs according to the divided sections of the forward voltage with respect to the plurality of LEDs 3020 mounted on each LED module 3010. Accordingly, each LED module 3010 has a connection structure in which one LED module 3010 is connected in parallel with another LED module 3010 which is connected with the same driver 3030.

With reference to FIG. 70, the first and second LED modules 3010a and 3010b having a small voltage difference are connected with a first driver 3030a, forming a connection structure. The third and fourth LED modules 3010c and 3010d are connected with a third driver 3030c, forming a connection structure. The fifth and sixth LED modules 3010e and 3010f are connected with a second driver 3030b, forming a connection structure. Namely, two or more LED modules 3010 having a small voltage difference can be integrally driven by a single driver 3030. Thus, compared with the related art backlight unit in which each LED module has an individual driver, in the backlight unit according to the present exemplary embodiment, the overall number of drivers is reduced to make the backlight unit more compact and slimmer and to allow for a reduction in the number of electric and electronic components required for the backlight unit. Also, because the number of drivers is reduced, the drivers for compensating the optical characteristics of the backlight unit can be easily controlled, achieving the effect of improving picture quality.

Figure 73:
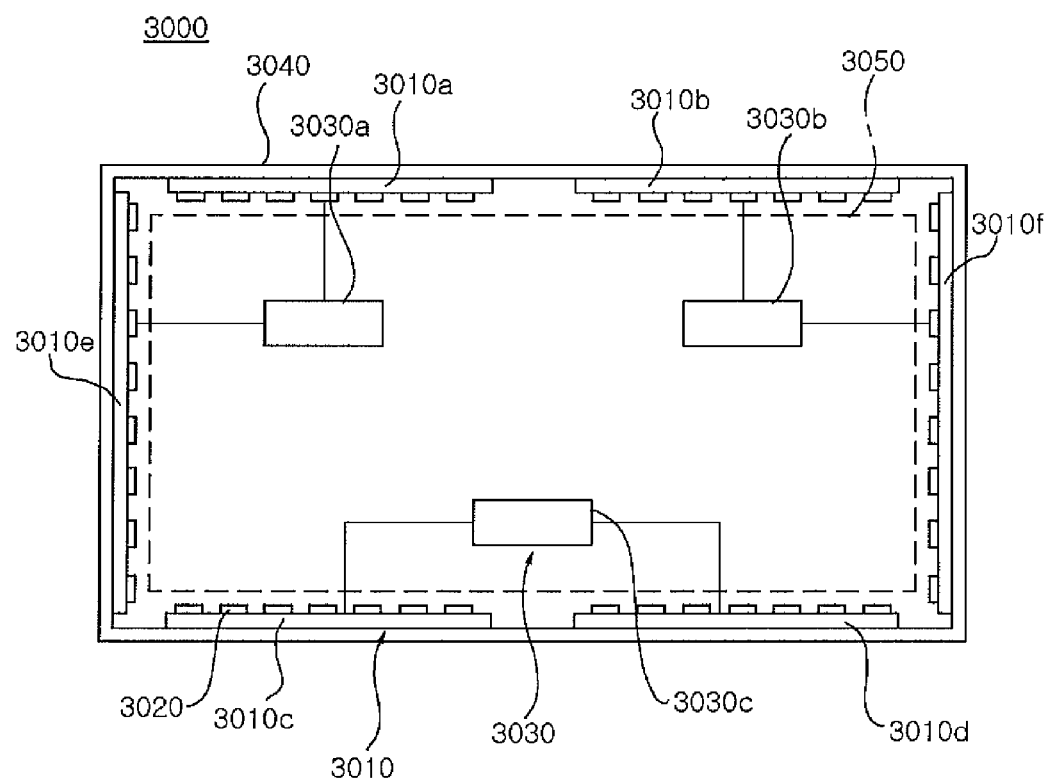
FIGS. 73 and 74 are plan views showing examples of various connection structures of LED modules and drivers of the backlight unit illustrated in FIG. 70.
Figure 74:
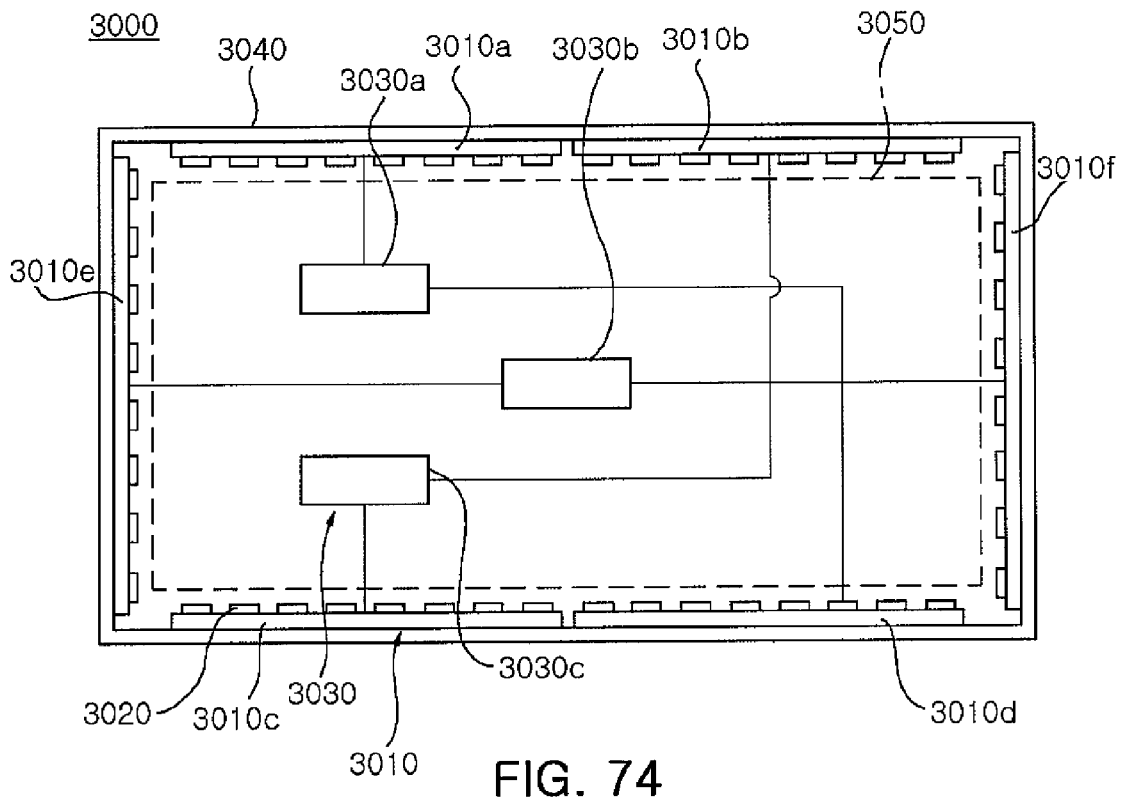

FIGS. 73 and 74 are plan views showing examples of various connection structures of LED modules and drivers. The first driver 3030a is connected with the first and fifth LED modules 3010a and 3010e, forming a connection structure, and the second driver 3030b is connected with the second and sixth LED modules 3010b and 3010f, forming a connection structure, and the third driver 3030c is connected with the third and fourth LED modules 3010c and 3010d, forming a connection structure.

In the exemplary embodiment of the present invention illustrated in FIG. 74, the first and fourth LED modules 3010a and 3010d are connected to the first driver 3030a, forming a connection structure, fifth and sixth LED modules 3010e and 3010f are connected to the second driver 3030b, forming a connection structure, and second and third LED modules 3010b and 3010c are connected to the third driver 3030c, forming a connection structure. However, the present invention is not limited thereto, and the LED modules 3010 connected to the respective drivers 3030 may have various other combinations of connection structures. Also, only the LED modules that are commonly connected to the driver 3030 are electrically connected with each other, and LED modules connected to different drivers are not electrically connected.

The surface light source apparatus and backlight unit according to exemplary embodiments of the present invention may include an LED driving circuit that can be directly used for AC power without a conversion unit for converting it into DC power and include an LED array device implemented according to such LED driving circuit. The LED driving circuit and LED array device will now be described in detail with reference to FIGS. 75 to 79.

Figure 75:
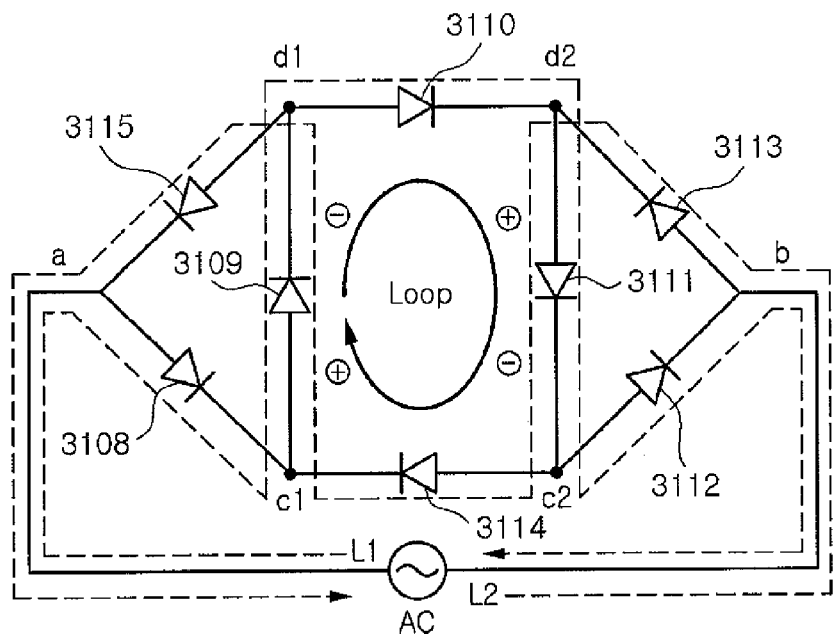
FIGS. 75 to 79 are schematic views showing light emitting device driving circuits according to various exemplary forms of the present invention.
Figure 76:
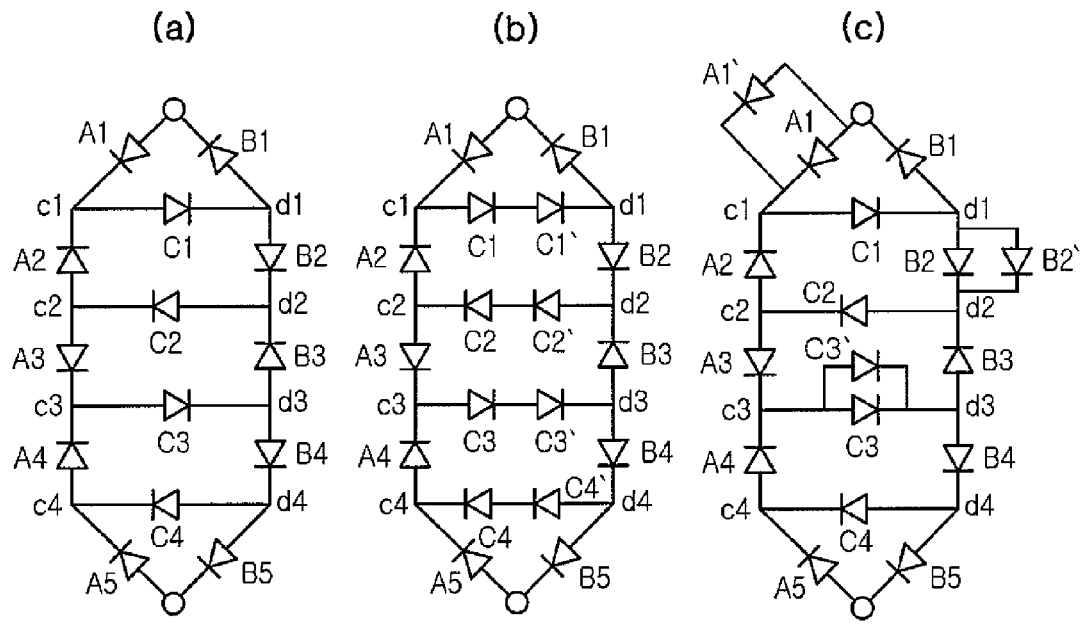

First, FIG. 75 illustrates an LED driving circuit according to an exemplary form of the present invention. The LED driving circuit illustrated in FIG. 75 includes a trapezoid network LED circuit. Namely, the trapezoid network LED circuit, according to the present exemplary embodiment, includes three first branches connected by first intermediate contact points c1 and c2 between first and second contact points a and b, and three second branches connected by second intermediate contact points d1 and d2 between the first and second contact points a and b. The LED driving circuit includes two intermediate branches connected between the first and second intermediate contact points c1 and d1, and c2 and d2) in order. Here, LEDs 3108, 3109, 3110, 3111, 3112, 3113, 3114, and 3115 are disclosed at the first, second, and the intermediate branches, respectively.

The LED driving circuit has two current loops L1 and L2. The first current loop L1 includes LEDs 3108, 3109, 3110, 3111, and 3112 connected in series so as to be driven at a first half period of an AC voltage. The second current loop L2 includes LEDs 3113, 3111, 3114, 3109, and 3115 connected in series so as to be driven at a second half period of the AC voltage. In this manner, in the circuit in the AC voltage-applied state, the LEDs 3109 and 3111 can be driven in both directions.

When the order starting from the first contact point (a) to the first and second branches and the intermediate branches is defined as m, the LED arrangement in the trapezoid network circuit may be described as follows. The LEDs 3108, 3109, 3110, 3111, 3112, 3113, 3114, and 3115 may be divided into first and second LED groups according to the driving-available period of the AC voltage. The first LED group includes LEDs 3108, 3109, 3110, 3111, 3112, 3113, 3114, and 3115 belonging to an odd number (2m−1)th first branch, every intermediate branch, and an even number 2mth second branch, and are connected to each other in series. The second LED group includes LEDs 3113, 3111, 3114, 3109, and 3115 belonging to an even number 2mth first branch, every intermediate branch, and odd number (2m−1)th second branch, and are connected to each other in series in a reverse polarity direction.

Accordingly, the first LED group may form the first current loop L1 driven at the first half period of the AC voltage, and the second LED group may form the second current loop (L2) driven at the second half period of the AC voltage. According to this driving, the LEDs 3109 and 3111 positioned at the intermediate branches and commonly belonging to the first and second LED groups can continuously operate within the entire period of the AC voltage.

Thus, because the two LEDs 3110 and 3114 can be driven at the entire period of the AC voltage in the LED driving circuit including the eight LEDs 3108, 3109, 3110, 3111, 3112, 3113, 3114, and 3115, the five LEDs which emit light continuously in the actual trapezoid network circuit can be secured (the number of driven LEDs versus the number of employed LEDs: 62.5 percent). This is an increased numeric value compared with that of the reverse polarity arrangement (50 percent) or a bridge arrangement (generally, 60 percent), the related art AC driving type LED arrangements.

The LED driving circuit according to an exemplary embodiment of the present invention is greatly different from the bridge structure in that the LEDs 3109 and 3111 are connected in series, not in parallel. That is, in the LED driving circuit according to an exemplary embodiment of the present invention, the LEDs 3110 and 3114 are inserted between the LEDs 3109 and 3111, so the LEDs 3109 and 3111 are connected in series, and in this sense, the LED arrangement has the trapezoid network structure basically different from the bridge structure.

In the LED driving circuit according to an exemplary embodiment of the present invention, as for a connection of LEDs which are all driven at the entire period of the AC voltage, namely, in both directions, the LEDs 3110 and 31114 are inserted to connect four intermediate contact points c1, c2, d1, and d2 to form a serial connection, rather than a parallel connection. In terms of this LED arrangement connection structure, a single loop is formed, and in the actual driving operation, as described above, a potential difference of each of the LEDs is different in the loop configured with the intermediate contact points, a current loop is not formed and the LEDs operate in a single serial form.

In a different exemplary embodiment of the present invention, in the trapezoid network structure illustrated in FIG. 75, when the loop connecting the first and second intermediate contact points is a single stack, various LED driving circuits can be provided by continuously connecting a plurality of stacks. Namely, three or more, but the same number of first and second intermediate contact points may be provided, and four or more, but with the same number of first and second branches, may be provided.

FIG. 76(a) illustrates another exemplary embodiment of the present invention, showing an LED driving circuit including four first and second intermediate contact points (c1, c2, c3, c4 and d1, d2, d3, d4). The LED driving circuit illustrated in FIG. 76(a) includes four intermediate branches connecting the first and second intermediate contact points in the order. This driving circuit may be understood as a trapezoid network circuit having three stacks. In FIG. 76(a), one LED is disposed at each branch. In this LED arrangement, the LEDs are arranged to have first and second current loops driven at different half periods of the AC voltage. Namely, the corresponding LEDs are arranged to have the first current loop along A1-C1-B2-C2-A3-C3-B4-C4-A5 at the first half period of the AC voltage, and the corresponding LEDs are arranged to have the second current loop along B1-C1-A2-C2-B3-C3-A4-C4-B5 at the second half period of the AC voltage.

In the LED driving circuit according to the present exemplary form, four LEDs C1, C2, C3, and C4 positioned at the intermediate branches and commonly integrated in the first and second current loops can operate continuously within the entire period of the AC voltage. In this manner, because the four LEDs C1, C2, C3, and C4 of the LED driving circuit including a total of fourteen LEDs are driven within the entire period of the AC voltage, nine LEDs that emit light continuously in the actual trapezoid network circuit can be secured (LED usage efficiency: approximately 64 percent). In the present exemplary form, a greater effect of reducing the number of LEDs in use can be obtained compared with the former exemplary form.

In the driving circuits illustrated in FIGS. 75 and 76(a), the first and second branches and the intermediate branches include one LED, respectively. However, alternatively, the first and second branches and the intermediate branches may include a plurality of LEDs, respectively. Also, in this case, the plurality of LEDs belonging to the same branch must be connected in series. In particular, when the number of LEDs of the intermediate branches is increased, the number of LEDs driven in both directions is relatively increased, significantly improving luminous efficiency with respect to the number of LEDs utilized, and as a result, the number of LEDs used for obtaining a desired level of luminosity at the AC voltage can be reduced.

An LED driving circuit illustrated in FIG. 76(b) has a form such that two LEDs connected in series are disposed at each intermediate branch, in the LED driving circuit illustrated in FIG. 76(a). The corresponding LEDs are arranged in series to have the first current loop along A1-C1-C1'-B2-C2-C2'-A3-C3-C3'-B4-C4-C4'-A5 at the first half period of the AC voltage, and the corresponding LEDs are arranged in series to have the second current loop along B1-C1-C1'-A2-C2-C2'-B3-C3-C3'-A4-C4-C4'-B5 at the second half period of the AC voltage. In the LED driving circuit according to the present exemplary form, eight LEDs (C1, C1', C2, C2', C3, C3', C4, C4') belong to the intermediate branches. Namely, the LEDs (C1,C1',C2,C2',C3,C3',C4,C4') commonly involved in the first and second current loops so as to operate continuously within the entire period of the AC voltage are doubled compared with the LED driving circuit illustrated in FIG. 76(a). Consequently, because the eight LEDs (C1, C1', C2, CT, C3, C3', C4, C4') in the LED driving circuit including a total of eighteen LEDs are driving during the entire period of the AC voltage, thirteen LEDs that emit light continuously in the actual trapezoid network circuit can be secured (LED usage efficiency: approximately 72 percent). In this exemplary embodiment, an even greater effect of reducing the number of LEDs in use can be obtained compared with the former exemplary embodiments.

An LED driving circuit illustrated in FIG. 76(c), has a form such that LEDs (A1', B2', C3') are disposed to be connected in series at the first branch, the second branch, and the third intermediate branch, in the LED driving circuit illustrated in FIG. 76(a). The corresponding LEDs are arranged in series to have the first current loop along (A1,A1')-C1-(B2,B2')-C2-A3-(C3,C3')-B4-C4-A5 at the first half period of the AC voltage, and the corresponding LEDs are arranged in series to have the second current loop along B1-C1-A2-C2-B3-(C3,C3')-A4-C4-C4'-B5 at the second half period of the AC voltage (In this case, the LEDs indicated in the parenthesis are connected to each other in parallel). The increase in the number of LEDs positioned in the intermediate branches triggers an increase in the LEDs driven in both directions, so it is advantageous in terms of improvement of LED usage efficiency. However, if only the number of LEDs positioned at the intermediate branches increases, a reverse voltage applied to the LEDs belonging to the first and second branches would increase, so when the respective LEDs have the same standard, preferably, two or three LEDs are selectively positioned at the intermediate branches.

In a particular exemplary form of the present invention, a plurality of trapezoid network circuits may be provided, and in this case, a second contact point of one trapezoid network circuit may be connected with a first contact point of another trapezoid network circuit, connecting the trapezoid network circuits in series. This exemplary form is illustrated in FIG. 77.

Figure 77:
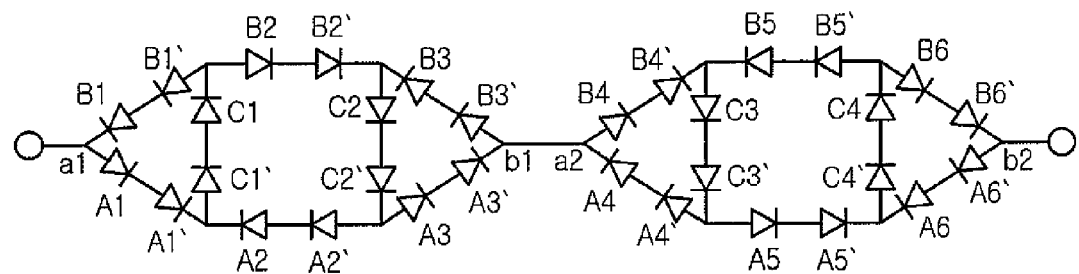

With reference to FIG. 77, an LED driving circuit has a structure in which two trapezoid network circuits are connected in series. Namely, a second contact point (b1) of a first trapezoid network circuit and a first contact point (a2) of the second trapezoid network circuit are connected, and a first contact point (a1) of the first trapezoid network circuit and a second contact point (b2) of the second trapezoid network circuit are connected to an AC power source stage. Also, in the present exemplary form, two LEDs connected in series are disposed at the first, second and intermediate branches.

In the case of the LED driving circuit illustrated in FIG. 77, the corresponding LEDs are arranged in series to have the first current loop along A1-A1'-C1-C1'-B2-B2'-C2-C2'-A3-A3' (first trapezoid network circuit)-B4-B4'-C3-C3'-A5-A5'-C4-C4'-B6-B6' (second trapezoid network circuit) at the first half period of the AC voltage, and the corresponding LEDs are arranged in series to have the second current loop along B1-B1'-C1-C1'-A2-A2'-C2-C2'-B3-B3' (first trapezoid network circuit)-A4-A4'-C3-C3'-B5-B5'-C4-C4'-A6-A6' (second trapezoid network circuit) at the second half period of the AC voltage.

In the LED driving circuit according to the present exemplary form, eight LEDs (C1, C1', C2, C2', C3, C3', C4, C4') belong to the intermediate branches. Namely, the LEDs (C1, C1', C2, C2', C3, C3', C4, C4') commonly involved in the first and second current loops so as to operate continuously within the entire period of the AC voltage is doubled compared with the LED driving circuit illustrated in FIG. 76(a). In this manner, the LED arrangement for AC driving in the trapezoid network structure according to the present invention can be applicable in various forms.

In another aspect of the present invention, the LED driving circuits in the various trapezoid network structures as described above can be implemented as an LED array device having a plurality of LEDs. Namely, in the LED array device according to the present invention, K (K≥3, where K is an integer) number of first LEDs are connected in parallel to have n number of first intermediate contact points to which electrodes of the same polarity are connected between first and second contact points. L (L≥3, where L is an integer) number of second LEDs are connected in parallel to have n number of second intermediate contact points to which electrodes of the same polarity are connected between the first and second contact points, and electrodes of the opposite polarity of that of the electrodes of the first LEDs connected with the first and second contact points are connected with the first and second contact points.

Also, M (M≥n, where M is an integer) number of third LEDs corresponding to the intermediate branches of the circuit are connected such that electrodes having the opposite polarity of the electrodes of the first and second LEDs are connected with the same mth first and second intermediate contact points (here, M is a positive integer defining the order of the n number of first and second intermediate contact points starting from the first contact point). The first and second LEDs may be positioned between the respective intermediate contact points one by one. Similarly, the third LED may be connected one by one between the first and second intermediate contact points.

If necessary, a plurality of third LEDs may be connected between the at least one first and second intermediate contact points, and the third LEDs may be connected in series or in parallel between the at least one first and second intermediate contact points (See FIG. 76(b) or 76(c)).

In order to explain the effect of reducing the number of LEDs in use of the trapezoid network LED driving circuit according to the present invention, the number of the LEDs required for satisfying particular output conditions by using the same LEDs and that of the related art AC driving type LED circuits (bipolar circuit and bridge network circuit) are compared to demonstrate the difference in the above description.

FIG. 78(a) illustrates an example of an LED driving circuit according to the related art, and FIGS. 78(b) and 78(c) illustrate examples of LED driving circuits according to the present invention.

The LED driving circuit illustrated in FIG. 78(a) is a reverse parallel circuit for a general AC driving, having a structure in which LEDs 3130A and 3130B arranged in reverse parallel are connected in series to have a plurality of stages (S). As shown in Table 1, although the stacks are increased overall, the ratio of the number of continuously driven LEDs to the number of used LEDs (LED usage efficiency) is 50 percent.

The LED driving circuit illustrated in FIG. 78(b) is a bridge circuit, having a structure in which one LED is disposed at each branch. A single stack includes five LEDs (3140A, 3140B, 3140C, 3140D, 3140E), and a plurality of stacks can be connected to have a desired output. As shown in Table 1, a usage efficiency of the bridge network LED circuit is 60 percent regardless of the number of stacks. This is because, unlike the reserve parallel arrangement, the LED 3140E disposed in the intermediate branch can be driven continuously in both directions.

In the case of the trapezoid network LED driving circuit illustrated in FIG. 78(c), as described above with reference to FIG. 76(a), a total of eight LEDs may be used for the trapezoid network circuit with two stacks and five LEDs are continuously driven, resulting in a high usage efficiency of 62.5 percent. Also, as shown in Table 1, the ratio of the number of LEDs driven in both directions increases as the number of stacks increases in the trapezoid network LED driving circuit, and thus the LED usage efficiency gradually increases.

TABLE 1

| Reverse parallel network | | | | |
|---|---|---|---|---|
| Number of stacks | $V_f$ | Number of LEDs | Number of LEDs active in both directions | Efficiency (%) |
| 1 | $\Delta V_f$ | 2 | 0 | 50 |
| 2 | $2 \cdot \Delta V_f$ | 4 | 0 | 50 |
| 3 | $3 \cdot \Delta V_f$ | 6 | 0 | 50 |
| 4 | $4 \cdot \Delta V_f$ | 8 | 0 | 50 |
| 5 | $5 \cdot \Delta V_f$ | 10 | 0 | 50 |

TABLE 1-continued

| 6 | $6 \cdot \Delta V_f$ | 12 | 0 | 50 |
| 7 | $7 \cdot \Delta V_f$ | 14 | 0 | 50 |
| 8 | $8 \cdot \Delta V_f$ | 16 | 0 | 50 |
| 9 | $9 \cdot \Delta V_f$ | 18 | 0 | 50 |
| 10 | $10 \cdot \Delta V_f$ | 20 | 0 | 50 |
| 21 | $21 \cdot \Delta V_f$ | 42 | 0 | 50 |
| 30 | $30 \cdot \Delta V_f$ | 60 | 0 | 50 |
| 63 | $63 \cdot \Delta V_f$ | 126 | 0 | 50 |

| Bridge network | | | | |
|---|---|---|---|---|
| Number of stacks | $V_f$ | Number of LEDs | Number of LEDs active in both directions | Efficiency (%) |
| 1 | $3 \cdot \Delta V_f$ | 5 | 1 | 60 |
| 2 | $6 \cdot \Delta V_f$ | 10 | 2 | 60 |
| 3 | $9 \cdot \Delta V_f$ | 15 | 3 | 60 |
| 4 | $12 \cdot \Delta V_f$ | 20 | 4 | 60 |
| 5 | $15 \cdot \Delta V_f$ | 25 | 5 | 60 |
| 6 | $18 \cdot \Delta V_f$ | 30 | 6 | 60 |
| 7 | $21 \cdot \Delta V_f$ | 35 | 7 | 60 |
| 8 | $24 \cdot \Delta V_f$ | 40 | 8 | 60 |
| 9 | $27 \cdot \Delta V_f$ | 45 | 9 | 60 |
| 10 | $30 \cdot \Delta V_f$ | 50 | 10 | 60 |
| 21 | $63 \cdot \Delta V_f$ | 105 | 21 | 60 |
| 30 | $90 \cdot \Delta V_f$ | 150 | 30 | 60 |
| 63 | — | — | — | — |

| Trapezoid network | | | | |
|---|---|---|---|---|
| Number of stacks | $V_f$ | Number of LEDs | Number of LEDs active in both directions | Efficiency (%) |
| 1 | $5 \cdot \Delta V_f$ | 8 | 2 | 62.5 |
| 2 | $7 \cdot \Delta V_f$ | 11 | 3 | 63.6 |
| 3 | $9 \cdot \Delta V_f$ | 14 | 4 | 64.3 |
| 4 | $11 \cdot \Delta V_f$ | 17 | 5 | 64.7 |
| 5 | $13 \cdot \Delta V_f$ | 20 | 6 | 65 |
| 6 | $15 \cdot \Delta V_f$ | 23 | 7 | 65.2 |
| 7 | $17 \cdot \Delta V_f$ | 26 | 8 | 65.4 |
| 8 | $19 \cdot \Delta V_f$ | 29 | 9 | 65.5 |
| 9 | $21 \cdot \Delta V_f$ | 32 | 10 | 65.6 |
| 10 | $23 \cdot \Delta V_f$ | 35 | 11 | 65.7 |
| 21 | $45 \cdot \Delta V_f$ | 68 | 22 | 66.2 |
| 30 | $63 \cdot \Delta V_f$ | 95 | 31 | 66.3 |
| 63 | — | — | — | — |

Accordingly, when an output of nine LEDs is requested, the reverse parallel LED circuit illustrated in FIG. 78(a) needs a total of eighteen LEDs and the bridge network LED circuit needs a total of fifteen LEDs by connecting the three stacks. In comparison, the trapezoid network LED circuit according to the present invention can provide the desired quantity of light (nine LEDs) with a total of fourteen LEDs by connecting the three stacks, so that the number of LEDs needed can be further reduced, even when compared with a bridge LED circuit.

Such an improvement effect further increases in a larger output specification. Namely, when an output of 63 LEDs is requested, the reverse parallel circuit and the bridge network circuit need 126 LEDs and 105 LEDs, respectively, to form the AC driving circuit, but the trapezoid network LED circuit needs only 95 LEDs, a reduction of 31 LEDs and 10 LEDs respectively, compared to related art examples.

The reason for this improvement is because, in the case of the bridge LED circuit, at least two or more LEDs are positioned in the current loop between the LEDs commonly driven in both directions, while in the case of the trapezoid network LED circuit, the minimum one LED is sufficient to be disposed between the commonly used LEDs. Namely, the minimum number of LEDs required between the LEDs commonly used in both directions is smaller in the trapezoid network LED circuit than in the bridge network circuit, so the trapezoid network LED circuit has a structure in which a larger number of LEDs can be used commonly in both directions overall as compared with the bridge LED circuit structure.

Figure 79:
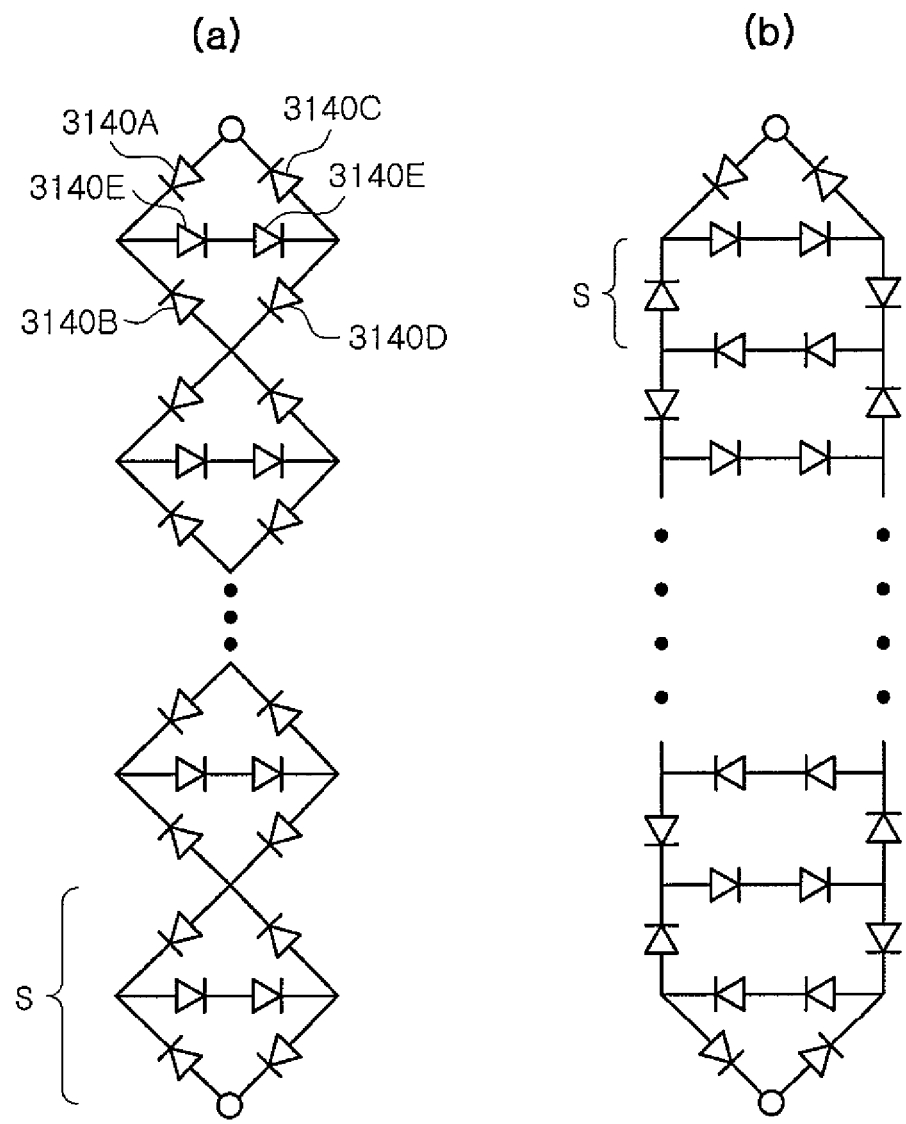

FIG. 79(*a*) illustrates another example of an LED driving circuit according to the related art, and FIG. 79(*b*) illustrates another example of an LED driving circuit according to the present invention.

Figure 78:
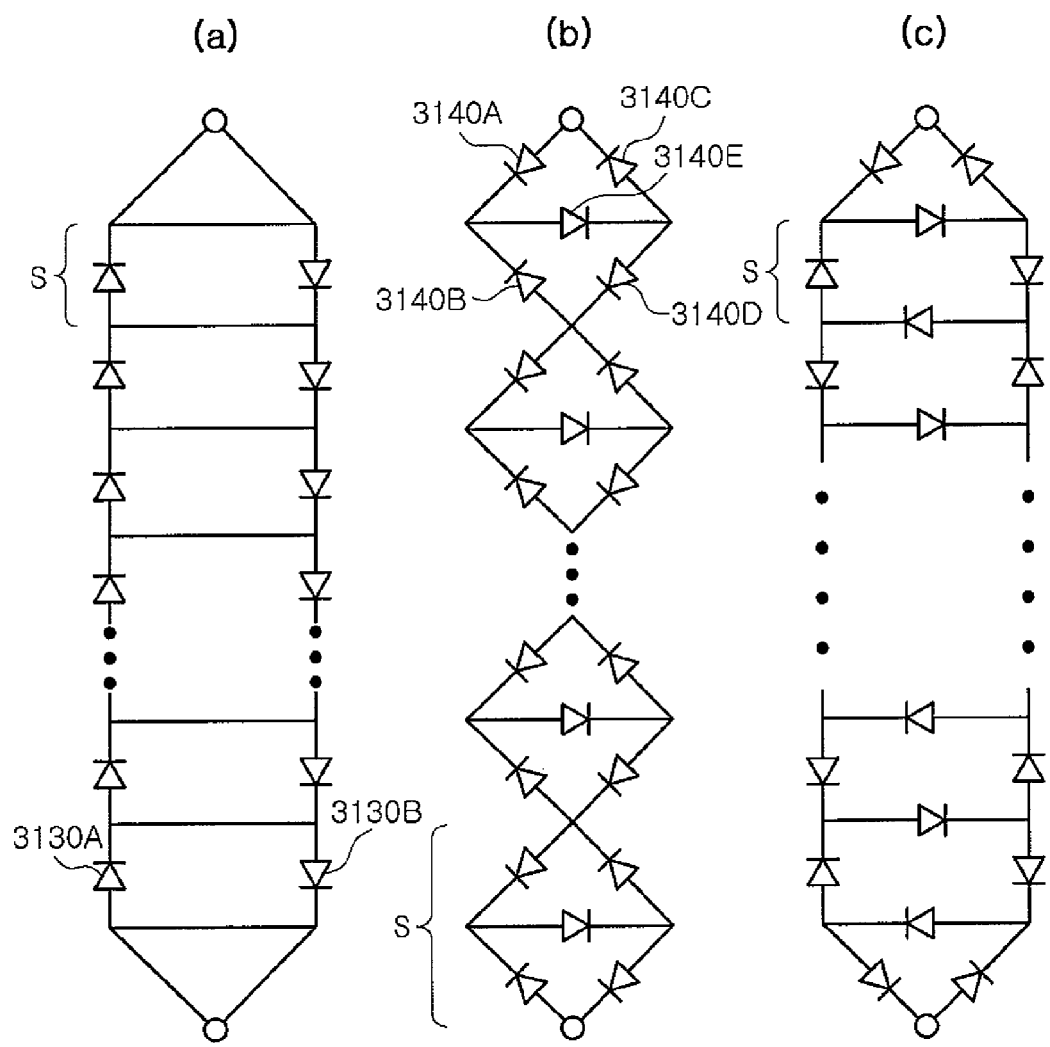

FIGS. 79(*a*) and 79(*b*) are similar to FIGS. 78(*b*) and 78(*c*), but different in that two LEDs connected in series are disposed in each intermediate branch. Namely, the number of continuously driven LEDs is increased to the same level. The trapezoid network LED driving circuit illustrated in FIG. 79(*b*) can be understood with reference to the configuration illustrated in FIG. 76(*b*).

TABLE 2

| | Reverse parallel network | | | |
|---|---|---|---|---|
| Number of stacks | $V_f$ | Number of LEDs | Number of LEDs active in both directions | Efficiency (%) |
| 1 | $\Delta V_f$ | 2 | 0 | 50 |
| 2 | $2 \cdot \Delta V_f$ | 4 | 0 | 50 |
| 3 | $3 \cdot \Delta V_f$ | 6 | 0 | 50 |
| 4 | $4 \cdot \Delta V_f$ | 8 | 0 | 50 |
| 5 | $5 \cdot \Delta V_f$ | 10 | 0 | 50 |
| 6 | $6 \cdot \Delta V_f$ | 12 | 0 | 50 |
| 7 | $7 \cdot \Delta V_f$ | 14 | 0 | 50 |
| 8 | $8 \cdot \Delta V_f$ | 16 | 0 | 50 |
| 9 | $9 \cdot \Delta V_f$ | 18 | 0 | 50 |
| 10 | $10 \cdot \Delta V_f$ | 20 | 0 | 50 |
| 13 | $13 \cdot \Delta V_f$ | 26 | 0 | 50 |
| 16 | $16 \cdot \Delta V_f$ | 32 | 0 | 50 |
| 52 | $52 \cdot \Delta V_f$ | 104 | 0 | 50 |

| | Bridge network | | | |
|---|---|---|---|---|
| Number of stacks | $V_f$ | Number of LEDs | Number of LEDs active in both directions | Efficiency (%) |
| 1 | $4 \cdot \Delta V_f$ | 6 | 2 | 66.7 |
| 2 | $8 \cdot \Delta V_f$ | 12 | 4 | 66.7 |
| 3 | $12 \cdot \Delta V_f$ | 18 | 6 | 66.7 |
| 4 | $16 \cdot \Delta V_f$ | 24 | 8 | 66.7 |
| 5 | $20 \cdot \Delta V_f$ | 30 | 10 | 66.7 |
| 6 | $24 \cdot \Delta V_f$ | 36 | 12 | 66.7 |
| 7 | $28 \cdot \Delta V_f$ | 42 | 14 | 66.7 |
| 8 | $32 \cdot \Delta V_f$ | 48 | 16 | 66.7 |
| 9 | $36 \cdot \Delta V_f$ | 54 | 18 | 66.7 |
| 10 | $40 \cdot \Delta V_f$ | 60 | 20 | 66.7 |
| 21 | $52 \cdot \Delta V_f$ | 78 | 26 | 66.7 |
| 30 | $64 \cdot \Delta V_f$ | 96 | 32 | 66.7 |
| 63 | — | — | — | — |

| | Trapezoid network | | | |
|---|---|---|---|---|
| Number of stacks | $V_f$ | Number of LEDs | Number of LEDs active in both directions | Efficiency (%) |
| 1 | $7 \cdot \Delta V_f$ | 10 | 4 | 70 |
| 2 | $10 \cdot \Delta V_f$ | 14 | 6 | 71.4 |
| 3 | $13 \cdot \Delta V_f$ | 18 | 8 | 72 |
| 4 | $16 \cdot \Delta V_f$ | 22 | 10 | 72.7 |
| 5 | $19 \cdot \Delta V_f$ | 26 | 12 | 73.1 |
| 6 | $22 \cdot \Delta V_f$ | 30 | 14 | 73.3 |
| 7 | $25 \cdot \Delta V_f$ | 34 | 16 | 73.5 |
| 8 | $28 \cdot \Delta V_f$ | 38 | 18 | 73.7 |
| 9 | $31 \cdot \Delta V_f$ | 42 | 20 | 73.8 |
| 10 | $34 \cdot \Delta V_f$ | 46 | 22 | 73.9 |
| 21 | $43 \cdot \Delta V_f$ | 58 | 28 | 74 |
| 30 | $52 \cdot \Delta V_f$ | 70 | 34 | 74.3 |
| 63 | — | — | — | — |

Accordingly, when an output of sixteen LEDs is requested, the reverse parallel LED circuit illustrated in FIG. 78(*a*) needs a total of thirty-two LEDs and the bridge network LED circuit illustrated in FIG. 79(*a*) needs a total of twenty-four LEDs. In comparison, the trapezoid network LED circuit according to the present invention can provide the desired quantity of light (sixteen LEDs) with a total of twenty-two LEDs, so the number of LEDs used can be further reduced, even compared with the bridge LED circuit.

Such an improvement effect further increases in a larger output specification. Namely, when an output of 52 LEDs is requested, the reverse parallel circuit and the bridge network circuit need 104 LEDs and 78 LEDs, respectively, to form the AC driving circuit, while the trapezoid network LED circuit requires only 70 LEDs, a reduction of 34 LEDs and 8 LEDs respectively, when compared with the related art examples.

In this manner, the trapezoid network LED driving circuit can remarkably reduce the number of LEDs in use for the same output as the bridge structure, as well as the existing reverse parallel structure under the conditions for AC driving.

An LED automatic lighting apparatus capable of reducing power consumption by automatically adjusting the brightness of LEDs in a surface light source apparatus and a backlight unit employing a light emitting device package according to various exemplary forms of the present invention will now be described.

Figure 80:
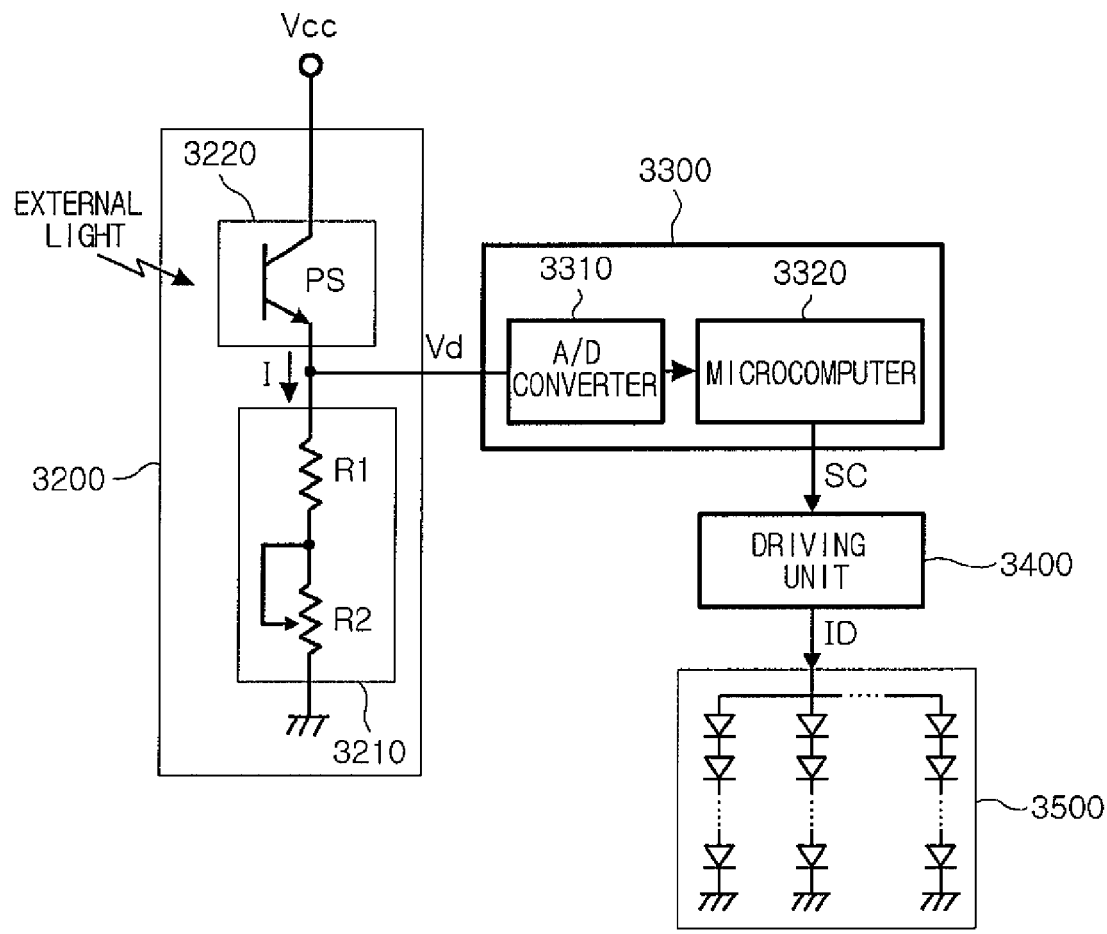
FIG. 80 is a schematic block diagram of an LED automatic lighting apparatus according to an exemplary embodiment of the present invention.

FIG. 80 is a schematic block diagram of an LED automatic lighting apparatus according to an exemplary embodiment of the present invention. With reference to FIG. 80, the LED automatic lighting apparatus according to an exemplary embodiment of the present invention includes an ambient brightness detection unit 3200 detecting ambient brightness, a lighting controller 3300 controlling driving according to the size of a detection voltage Vd generated according to a detection by the ambient brightness detection unit 3200, and a lighting driving unit 3400 generating an LED driving current according to the controlling of the driving of the lighting controller 3300. Also, the LED automatic lighting apparatus includes a plurality of LEDs, and may include an LED unit 3500 driven according to the driving current from the lighting driving unit 3400.

The ambient brightness detection unit 3200 includes a sensitivity setting unit 3210 setting a detection sensitivity for detecting an ambient brightness and a photo-sensor unit 3220 receiving external light and detecting an ambient brightness with a detection sensitivity set by the sensitivity setting unit 3210. The photo-sensor unit 3220 may include a photo-transistor PT having a collector connected to a power source stage from which operation power Vcc is received, a base for receiving external light, and an emitter connected to the sensitivity setting unit 3210. The sensitivity setting unit 3210 may be connected with the emitter of the photo-transistor PT and include a variable resistor that can be adjusted by a user and a resistor connected in series with the variable resistor.

The ambient brightness detection unit 3200 detects an ambient brightness and outputs a detection voltage Vd to the lighting controller 3300. For example, when the ambient brightness detection unit 3200 includes the sensitivity setting unit 3210 and the photo-sensor unit 3220, the sensitivity setting unit 3210 may set a detection sensitivity for detecting an ambient brightness with respect to the photo-sensor unit 3220. The photo-sensor unit 3220 may receive external light and detect an ambient brightness with the detection sensitivity set by the sensitivity setting unit 3210. In this case, the photo-sensor unit 3220 may include the photo-transistor PT having the collector connected to the power source stage from which operational power Vcc is received, the base for receiving external light, and the emitter connected to the sensitivity setting unit 3210. Also in this case, when the photo-transistor PT receives external light, it is connected so a current (I) flows from the operational power source Vcc to the photo-transistor PT and the sensitivity setting unit 3210. Namely, the current (I) is detected as the detection voltage Vd by the sensitivity setting unit 3210, and in this case, when the sensitivity setting unit 3210 is connected with the emitter of the photo-transistor PT and includes the variable resistor that can be adjusted by the user and the resistor, the tilt of the detection voltage Vd may be changed by the current (I) flowing according to a resistance value of the variable resistor.

The lighting controller 3300 may include an A/D converter 3310 converting the analog detection voltage Vd generated according to the detection by the ambient brightness detection unit 3200 into a digital detection voltage, and a microcomputer 3320 controlling driving according to the size of the digital detection voltage Vd from the A/D converter 3310. If the digital detection voltage Vd transferred from the A/D converter 3310 is lower than a pre-set first reference voltage, the microcomputer 3320 generates a pre-set driving current according to the size of a difference voltage between the first reference voltage and the digital detection voltage Vd, while if the digital detection voltage Vd transferred from the A/D converter 3310 is not lower than a pre-set first reference voltage, the microcomputer 3320 may stop lighting driving.

The lighting controller 3300 controls the driving of the lighting driving unit 3400 according to the size of the detection voltage Vd generated according to the detection by the ambient brightness detection unit 3200. For example, when the lighting controller 3300 includes the A/D converter 3310 and the microcomputer 3320, the A/D converter 3310 converts the analog detection voltage Vd generated according to the detection by the ambient brightness detection unit 3200 into the digital detection voltage and outputs the same to the microcomputer 3320. The microcomputer 3320 may control the driving according to the size of the digital detection voltage Vd transferred from the A/D converter 3310.

The lighting driving unit 3400 generates an LED driving current according to the controlling of driving by the lighting controller 200 and supplies the generated LED driving current to the LED unit 3500. As a result, when there is much external light quantity (i.e., light amount or radiation intensity), a small driving current is generated by the lighting driving unit 3400, while when there is a little light quantity, a large driving current is generated by the lighting driving unit 3400. Accordingly, the LED unit 3500 may include a plurality of LEDs, and the plurality of LEDs are driven according to the driving current delivered from the lighting driving unit 3400. In the exemplary embodiment of the present invention as described above, the brightness of the LEDs can be automatically adjusted according to the external light quantity, and power consumption can be reduced.

Figure 81:
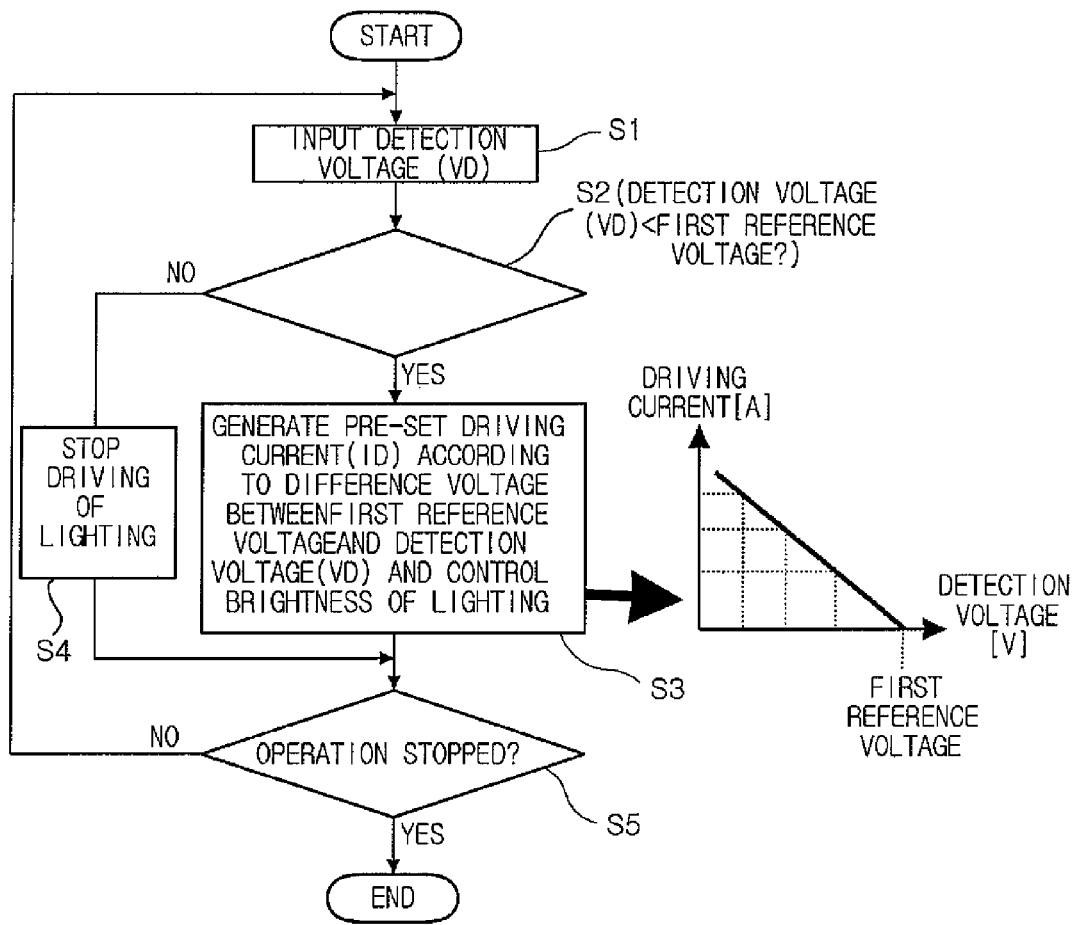
FIG. 81 is an operational flow chart of the LED automatic lighting apparatus illustrated in FIG. 80.

FIG. 81 is an operational flow chart of the LED automatic lighting apparatus illustrated in FIG. 80. In FIG. 81, the detection voltage Vd is received in step S1. The digital detection voltage Vd and the pre-set first reference voltage are compared in step S2. When the digital detection voltage Vd is lower than the pre-set first reference voltage, a pre-set driving current according to the size of a difference voltage between the first reference voltage and the digital detection voltage Vd is generated to control the brightness of lighting in step S3. When the digital detection voltage Vd is not lower than the pre-set first reference voltage, the lighting driving may be stopped in step S4. Whether or not the operation is stopped is determined in step S5. If the operation is not stopped, the steps S1 to S3 are repeatedly performed, and when the operation is stopped, the entire process is terminated.

With reference to FIGS. 80 and 81, the microcomputer 3320 receives the digital detection voltage Vd from the A/D converter 3310 (S1), and compares the digital detection voltage Vd with the pre-set first reference voltage (S2). If the digital detection voltage Vd from the A/D converter 3310 is lower than the pre-set first reference voltage, the microcomputer 3320 generates a pre-set driving current according to the size of a difference voltage between the first reference voltage and the digital detection voltage Vd, to control the brightness of lighting (S3). If the digital detection voltage Vd from the A/D converter 3310 is not lower than the pre-set first reference voltage, the microcomputer 3320 may stop the lighting driving (S4). Meanwhile, the microcomputer 3320 determines whether or not the operation is stopped, and if the operation is not stopped, the microcomputer 3320 repeatedly performs the steps S1 to S3, and if the operation is stopped, the microcomputer 3320 terminates the entire process (S5).

Figure 82:
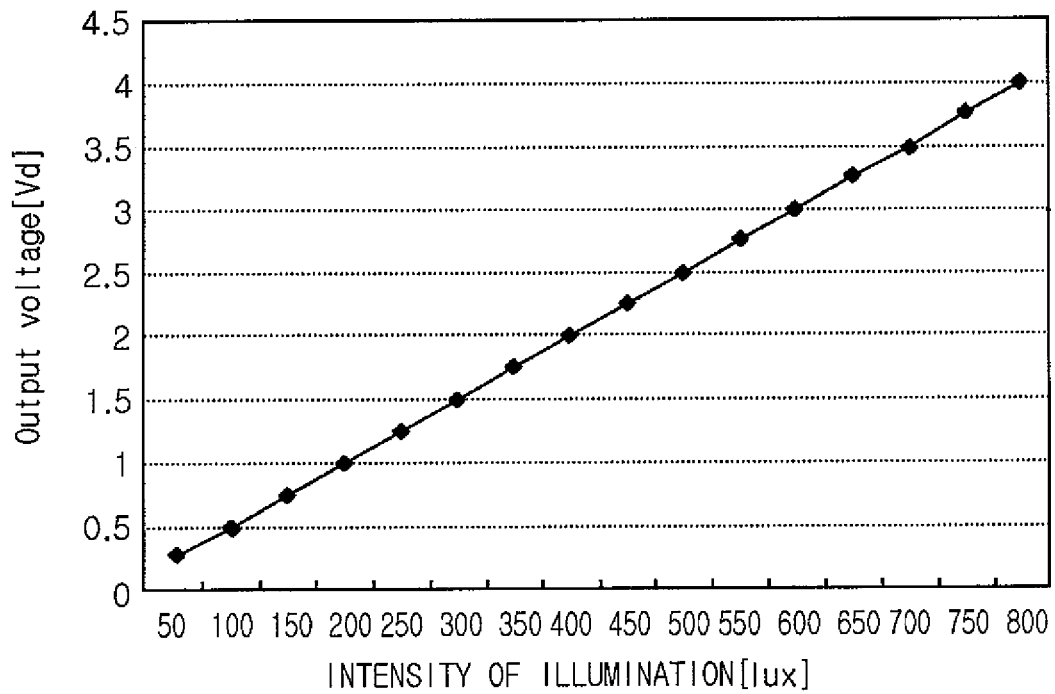
FIG. 82 is a graph showing an external intensity of illumination-detection voltage relationship of the LED automatic lighting apparatus illustrated in FIG. 80.

FIG. 82 is a graph showing an external intensity of illumination-detection voltage relationship according to an exemplary embodiment of the present invention. FIG. 82 is a graph showing the external intensity of an illumination-detection voltage relationship for explaining the operation of the ambient brightness detection unit 3200 according to an exemplary embodiment of the present invention. The external intensity of illumination-detection voltage graph shows that the detection voltage increases as the external intensity of illumination becomes higher. With reference to the external intensity of illumination-detection voltage relationship graph illustrated in FIG. 82, it is noted that the detection voltage is detected to be high by the ambient brightness detection unit 3200 as the external intensity of illumination increases.

Figure 83:
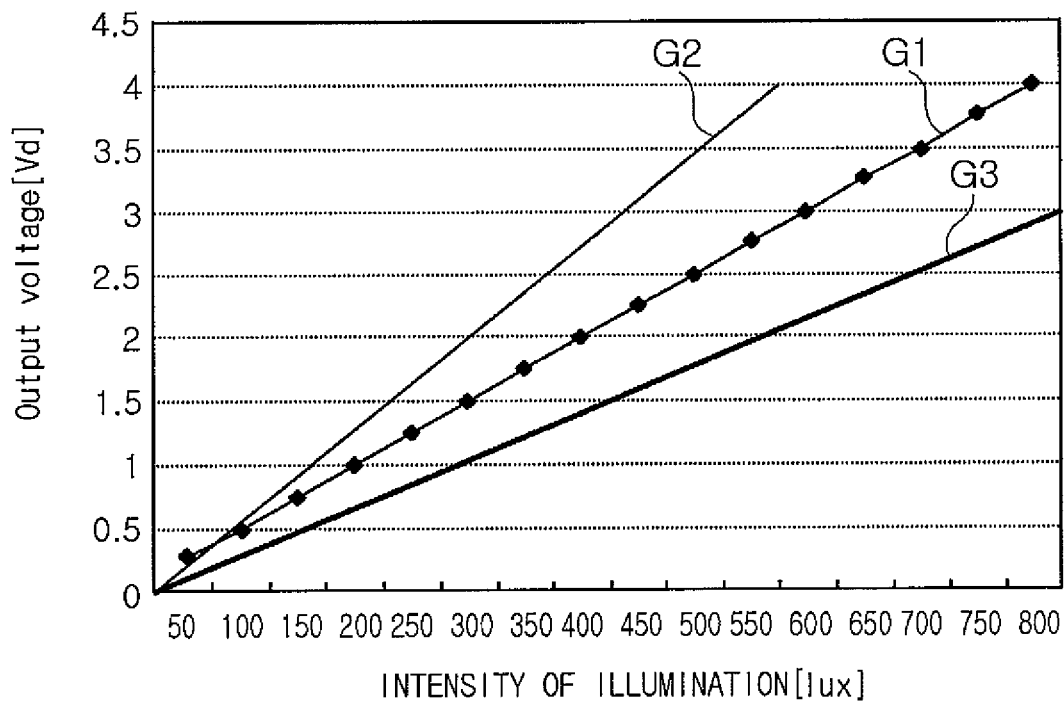
FIG. 83 is a graph showing various external intensity of illumination-detection voltage relationships according to setting of sensitivity in the apparatus for automatically lighting a light emitting device illustrated in FIG. 80.

FIG. 83 is a graph showing various external intensity of illumination-detection voltage relationships according to sensitivity setting. FIG. 83 shows the case where the tilts of the external intensity of illumination-detection voltage relationships vary according to the sensitivity set by the sensitivity setting unit 3210 of the ambient brightness detection unit 3200 according to an exemplary embodiment of the present invention. In FIG. 83, G1 is an external intensity of illumination-detection voltage relationship graph with an intermediate tilt, G2 is an external intensity of illumination-detection voltage relationship graph with the largest tilt, and G3 is an external intensity of illumination-detection voltage relationship graph with the smallest tilt.

With reference to FIG. 83, when the sensitivity setting unit 3210 of the ambient brightness detection unit 3200 sets sensitivities differently by adjusting a variable resistance, the tilts of the external intensity of illumination-detection voltage relationship graphs vary such as G1, G2, and G3. For example, in a general case, the sensitivity corresponding to the graph G1 may be set. When external light quantity is large and changes severely, the sensitivity corresponding to the graph G2 may be set. When the external light quantity is small and changes less, the sensitivity corresponding to the graph G3 may be set.

A headlight for a vehicle including the light emitting device and the light emitting device package having the same as a light source will now be described with reference to FIGS. 84 to 89.

Figure 84:
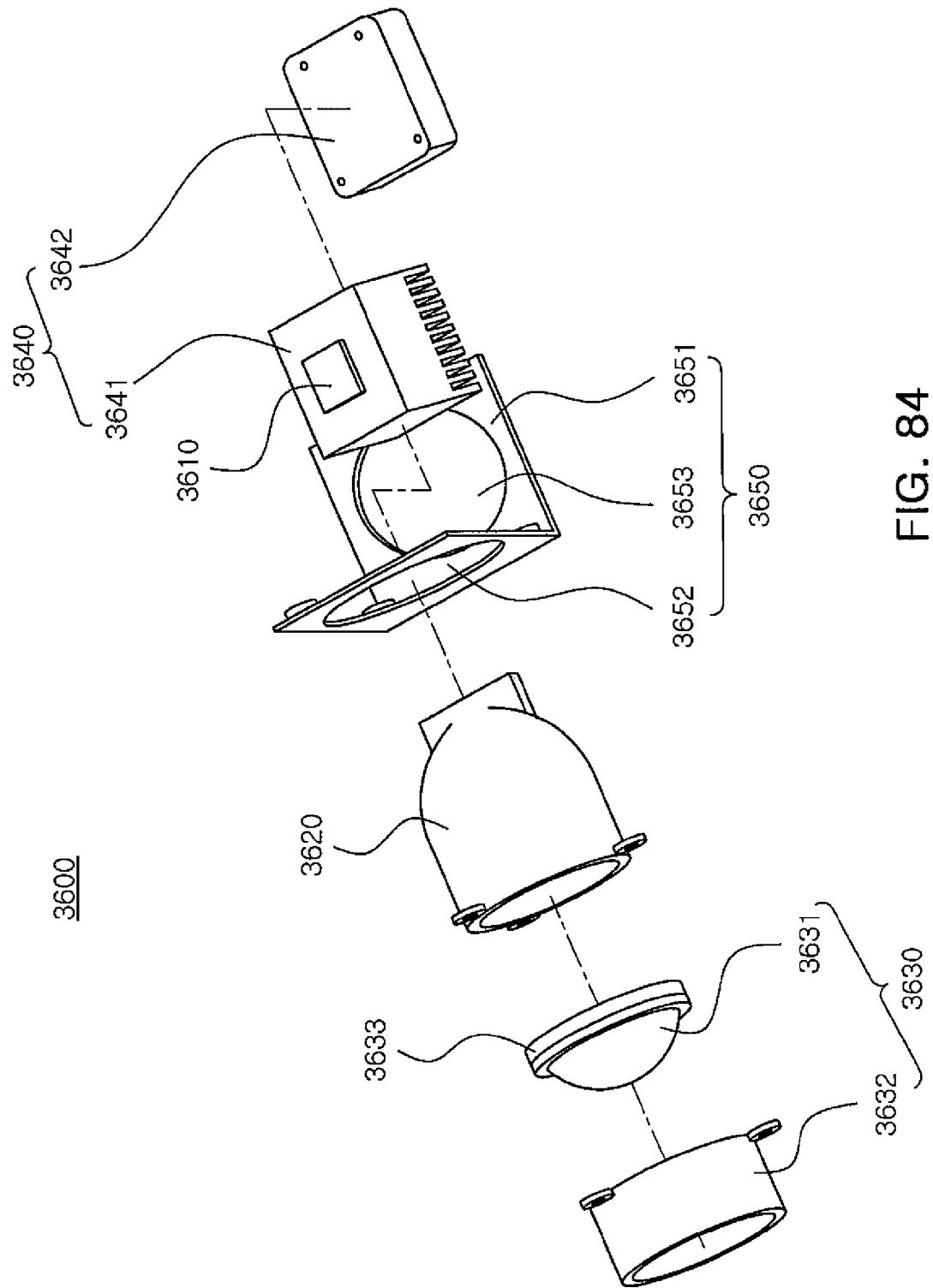
FIG. 84 is an exploded perspective view of a headlight for a vehicle according to an exemplary embodiment of the present invention.
Figure 85:
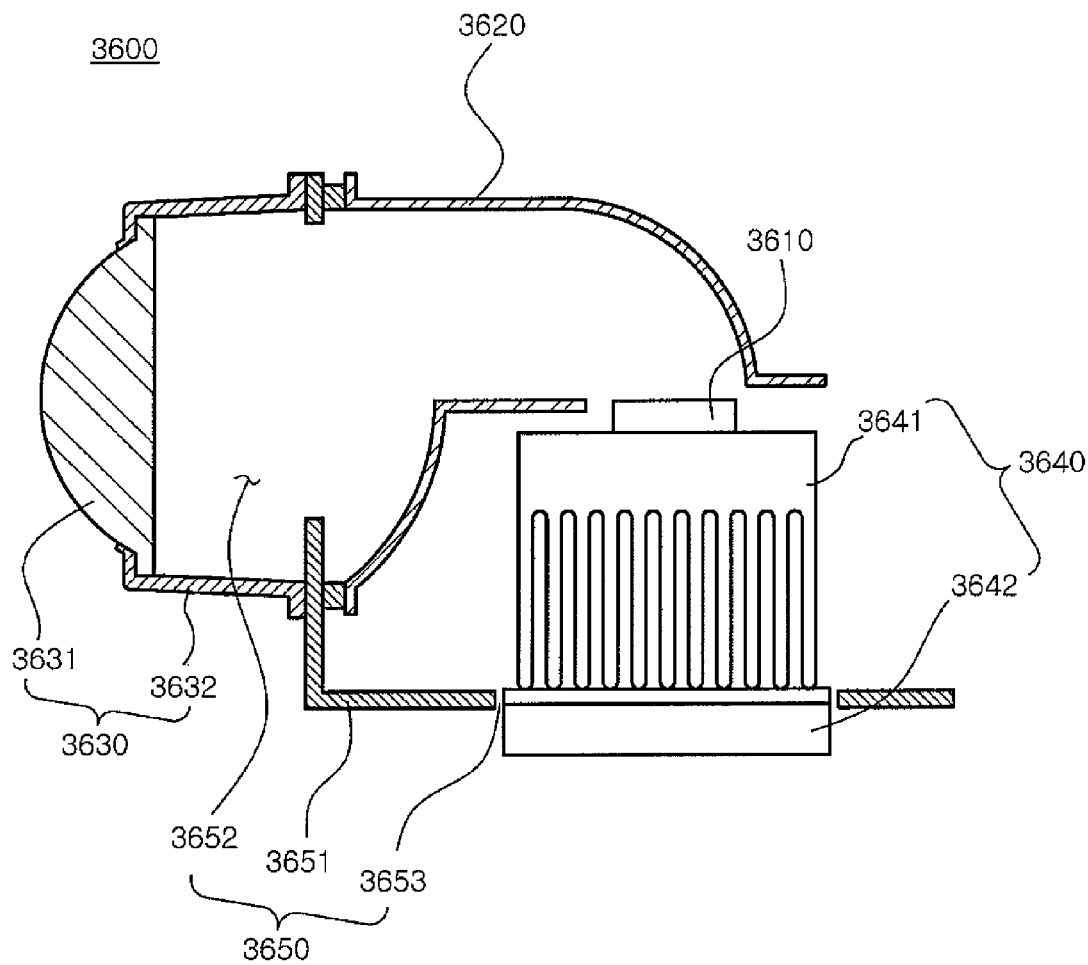
FIG. 85 is a sectional view showing an assembled structure of the headlight for a vehicle illustrated in FIG. 84.

FIG. 84 is an exploded perspective view of a headlight for a vehicle according to an exemplary embodiment of the present invention, and FIG. 85 is a sectional view showing an assembled structure of the headlight for a vehicle illustrated in FIG. 84.

As shown in FIG. 84, a headlight 3600 for a vehicle according to an exemplary embodiment of the present invention includes a light emitting device package 3610 (3610-1, 3610-

2, and 3610-3), a reflection unit 3620, a lens unit 3630, and a heat releasing unit 3640. The light emitting device package 3610 is mounted at an upper portion of the heat releasing unit 3640, and when the light emitting device package 3610 is electrically connected with an external power source (not shown), it serves as a light source for emitting light.

Various structures of the light emitting device package 3610 (3610-1, 3610-2, and 3610-3) will now be described in detail. First, the light emitting device package having a structure in which a resin layer contains a phosphor will be described with reference to FIGS. 86 to 88 as follows.

FIG. 86(a) is a plan view showing a light emitting device package according to one exemplary embodiment of the present invention, FIG. 86(b) is a sectional view of the light emitting device package of FIG. 86(a), and FIGS. 86(c) and 86(d) are plan views showing modifications in a state in which a light emitting device chip is mounted in the light emitting device package of FIG. 86(a).

FIG. 87(a) is a plan view of a light emitting device package according to another exemplary embodiment of the present invention, FIG. 87(b) is a sectional view of the light emitting device package of FIG. 87(a), and FIGS. 87(c) and 87(d) are plan views showing modifications in a state in which a light emitting device chip is mounted in the light emitting device package of FIG. 87(a).

Figure 86:
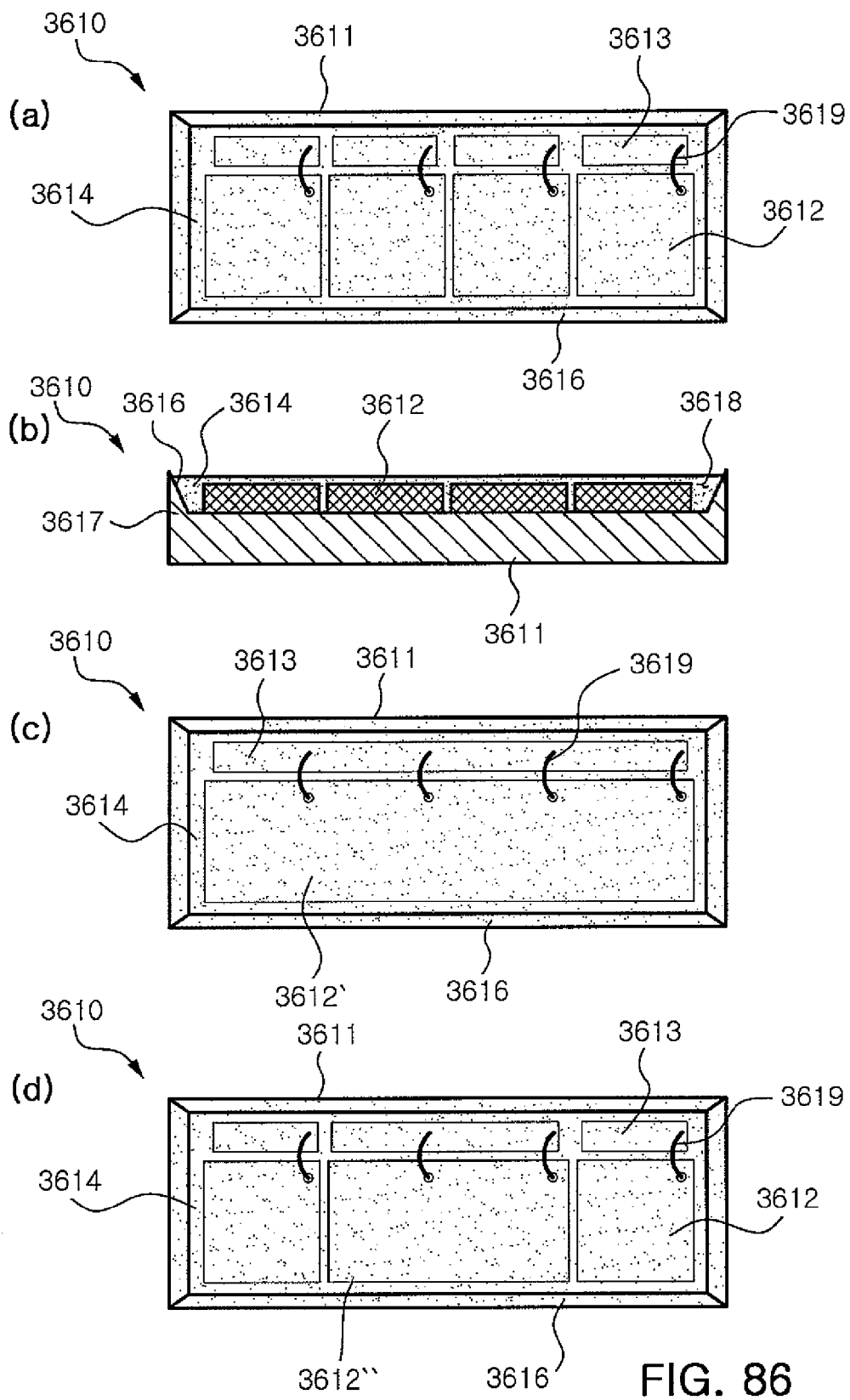
FIG. 86(a) is a plan view showing a light emitting device package according to one exemplary embodiment of the present invention.
FIG. 86(b) is a sectional view of the light emitting device package of FIG. 86(a), and FIGS. 86(c) and 86(d) are plan views showing modifications in a state in which a light emitting device chip is mounted in the light emitting device package of FIG. 86(a).
Figure 87:
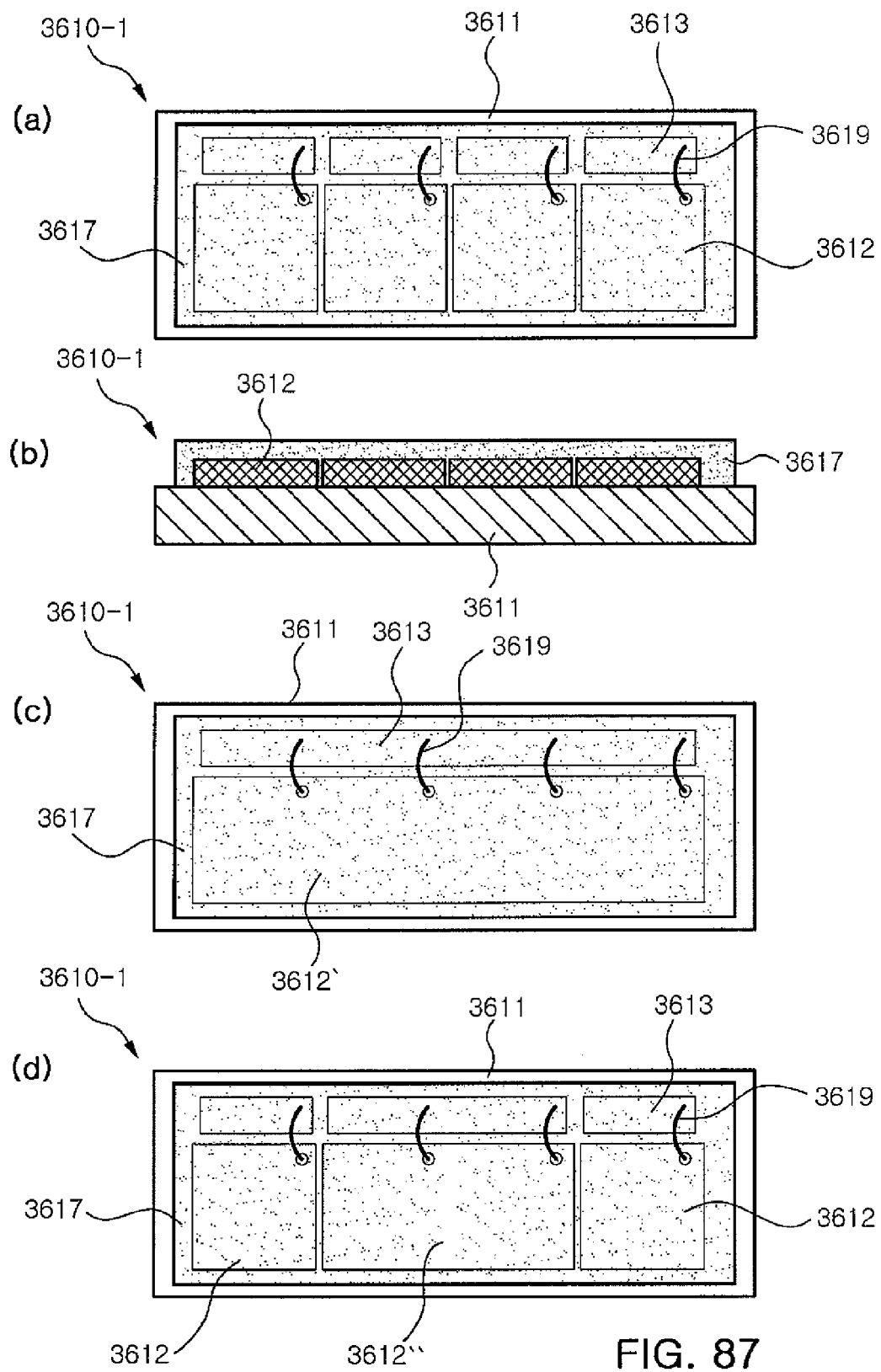

As shown in FIGS. 86 and 87, the light emitting device packages 3610 and 3610-1 include one or more light emitting device chips 3612, a substrate 3611 having the light emitting device chips 3612 mounted thereon and having one or more connection terminals 3613, and a resin layer 3614 containing a phosphor and hermetically covering the light emitting device chips 3612 and the connection terminals 3613. The light emitting device chip 3612 is a sort of semiconductor device mounted on the upper surface of the substrate 3611 and outputting light of a certain wavelength by power applied from an external source. As shown in FIGS. 86(a), 86(b), 87(a), and 87(b), a plurality of light emitting device chips 3612 may be provided at the central portion of the substrate 3611. In this case, preferably, the light emitting device chips 3612 are arrayed as a combination of blue LEDs, red LEDs, and green LEDs to output white light. However, the present invention is not limited thereto and, as shown in FIGS. 86(c) and 87(c), a single light emitting device chip 3612' may be provided at the central portion of the substrate 3611. In this case, preferably, the light emitting device chip 3612' is a blue LED or a UV LED and outputs white light through a phosphor of the resin layer (to be described).

Also, as shown in FIGS. 86(d) and 87(d), shorter light emitting device chips 3612 may be symmetrically provided at both sides of a longer light emitting device chip 3612" provided at the central portion of the substrate 3611 based on the longer light emitting device chip 3612". In this case, the light emitting device chip 3612" provided at the central portion of the substrate 3611 may have a length longer by 1.5 times to 2 times than the light emitting device chips 3612 provided at both sides thereof. Preferably, the light emitting device chip 3612" is a green LED but not limited thereto. The light emitting device chip 3612 is electrically connected with the connection terminal 3613 patterned on the upper surface of the substrate 3611 according to a wire bonding method through a metal wire 3619.

As shown in FIGS. 86(a) and 86(b) illustrating the light emitting device package 3600 according to one exemplary embodiment of the present invention, the substrate 3611 includes a cavity 3618 in which the light emitting device chip 3612 and the connection terminal 3613 are mounted. The cavity 3618 forms a reflection face 3616 along an inner circumferential surface downwardly sloped toward the light emitting device chip 3612 and the connection terminal 3613. The cavity 3618 may be formed by depressing the upper surface of the substrate 3611 to have a certain size through a laser removal process or etching, or by protrusively forming the reflection face 3616 by molding a resin 3617 with a certain height along the edges of the upper surface of the substrate 3611. Preferably, a reflection film having a high reflectivity may be provided on the surface of the reflection face 3616 in order to effectively implement the reflection face 3616.

The cavity 3618 is filled with the resin layer 3614 containing a phosphor to integrally hermetically seal the upper surfaces of the substrates 3611 along with the light emitting device chips 3612, the metal wires 3619, and the connection terminals 3613, thereby protecting the light emitting device chips 3612 disposed within the cavity 3618. In this case, in the light emitting device package 3600, the upper surfaces and side surfaces of the light emitting device chips 3612 as well as the space between the light emitting device chips 3612 are hermetically sealed by the resin layer 3614.

Accordingly, the problem of the related art light emitting device package in which the phosphor is coated only on the upper surfaces of the continuously disposed light emitting device chips, making irradiated light seen to be discontinuously separated rather than continuous can be solved.

Meanwhile, as shown in FIGS. 87(a) and 87(b) illustrating a light emitting device package 3600-1 according to another exemplary embodiment of the present invention, the resin layer 3614 is molded with a certain size and height on the flat upper surface of the substrate 3611 to integrally hermetically seal the light emitting device chips 3612 and the connection terminals 3613. Also, in this case, in the light emitting device package 3600-1, the upper surface and the size surface of the light emitting device chips 3612 as well as the space between the light emitting device chips 3612 are hermetically sealed by the resin layer 3614.

Figure 88:
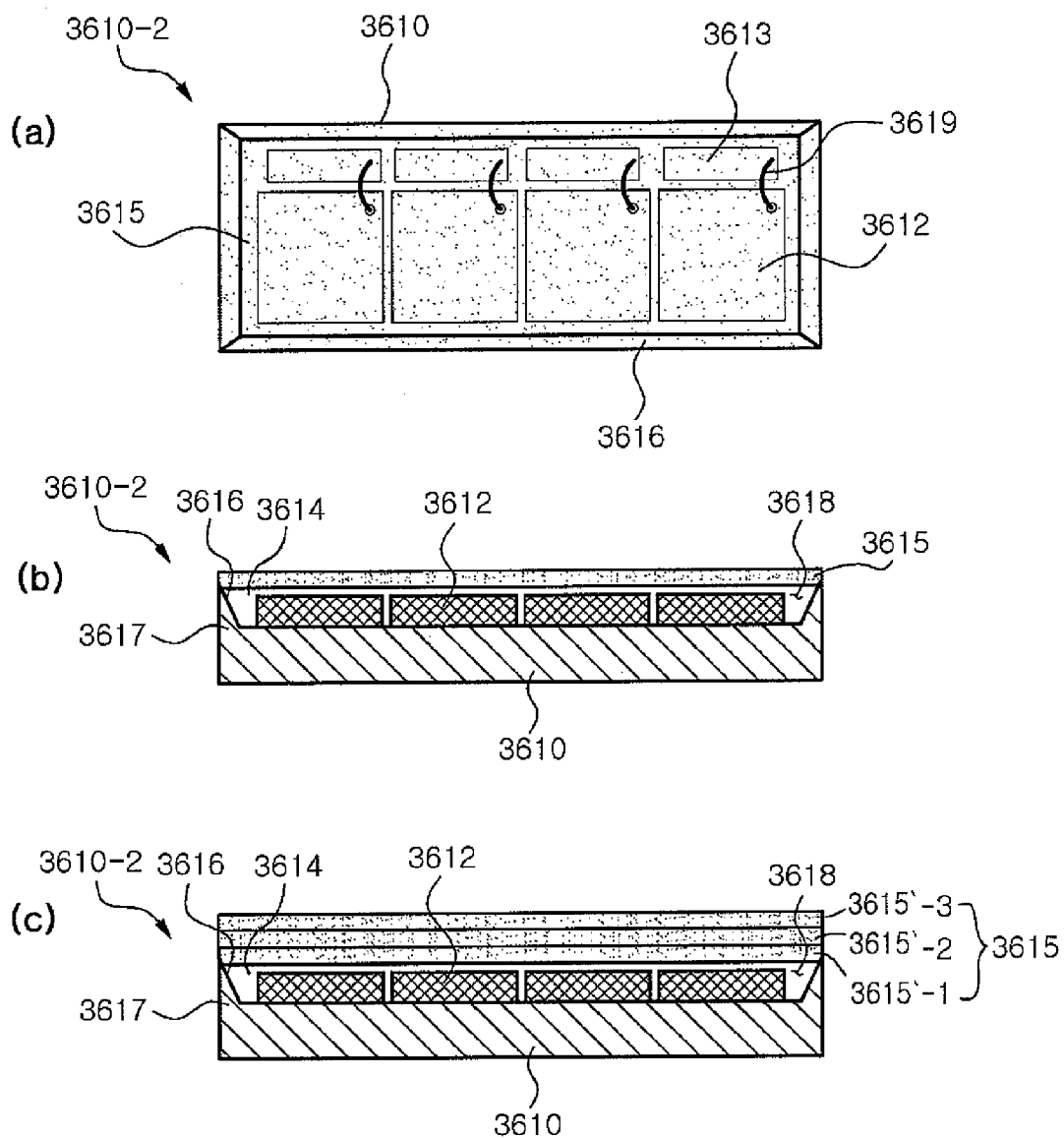

A light emitting device package having a structure in which a phosphor is included in an upper portion of the resin layer in order to convert the wavelength of light emitted from the light emitting device chip will now be described with reference to FIGS. 88 and 89. FIG. 88(a) is a plan view of another example of the light emitting device package illustrated in FIG. 86(a), FIG. 88(b) is a sectional view of the light emitting device package of FIG. 88(a), and FIG. 88(c) is a sectional view showing a modification of FIG. 88(b).

A light emitting device package 3600-2 illustrated in FIG. 88 has substantially the same configuration as that of FIG. 86, except that the phosphor layer containing a phosphor is provided on the upper portion of the resin layer. Thus, a description of the same portions as those of the embodiment of FIG. 86 will be omitted and only the different configuration in the embodiment of FIG. 88 will be described.

As shown in FIG. 88, the resin layer 3614 filling the cavity 3618 and integrally and hermetically sealing the upper surface of the substrate 3611 together with the light emitting device chips 3612, the metal wires 3619, and the connection terminals 3613 does not contain a phosphor, but the resin layer 3614 the same function as the phosphor, in that it integrally hermetically seals the upper surfaces, the side surfaces of the light emitting device chips 3612 along with the connection terminals 3612 and the spaces between the light emitting device chips 3612 like the embodiment of FIG. 86. The phosphor layer 3615 containing a phosphor is formed on the resin layer 3614 and converts the wavelength of light emitted from the light emitting device chip 3612. The phosphor layer 3614 provided on the resin layer 3614 may be coated on an outer surface of the resin layer 3614 or may be attached in a layer form on the outer surface of the resin layer 3614. In this case, the phosphor layer 3615 preferably includes one or more stacked layers.

As shown In FIG. 88(*b*), a phosphor is dispersedly contained in the phosphor layer 3615 in order to convert the wavelength of light. The phosphor may contain one or more of blue, green, red, and yellow phosphors in a mixed manner. Also, as shown in FIG. 88(*c*), when the phosphor layers are stacked as a multi-layer structure (FIG. 88(*c*) illustrates that three layers are stacked, but the present invention is not limited thereto), the stacked phosphor layers 3615 may contain all the same phosphors or different phosphors in each layer. Preferably, the phosphor layers 3615 are sequentially stacked according to the length of wavelengths such that a phosphor layer of a shorter wavelength is positioned at the upper side while a phosphor layer of a longer wavelength is positioned at the lower side.

For example, when the light emitting device chip 3612 is a UV light emitting device chip, a first phosphor layer 3615'-1 formed on the light emitting device chip 3612 may be formed by mixing a phosphor emitting red light (R) and a resin. As the phosphor emitting red light (R), a phosphor (or fluorescent material) emitting light having an emission peak ranging from 600 nm to 700 nm upon being excited by ultraviolet rays may be used. A second phosphor layer 3615'-2 is stacked on the first phosphor layer 3615'-1 and may be formed by mixing a phosphor emitting green light (G) and a resin. As the phosphor emitting green light (G), a phosphor (or fluorescent material) emitting light having a wavelength ranging from 500 nm to 550 nm upon being excited by ultraviolet rays may be used. A third phosphor layer 3615'-3 is stacked on the second phosphor layer 3615'-2 and may be formed by mixing a phosphor emitting blue light (B) and a resin. As the phosphor emitting blue light (B), a phosphor (or fluorescent material) emitting light having a wavelength ranging from 420 nm to 480 nm upon being excited by ultraviolet rays may be used.

Ultraviolet rays emitted from the UV LED chip through the above-described configuration excite the different types of phosphors contained in the first phosphor layer 3615'-1, the second phosphor layer 3615'-2, and the third phosphor layer 3615'-3. Accordingly, the red light (R), the green light (G), and the blue light (B) are emitted from the phosphor layers, respectively, and the light beams of the three colors are combined to form white light (W). In particular, the phosphor layers for converting ultraviolet rays are formed as multiple layers, namely, three layers, and in this case, the first phosphor layer 3615'-1 emitting light of the longest wavelength, namely, red light (R), is the first layer stacked on the UV LED chip 3612, and the second and third phosphor layers 3615'-2 and 3615'-3 each emitting light of shorter wavelength, namely, green light (G) and blue light (B), are sequentially formed on top of the first phosphor layer 3615'-1.

In this manner, because the first phosphor layer 3615'-1 containing the phosphor emitting red light (R) having the lowest light conversion efficiency is positioned to be closest to the UV LED chip 3612, the light conversion efficiency at the first phosphor layer can become relatively high, and accordingly, the overall light conversion efficiency of the LED chip 3612 can be improved.

If the LED chip 3612 is an LED chip emitting blue light (B) having a wavelength ranging from 420 nm to 480 nm as excitation light, the first phosphor layer 3615'-1 formed on the LED chip 3612 is formed by mixing a phosphor emitting red light (R) and a resin, and the second and third phosphor layers 3615'-2 and 3615'-3 stacked on the first phosphor layer 3615'-1 are formed by mixing a phosphor emitting green light (G) or yellow light (Y) in a resin.

Through such configuration, the blue light (B) emitted from the LED chip 3612 excites the phosphor contained in the first phosphor layer 3615'-1 to emit red light (R), and excites the phosphors contained in the second and third phosphor layers 3615'-2 and 3615'-3 to emit green light (G) or yellow light (Y). In this manner, the red light (R) and green light (G) (or yellow light (Y)) emitted from the multi-layer phosphor layers are combined with blue light (B) generated from the LED chip 3612 to form white light (W).

Figure 89:
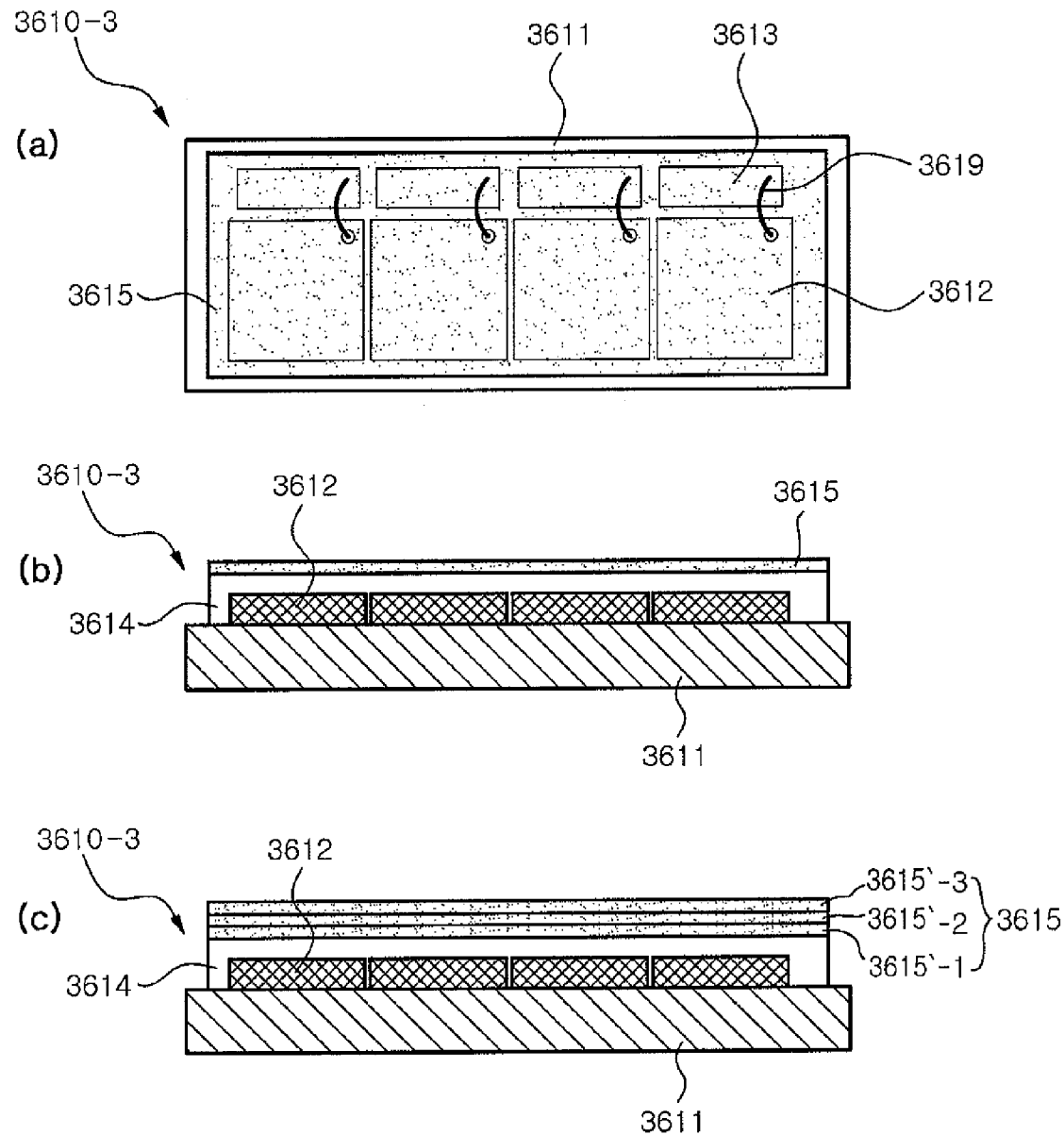
FIG. 89(a) is a plan view showing another example of the light emitting device package illustrated in FIG. 87(a)
FIG. 89(b) is a sectional view of the light emitting device package illustrated in FIG. 89(a)
FIG. 89(c) is a sectional view showing a modification of the FIG. 89(b).

FIG. 89(*a*) is a plan view showing another example of the light emitting device package illustrated in FIG. 87(*a*), FIG. 89(*b*) is a sectional view of the light emitting device package illustrated in FIG. 89(*a*), and FIG. 89(*c*) is a sectional view showing a modification of the FIG. 89(*b*).

A light emitting device package 3600-3 illustrated in FIG. 89 has substantially the same configuration as that of the embodiment illustrated in FIG. 87, except that the phosphor layer containing a phosphor is provided on an outer surface of the resin layer. Thus, a description of the same portions as those of the embodiment of FIG. 87 will be omitted and only the different configuration of the embodiment of FIG. 89 will be described.

As shown in FIG. 89, the resin layer 3614 provided on the flat upper surface of the substrate 3611 to integrally hermetically seal the upper surface of the substrate 3611 together with the light emitting device chips 3612, the metal wires 3619, and the connection terminals 3613 does not contain a phosphor. The embodiment illustrated in FIG. 89 is the same as that of FIG. 75 in that the phosphor layer 3615 provided at an upper portion of the resin layer 3614 contains a phosphor.

Namely, as shown in FIG. 89(*b*), a phosphor contained in the phosphor layer 3615 may contain one or more of blue, green, red, and yellow phosphors in a mixed manner. Also, as shown in FIG. 89(*c*), when the phosphor layers are stacked as a multi-layer structure (FIG. 89(*c*) illustrates that three layers are stacked but the present invention is not limited thereto), the stacked phosphor layers 3615 may contain all the same phosphors or different phosphors for each layer.

The phosphor layers 3615 may be sequentially stacked according to the length of wavelengths such that a phosphor layer of a shorter wavelength is positioned at the upper side while a phosphor layer of a longer wavelength is positioned at the lower side. A detailed structure of the phosphor layer 3615 is the same as the phosphor layer 3615 of FIGS. 88(*b*) and 88(*c*), so a detailed description thereof will be omitted.

The heat releasing unit 3640 includes a heat sink 3641 and a cooling fan 3642 and is formed at the upper portion of the light emitting device packages 3610, 3610-1, 3610-2, and 3610-3 to release heat generated from the light emitting device packages 3610, 3610-1, 3610-2, and 3610-3.

In detail, the heat sink 3641 has the light emitting device package 3610 (3610-1, 3610-2, and 3610-3) mounted thereon, and releases high-temperature heat generated from the light emitting device package 3610 (3610-1, 3610-2, and 3610-3). The heat sink 3641 may include a plurality of recesses formed on its lower surface in order to have a larger surface area. The cooling fan 3642 may be mounted at a lower side of the heat sink 3641 to increase a heat releasing efficiency of the heat sink 3641.

The reflection unit 3620 is provided at an upper side of the light emitting device package 3610 (3610-1, 3610-2, and 3610-3) and the heat releasing unit 3640 to induce and reflect light output from the light emitting device package 3610 (3610-1, 3610-2, and 3610-3). As shown in FIGS. 84 and 85, the reflection unit 3620 has a dome-like shape in its section to guide light emitted from the light emitting device chip 3612 toward a front side of a vehicle and has an open front side to allow the reflected light to be output to the exterior.

The headlight 3600 for a vehicle according to an exemplary embodiment of the present invention further includes a housing 3650 for fixedly supporting the heat releasing unit 3640 and the reflection unit 3620. In detail, the housing 3650 includes a central hole 3653 formed on one surface thereof to allow the heat releasing unit 3640 to be combined and mounted therein and a front hole 3652 formed on the other surface integrally connected with the one surface and bent at a right angle to allow the reflection unit 3620 to be fixedly positioned at the upper side of the light emitting device package 3610 (3610-1, 3610-2, and 3610-3).

Accordingly, because the reflection unit 3620 is fixed to the housing 3650 such that the open front side of the reflection unit 3620 corresponds to the front hole 3652, light reflected from the reflection unit 3620 passes through the front hole 3652 so as to be output externally.

The lens unit 3630, including a hollow guide 3632 and a lens 3631, externally dissipates light output after being reflected from the reflection unit 3620. In detail, the guide 3632 is mounted along the front hole 3652 of the housing 3650 and guides light passing through the front hole 3652 after being reflected from the reflection unit 3620 to the front side. The guide 3632 has a hollow cylindrical structure to accommodate the lens 3631 therein and is a plastic injection-molded product formed through injection molding.

The lens 3631 is mounted in front of the guide 3632 to refract and disperse light toward the front side of the vehicle. Preferably, the lens unit 3632 is made of a transparent material.

The lighting apparatus such as the backlight unit, the headlight for a vehicle, or the like, according to various exemplary forms of the present invention employ the light emitting device package according to the first to thirteenth exemplary embodiments of the present invention, and each light emitting device package includes a wavelength conversion unit or a resin packing unit including at least a red phosphor including an inorganic compound represented by the empirical formula $(Sr, M)_2SiO_{4-x}N_y$:Eu synthesized according to the present invention, where M is at least one of a monovalent and divalent element, $0<x<4$, and $y=2x/3$, and absorbing light emitted from the LED chip to emit light having an peak emission wavelength ranging from about 600 nm to about 700 nm.

As set forth above, according to exemplary embodiments of the present invention, because the red phosphor contains the inorganic compound represented by the empirical formula $(Sr, M)_2SiO_{4-x}N_y$, it can emit red light of long wavelength having a high light emission characteristics and good thermal and chemical stability. Also, because the light emitting device package employs such a red phosphor, the light emitting device package can obtain a high output and high reliability and emit light of a white color close to that of natural light by using the red and ultraviolet wavelength bands as excitation sources.

While the present invention has been shown and described in connection with the exemplary embodiments of the present invention, it will be apparent to those skilled in the art that modifications and variations can be made without departing from the spirit and scope of the invention as defined by the appended claims.

What is claimed is:

1. A light emitting device package comprising:
   a light emitting device emitting excitation light; and
   a wavelength conversion unit absorbing the excitation light to emit visible light,
   where the wavelength conversion unit comprises at least a phosphor having an inorganic compound represented by an empirical formula $(Sr, M)_2SiO_{4-x}N_y$:Eu, where M is at least one element selected from Be, Mg, Ca, Ba, Li, Na, K, Rb, and Cs, $0<x<4$, and $y=2x/3$.

2. The light emitting device package of claim 1, where the phosphor emits a light having an emission peak between about 600 nm and about 700 nm upon being excited by the excitation light.

3. The light emitting device package of claim 1, where the light emitting device is an ultraviolet LED, the light emitting device package further comprises a blue phosphor and a green phosphor, and the final output light of the light emitting device package is white light.

4. The light emitting device package of claim 3, where the wavelength conversion unit comprises:
   a first phosphor layer formed on the light emitting device and containing the phosphor with the inorganic compound to emit red light;
   a second phosphor layer stacked on the first phosphor layer and emitting green light; and
   a third phosphor layer stacked on the second phosphor layer and emitting blue light.

5. The light emitting device package of claim 3, where the wavelength conversion unit comprises:
   a first phosphor layer formed on the light emitting device and containing the phosphor with the inorganic compound to emit red light; and
   a second phosphor layer stacked on the first phosphor layer and emitting both green light and blue light.

6. The light emitting device package of claim 1, where the light emitting device is a blue LED, the light emitting device package further comprises a green phosphor and a yellow phosphor, and the final output light of the light emitting device package is white light.

7. The light emitting device package of claim 6, where the wavelength conversion unit comprises:
   a first phosphor layer formed on the light emitting device and containing the phosphor with the inorganic compound to emit red light; and
   a second phosphor layer stacked on the first phosphor layer and emitting green light.

8. The light emitting device package of claim 6, where the wavelength conversion unit comprises:
   a first phosphor layer formed on the light emitting device and containing the phosphor with the inorganic compound to emit red light; and
   a second phosphor layer stacked on the first phosphor layer and emitting yellow light.

9. The light emitting device package of claim 1, where the wavelength conversion unit is formed to uniformly cover an outer surface of the light emitting device with a resin material containing the phosphor with the inorganic compound.

10. The light emitting device package of claim 9, where the wavelength conversion unit is formed only on an upper surface of the light emitting device.

11. The light emitting device package of claim 9, where the wavelength conversion unit is formed on an upper surface and on a side surface of the light emitting device.

12. The light emitting device package of claim 1, where the wavelength conversion unit further comprises a resin packing unit encapsulating the light emitting device, and the red packing unit has the phosphor with the inorganic compound distributed therein.

13. The light emitting device package of claim 12, where the wavelength conversion unit further comprises two or more types of phosphors among blue, green, and yellow phosphors, and the final output light of the light emitting device package is white light.

14. A lighting apparatus comprising:
a substrate;
a plurality of light sources mounted on the substrate; and
a diffusion sheet disposed above the plurality of light sources and uniformly diffusing light made incident from the light sources,
where each of the light sources comprises:
a light emitting device emitting excitation light; and
a wavelength conversion unit absorbing the excitation light to emit visible light, where the wavelength conversion unit comprises at least a phosphor having an inorganic compound represented by an empirical formula $(Sr, M)_2SiO_{4-x}N_y$:Eu, where M is at least one element selected from Be, Mg, Ca, Ba, Li, Na, K, Rb, and Cs, $0<x<4$, and $y=2x/3$.

15. The lighting apparatus of claim 14, further comprising:
a reflection layer disposed on an upper surface of the substrate and upwardly reflecting light emitted from the light emitting device.

16. The lighting apparatus of claim 14, where the wavelength conversion unit further comprises two or more types of phosphors among blue, green, and yellow phosphors, and the final output light of the light source is white light.

17. A display apparatus comprising
a substrate;
a plurality of light sources mounted on the substrate; and
where each of the light sources comprises:
a light emitting device emitting excitation light; and
a wavelength conversion unit absorbing the excitation light to emit visible light, where the wavelength conversion unit comprises at least a phosphor having an inorganic compound represented by an empirical formula $(Sr, M)_2SiO_{4-x}N_y$:Eu, where M is at least one element selected from Be, Mg, Ca, Ba, Li, Na, K, Rb, and Cs, $0<x<4$, and $y=2x/3$.

18. The display apparatus of claim 17, where the wavelength conversion unit further comprises two or more types of phosphors among blue, green, and yellow phosphors, and final output light of the light emitting device package is white light.

* * * * *